United States Patent
Lee et al.

(10) Patent No.: US 8,378,766 B2
(45) Date of Patent: Feb. 19, 2013

(54) MEMS RELAY AND METHOD OF FORMING THE MEMS RELAY

(75) Inventors: Dok Won Lee, Mountain View, CA (US); Peter Johnson, Sunnyvale, CA (US); Aditi Dutt Chaudhuri, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 27 days.

(21) Appl. No.: 13/020,052

(22) Filed: Feb. 3, 2011

(65) Prior Publication Data

US 2012/0200377 A1    Aug. 9, 2012

(51) Int. Cl.
*H01H 51/22* (2006.01)

(52) U.S. Cl. .......................................................... 335/78
(58) Field of Classification Search ..................... 335/78
See application file for complete search history.

(56) References Cited

U.S. PATENT DOCUMENTS

| | | | |
|---|---|---|---|
| 6,094,116 A * | 7/2000 | Tai et al. ............................ | 335/78 |
| 6,492,887 B1 * | 12/2002 | Diem et al. ....................... | 335/78 |
| 6,859,122 B2 * | 2/2005 | Divoux et al. .................... | 335/78 |
| 7,042,319 B2 * | 5/2006 | Ishiwata et al. .................. | 335/78 |
| 7,064,637 B2 * | 6/2006 | Tactic-Lucic et al. .......... | 335/78 |
| 7,902,946 B2 | 3/2011 | Niblock | |
| 2002/0050881 A1 * | 5/2002 | Hyman et al. .................... | 335/78 |
| 2002/0196112 A1 * | 12/2002 | Ruan et al. ........................ | 335/78 |
| 2003/0179056 A1 * | 9/2003 | Wheeler et al. .................. | 335/78 |
| 2003/0179057 A1 * | 9/2003 | Shen et al. ........................ | 335/78 |
| 2003/0222740 A1 * | 12/2003 | Ruan et al. ........................ | 335/78 |
| 2004/0207498 A1 * | 10/2004 | Hyman et al. .................... | 335/78 |
| 2007/0018761 A1 * | 1/2007 | Yamanaka et al. ............... | 335/78 |
| 2007/0018762 A1 * | 1/2007 | Wheeler et al. .................. | 335/78 |

OTHER PUBLICATIONS

Cho, H.J. et al., "Electroplated thick permanent magnet arrays with controlled direction of magnetization for MEMS application", Journal of Applied Physics, vol. 87, No. 9, 2000, pp. 6340-6342.

* cited by examiner

*Primary Examiner* — Alexander Talpalatski
(74) *Attorney, Agent, or Firm* — Eugene C. Conser; Wade J. Brady, III; Frederick J. Telecky, Jr.

(57) ABSTRACT

A micro-electromechanical systems (MEMS) relay includes a switch with a first contact region and a second contact region that are vertically separated from each other by a gap. The MEMS relay requires a small vertical movement to close the gap and therefore is mechanically robust. In addition, the MEMS relay has a small footprint and, therefore, can be formed on top of small integrated circuits.

5 Claims, 68 Drawing Sheets

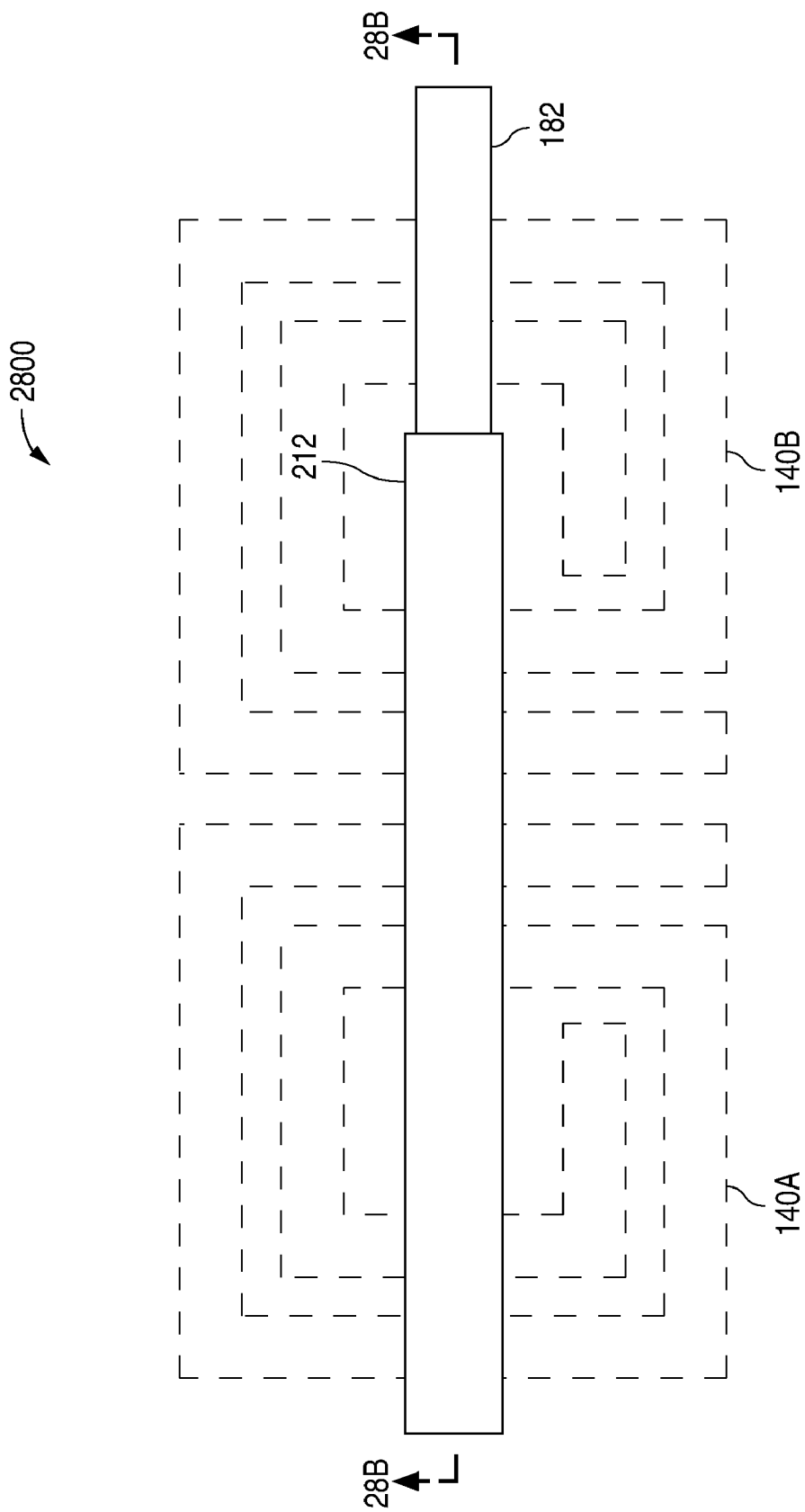

US 8,378,766 B2

MEMS RELAY AND METHOD OF FORMING THE MEMS RELAY

BACKGROUND OF THE INVENTION

1. Field of the Invention

The present invention relates to MEMS devices and, more particularly, to a MEMS relay and a method of forming the MEMS relay.

2. Description of the Related Art

A switch is a well-known device that connects, disconnects, or changes connections between devices. An electrical switch is a switch that provides a low-impedance electrical pathway when the switch is "closed," and a high-impedance electrical pathway when the switch is "opened." A mechanical-electrical switch is a type of switch where the low-impedance electrical pathway is formed by physically bringing two electrical contacts together, and the high-impedance electrical pathway is formed by physically separating the two electrical contacts from each other.

An actuator is a well-known mechanical device that moves or controls a mechanical member to move or control another device. Actuators are commonly used with mechanical-electrical switches to move or control a mechanical member that closes and opens the switch, thereby providing the low-impedance and high-impedance electrical pathways, respectively, in response to the actuator.

A relay is a combination of a switch and an actuator where the mechanical member in the actuator moves in response to electromagnetic changes in the conditions of an electrical circuit. For example, electromagnetic changes due to the presence or absence of a current in a coil can cause the mechanical member in the actuator to close and open the switch.

One approach to implementing actuators and relays is to use micro-electromechanical systems (MEMS) technology. MEMS devices are formed using the same fabrication processes that are used to form conventional semiconductor structures, such as the interconnect structures that provide electrical connectivity to the transistors on a die.

BRIEF DESCRIPTION OF THE DRAWINGS

FIGS. 1A-22A are plan views. FIGS. 1B-22B are cross-sectional views taken along lines 1B-1B through 22B-22B in FIGS. 1A-22A. FIGS. 1C-22C are cross-sectional views taken along lines 1C-1C through 22C-22C in FIGS. 1A-22A. FIGS. 1D-22D are cross-sectional views taken along lines 1D-1D through 22D-22D in FIGS. 1A-22A.

FIG. 27A is a plan view, while FIG. 27B is a cross-sectional view taken along line 27B-27B of FIG. 27A.

FIGS. 28A-28B are views illustrating an example of a MEMS relay 2800 in accordance with an alternate embodiment of the present invention. FIG. 28A is a plan view, while FIG. 28B is a cross-sectional view taken along line 28B-28B of FIG. 28A.

FIG. 29A is a plan view, while FIG. 29B is a cross-sectional view taken along line 29B-29B of FIG. 29A.

FIG. 32A is a plan view. FIG. 32B is a cross-sectional view taken along line 32B-32B of FIG. 32A. FIG. 32C is a cross-sectional view taken along line 32B-32B of FIG. 32A illustrating MEMS relay 3200 in the closed position in accordance with the present invention.

FIG. 34A is a plan view. FIG. 34B is a cross-sectional view taken along line 34B-34B of FIG. 34A. FIG. 34C is a cross-sectional view taken along line 34B-34B of FIG. 34A illustrating MEMS relay 3400 in the closed position in accordance with the present invention.

FIG. 36A is a plan view, while FIG. 36B is a cross-sectional view taken along line 36B-36B of FIG. 36A.

FIG. 37A is a plan view, while FIG. 37B is a cross-sectional view taken along line 37B-37B of FIG. 37A.

FIG. 38A is a plan view. FIG. 38B is a cross-sectional view taken along line 38B-38B of FIG. 38A. FIG. 38C is a cross-sectional view taken along line 38C-38C of FIG. 38A. FIG. 38D is a cross-sectional view taken along line 38D-38D of FIG. 38A.

FIGS. 39A-42A are plan views. FIGS. 39B-42B are cross-sectional views taken along lines 39B-39B through 42B-42B in FIGS. 39A-42A. FIGS. 39C-42C are cross-sectional views taken along lines 39C-39C through 42C-42C in FIGS. 39A-42A, and FIGS. 39D-42D are cross-sectional views taken along lines 39D-39D through 42D-42D in FIGS. 39A-42A.

DETAILED DESCRIPTION OF THE INVENTION

Figure 1A:
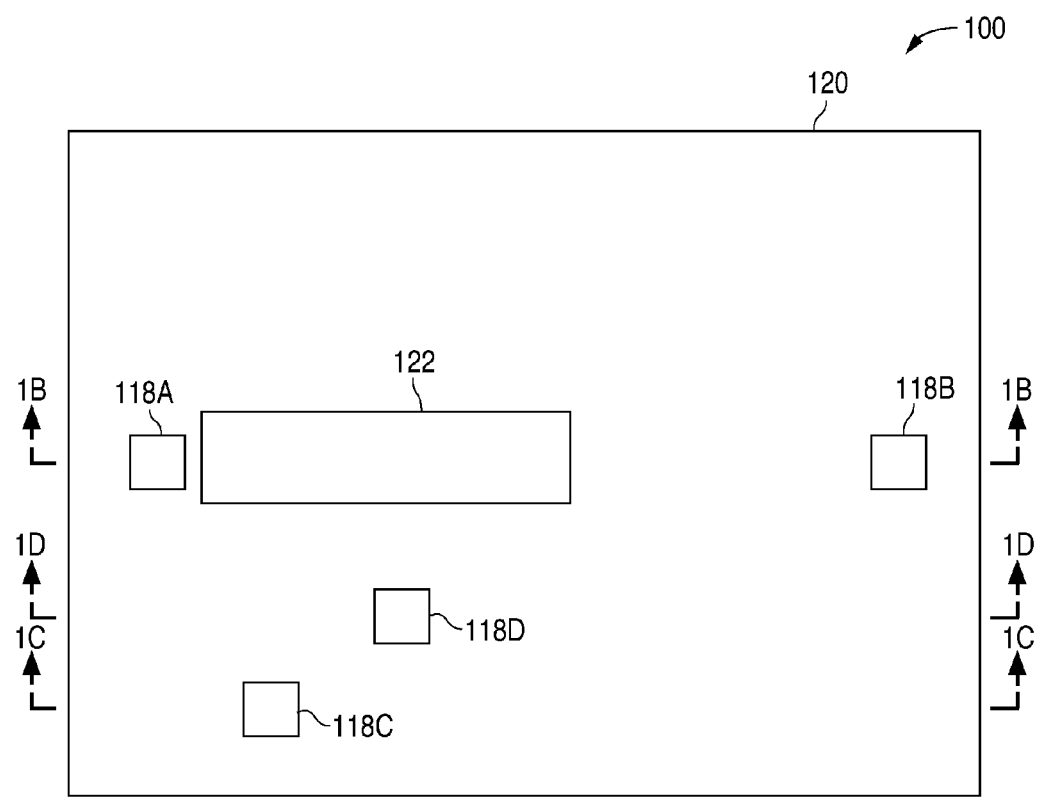
FIGS. 1A-1D through FIGS. 22A-22D are views illustrating an example of a method of forming a MEMS relay in accordance with the present invention.
Figure 1B:
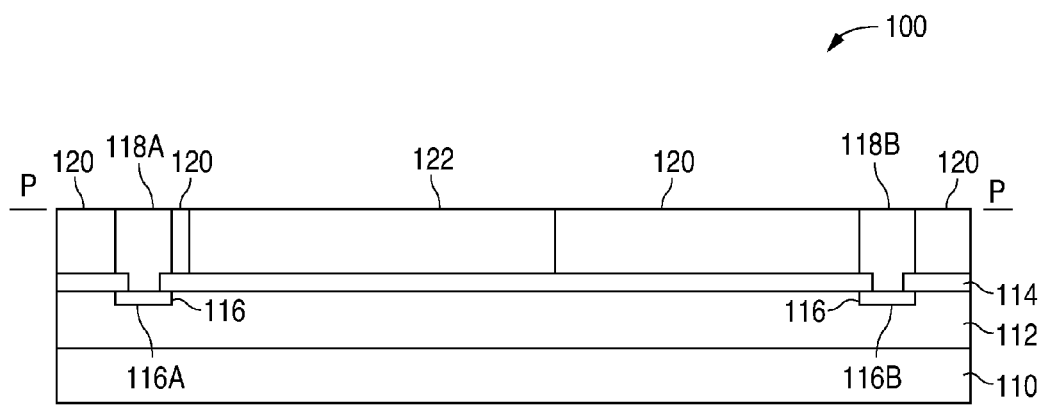
Figure 1C:
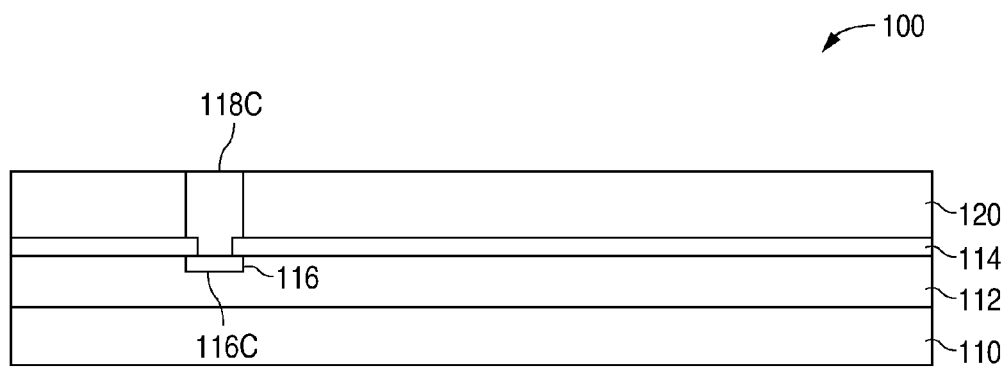
Figure 1D:
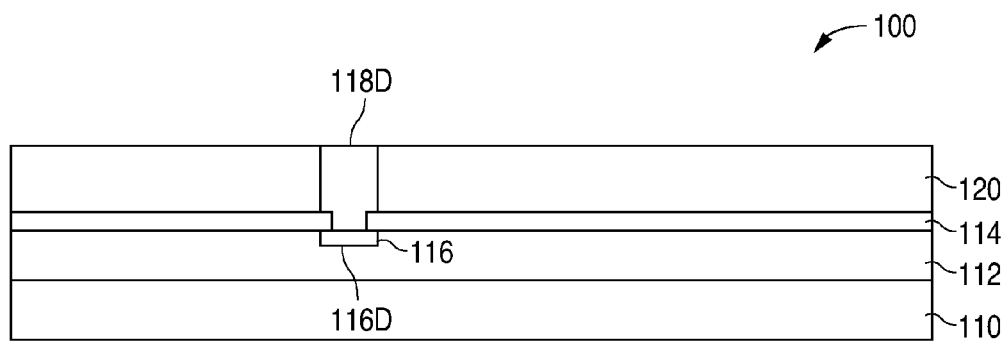
Figure 2A:
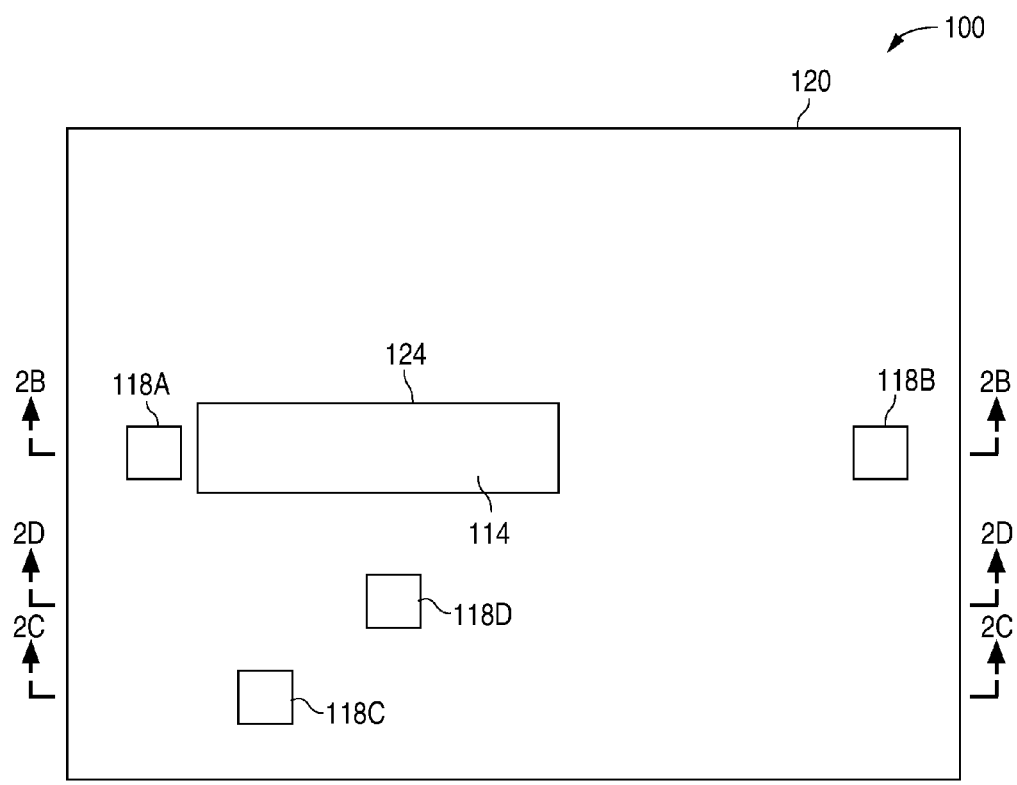
Figure 2B:
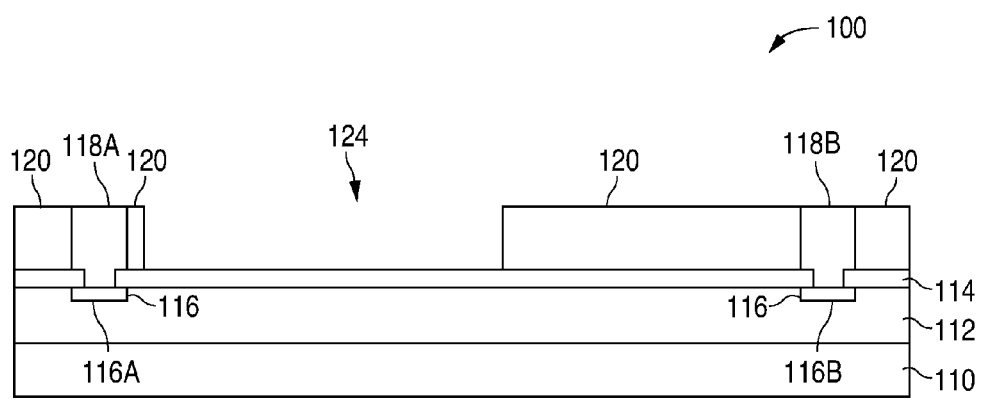
Figure 2C:
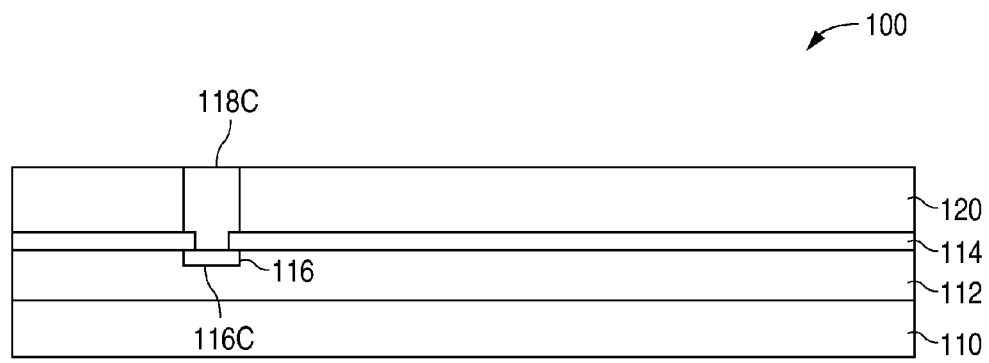
Figure 2D:
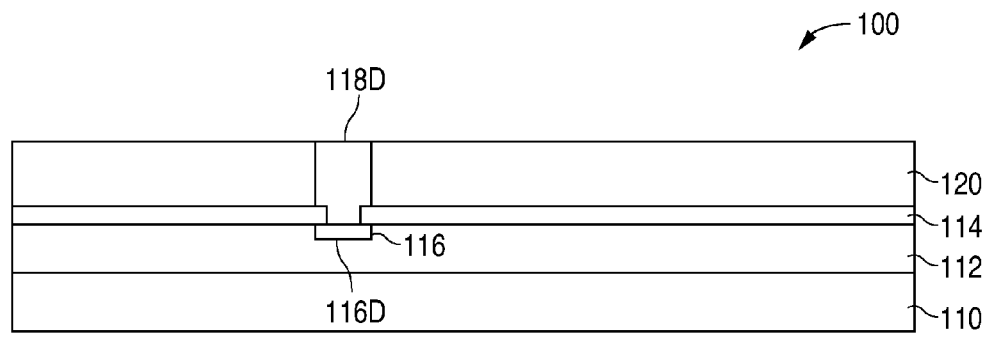
Figure 3A:
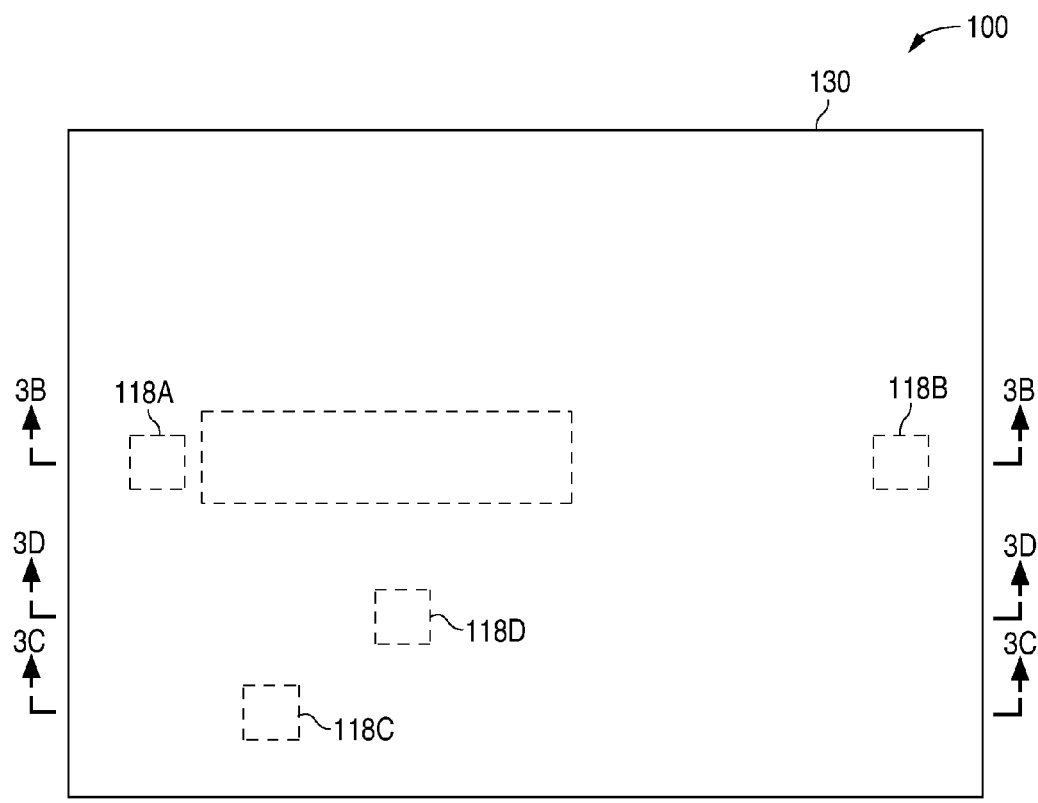
Figure 3B:
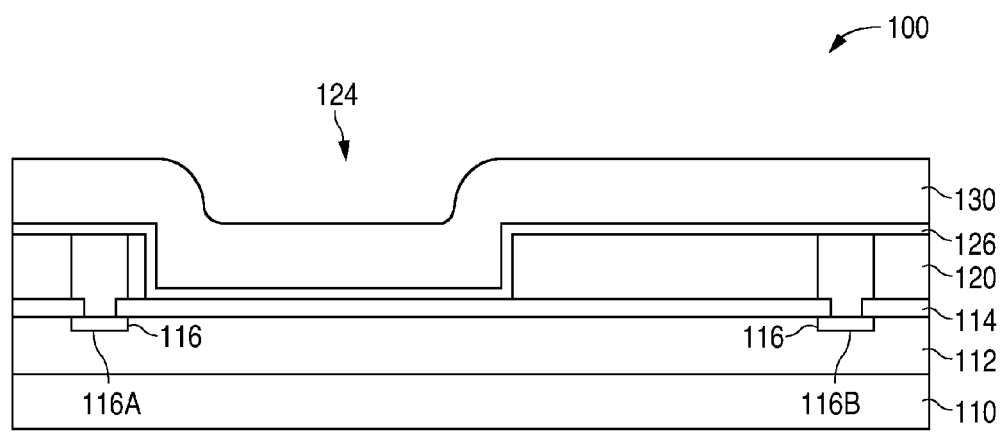
Figure 3C:
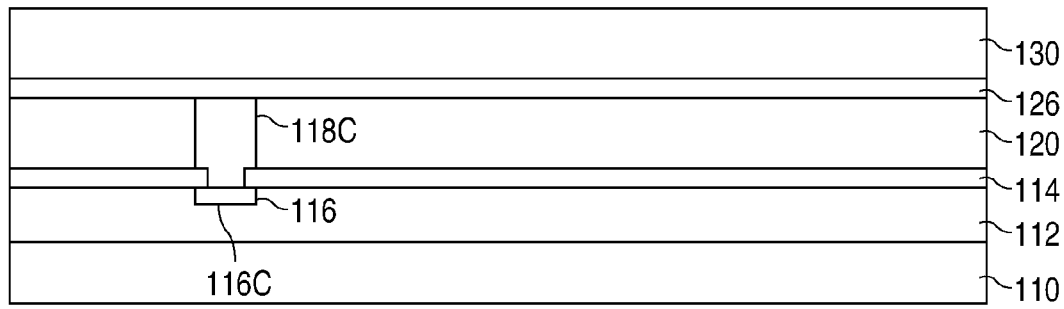
Figure 3D:
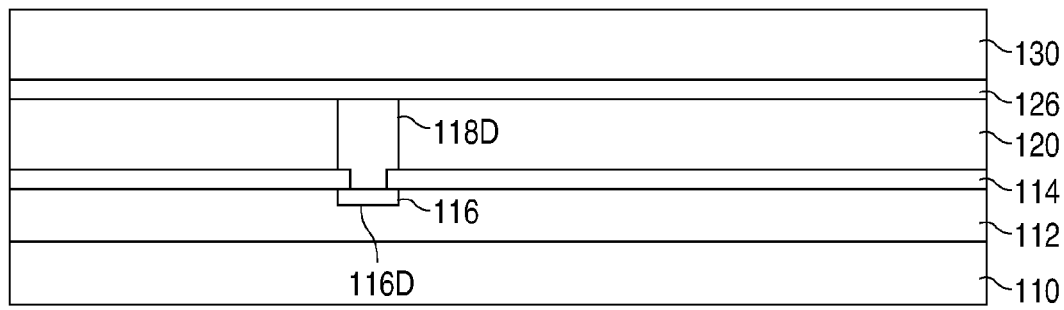
Figure 4A:
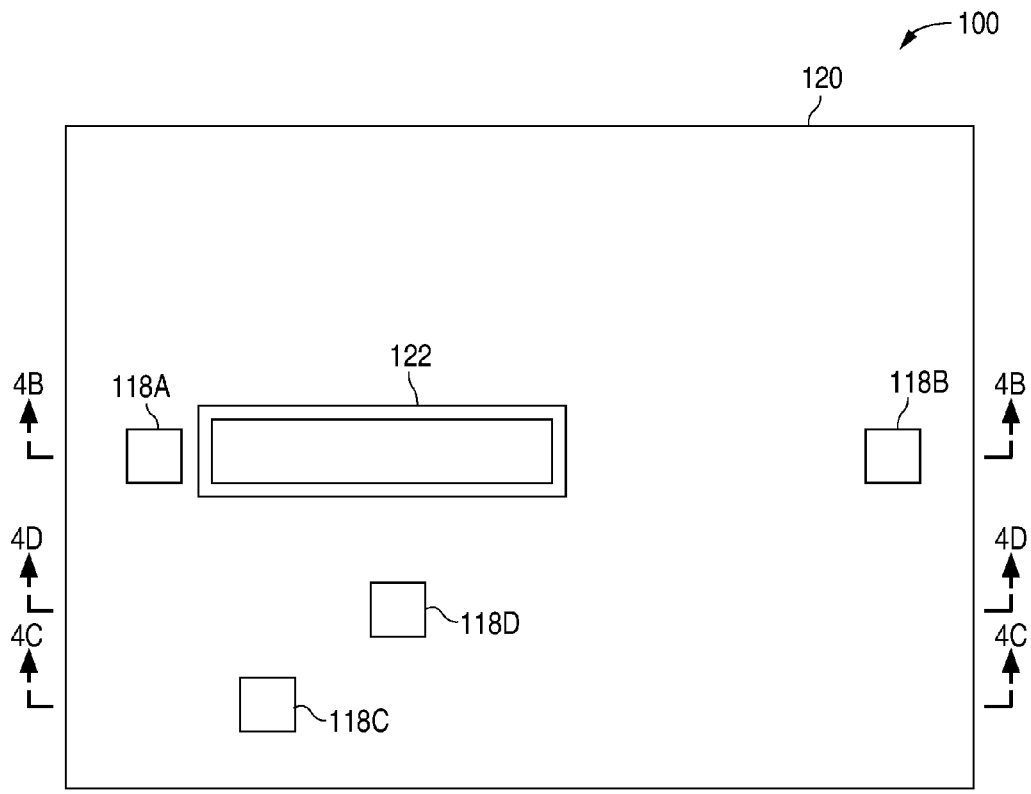
Figure 4B:
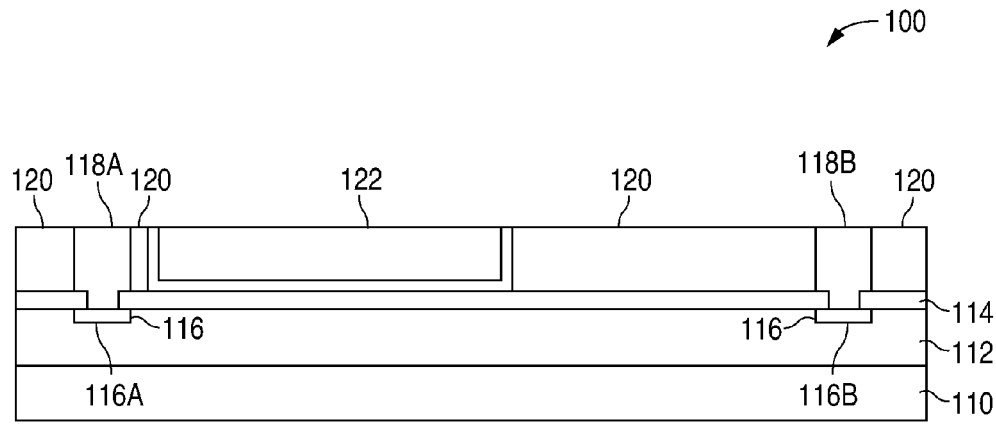
Figure 4C:
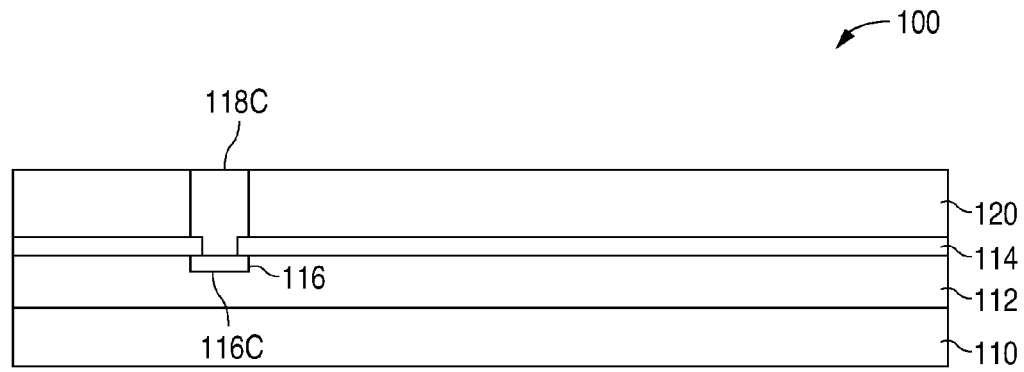
Figure 4D:
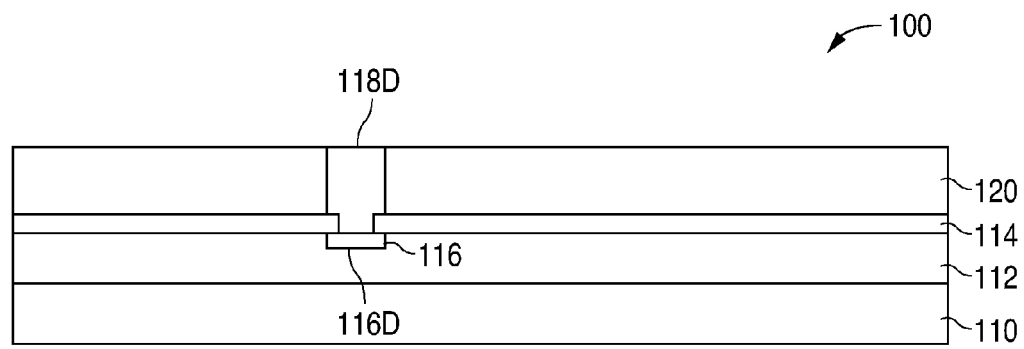
Figure 5A:
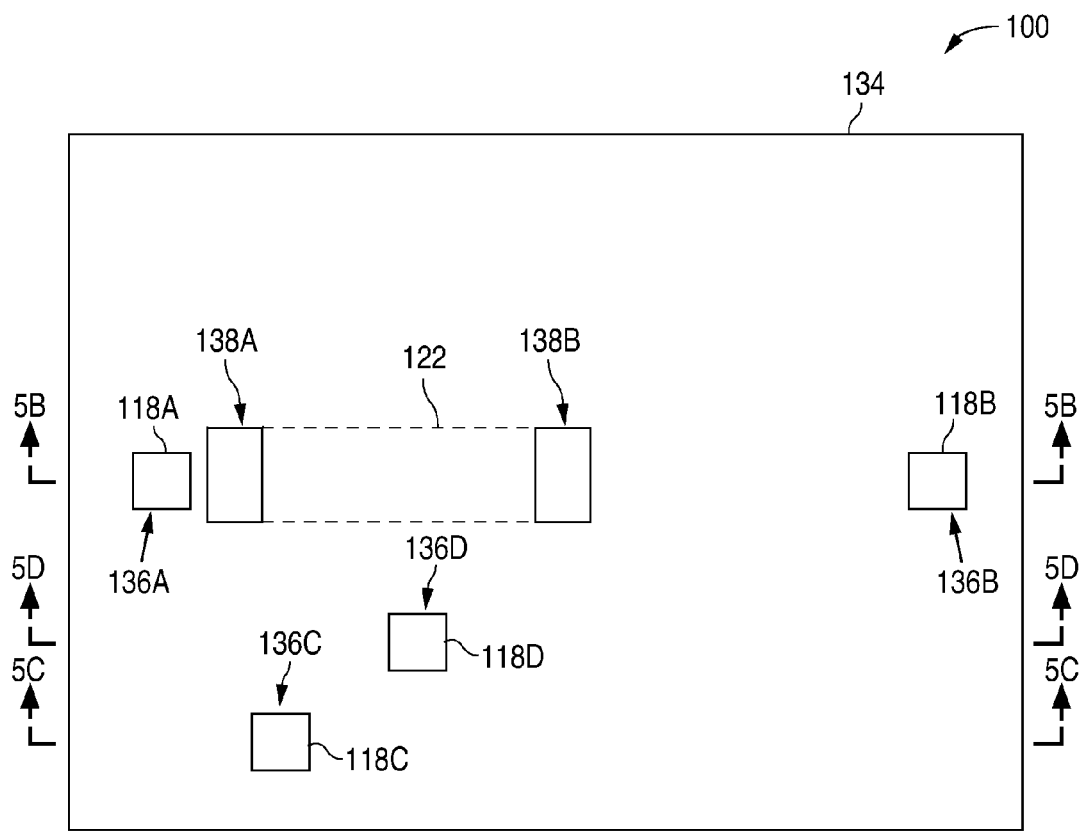
Figure 5B:
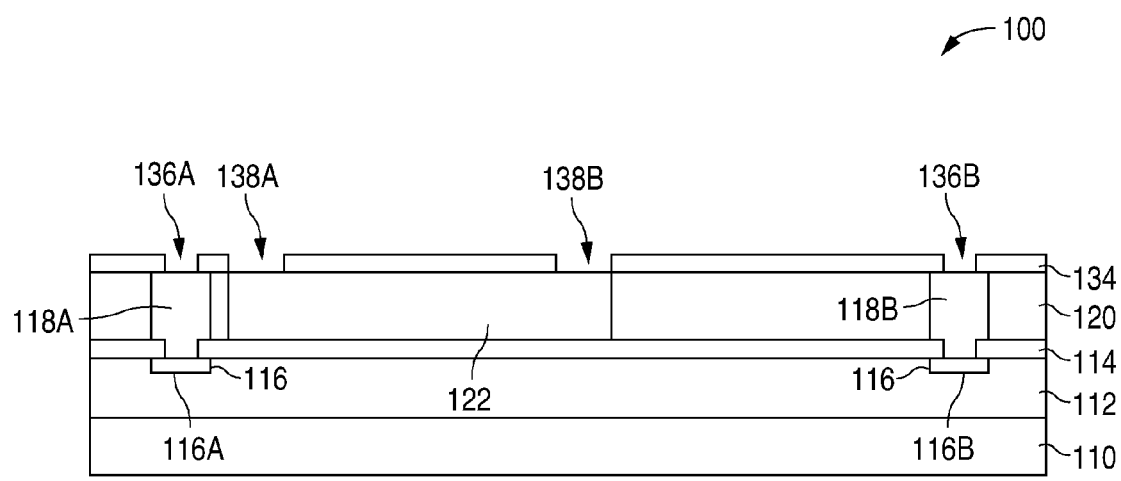
Figure 5C:
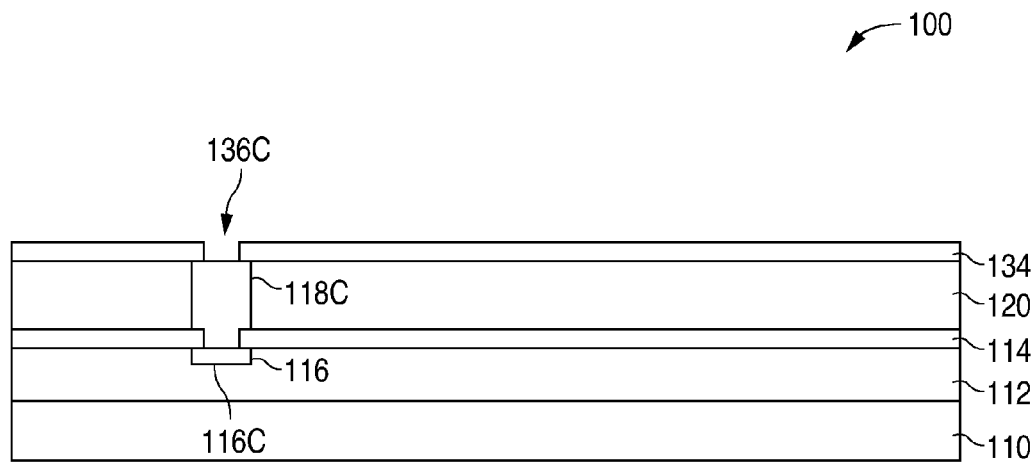
Figure 5D:
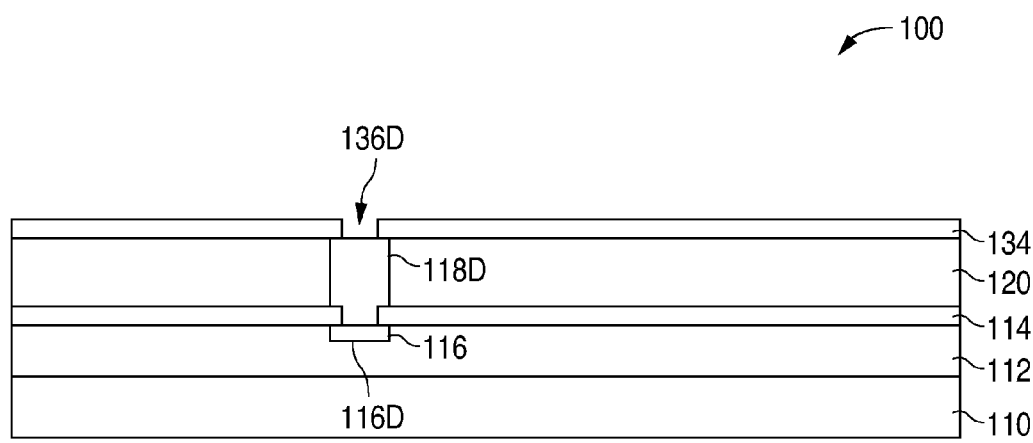
Figure 6A:
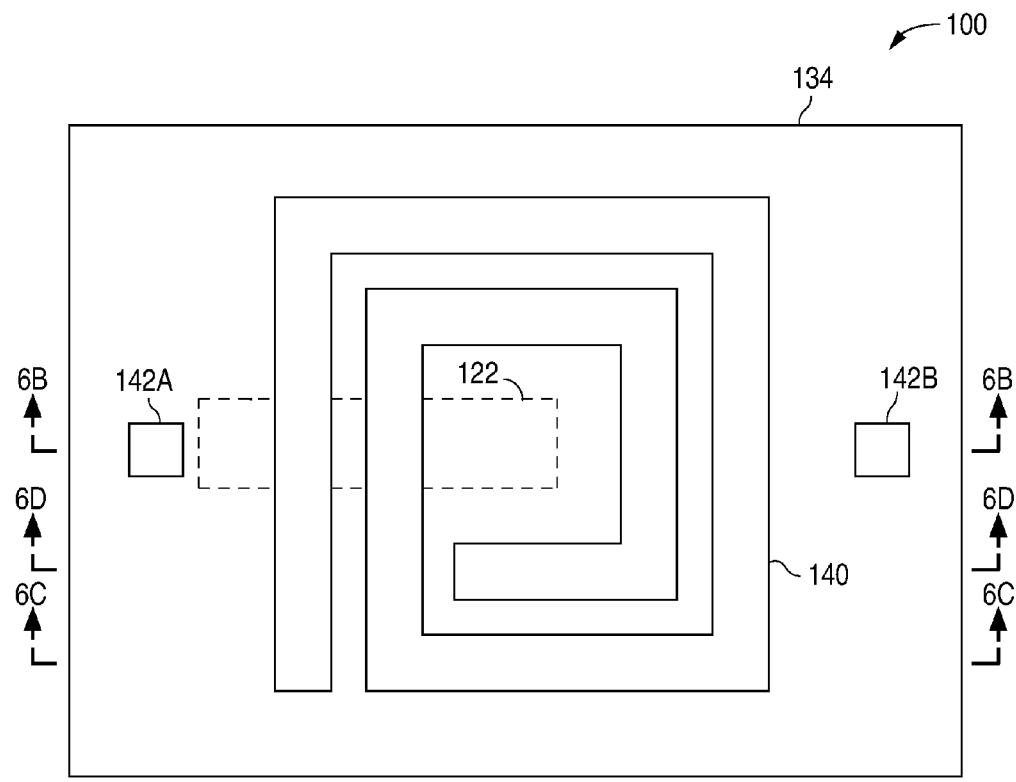
Figure 6B:
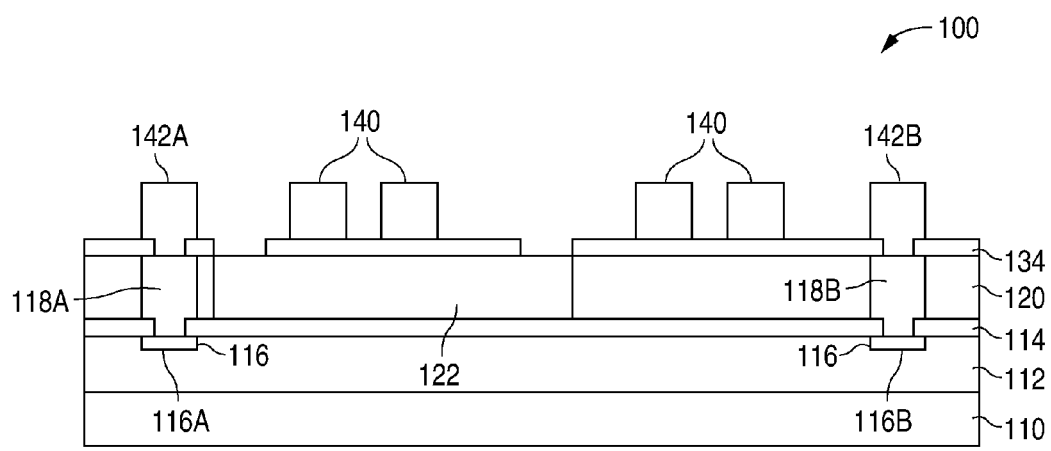
Figure 6C:
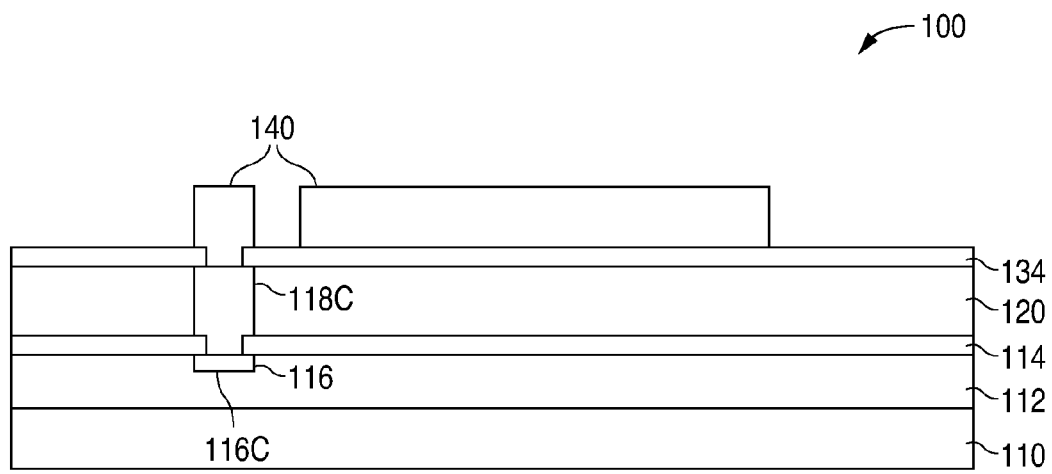
Figure 6D:
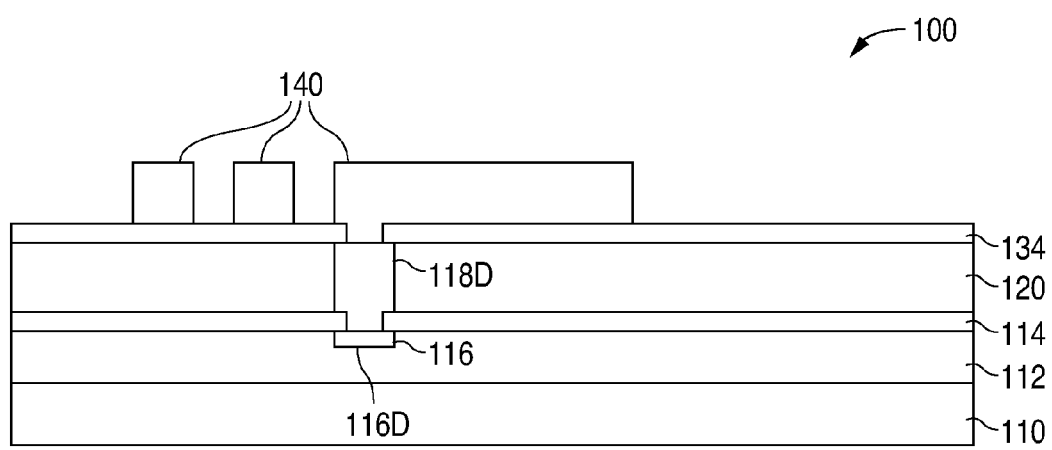
Figure 7A:
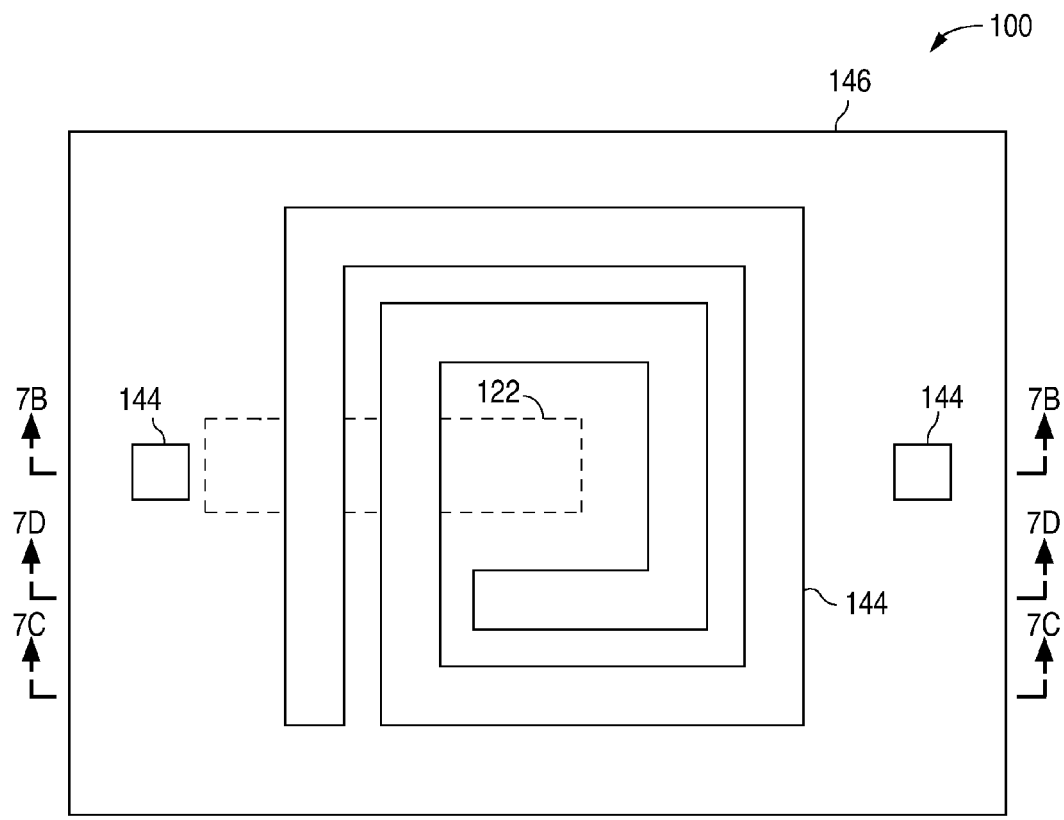
Figure 7B:
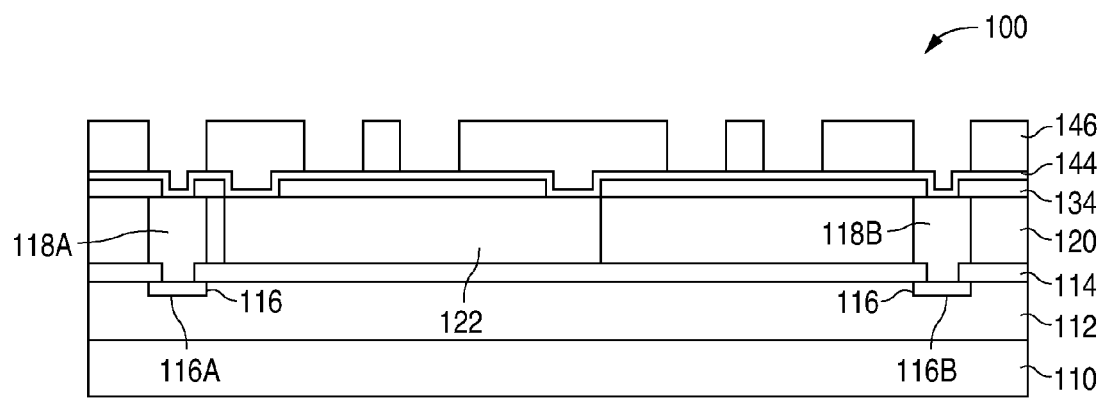
Figure 7C:
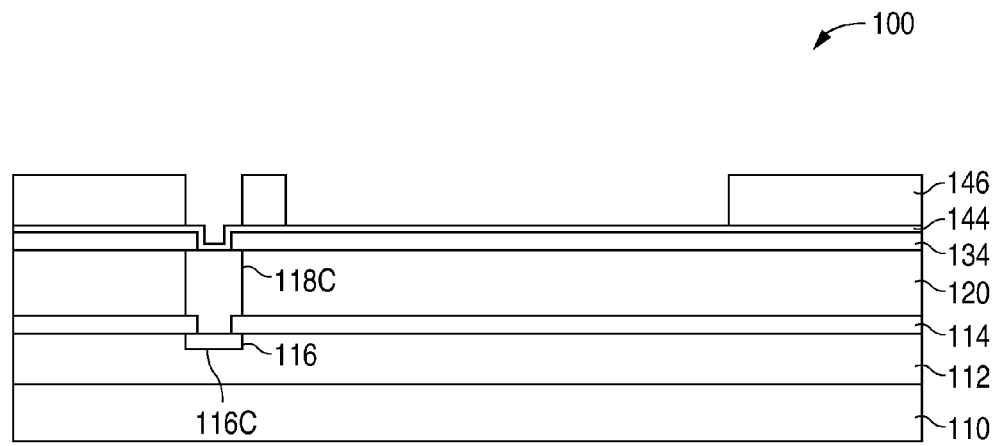
Figure 7D:
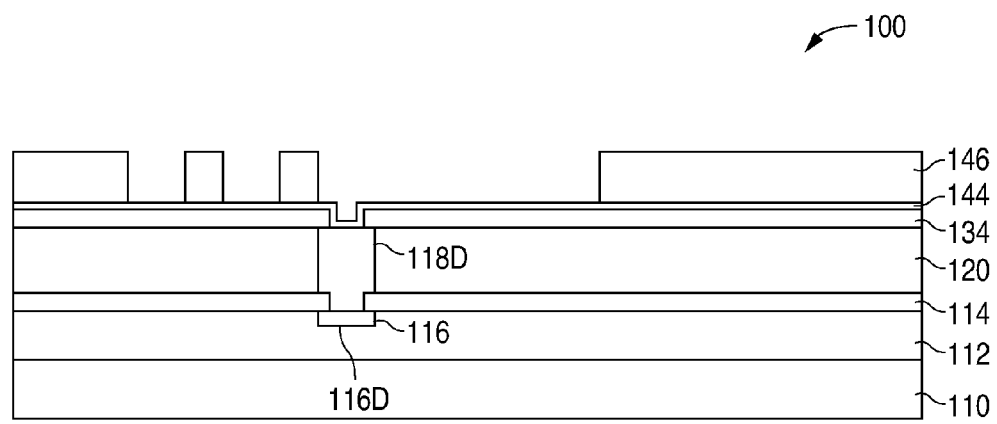
Figure 8A:
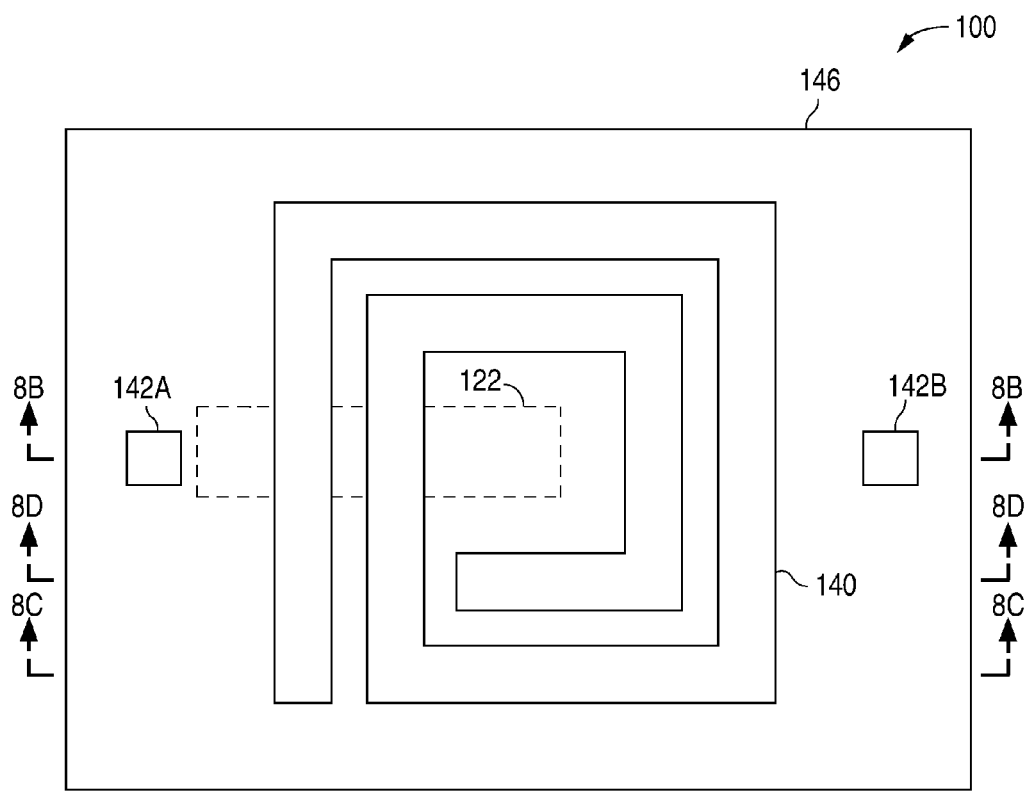
Figure 8B:
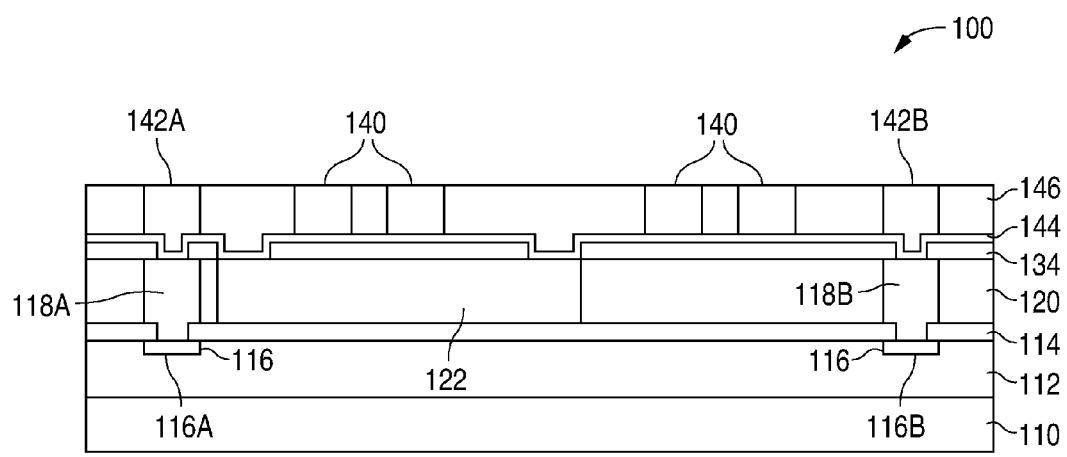
Figure 8C:
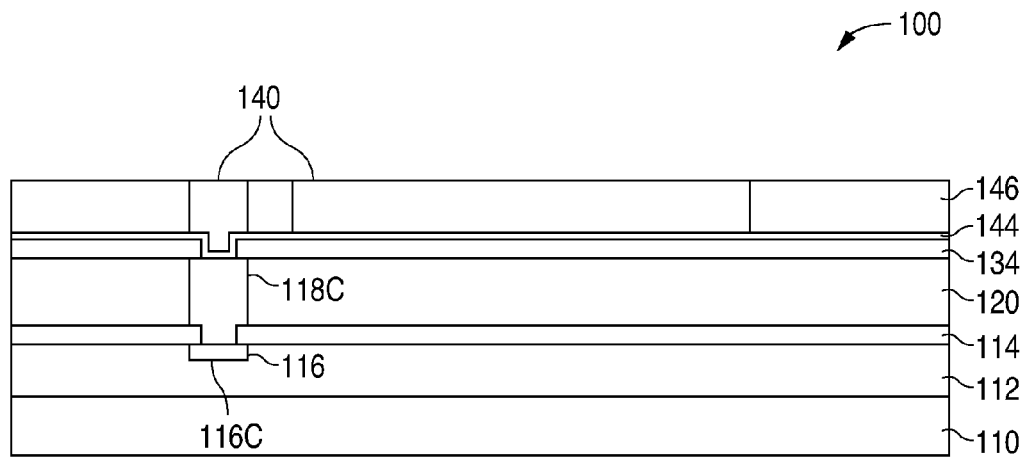
Figure 8D:
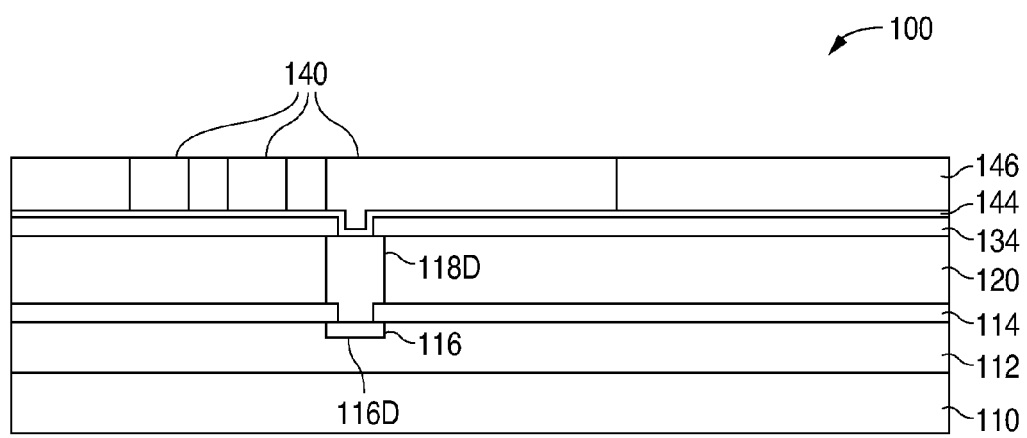
Figure 9A:
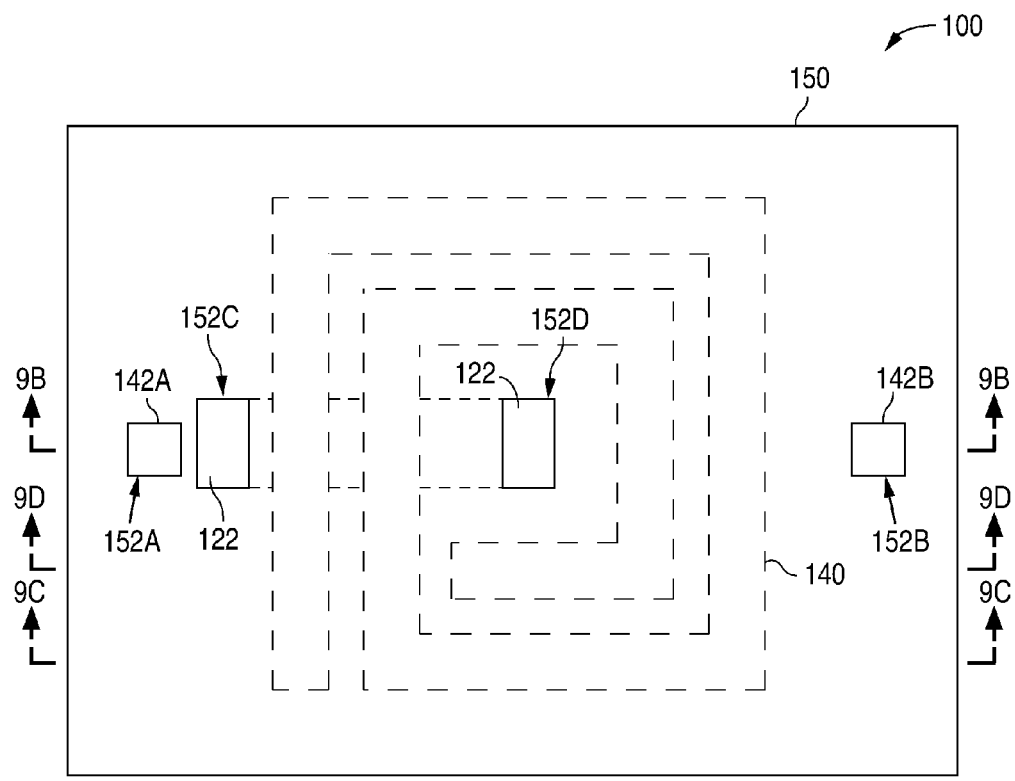
Figure 9B:
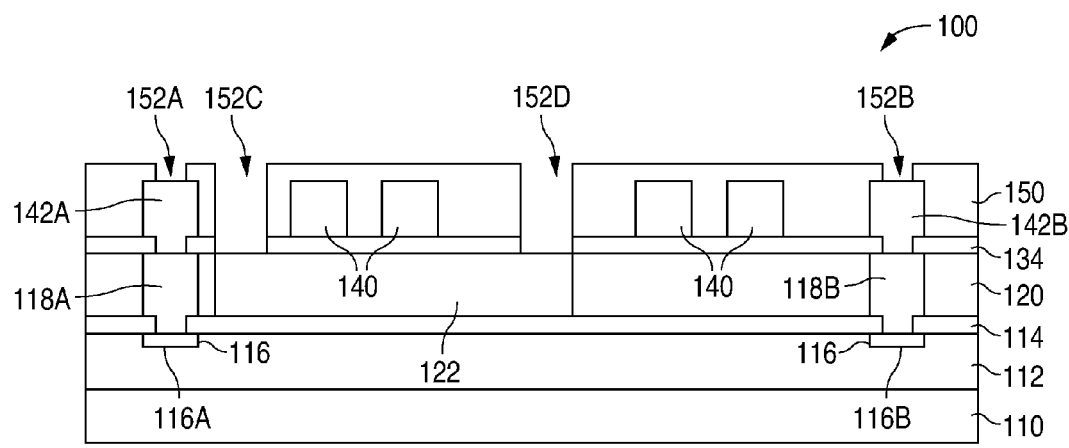
Figure 9C:
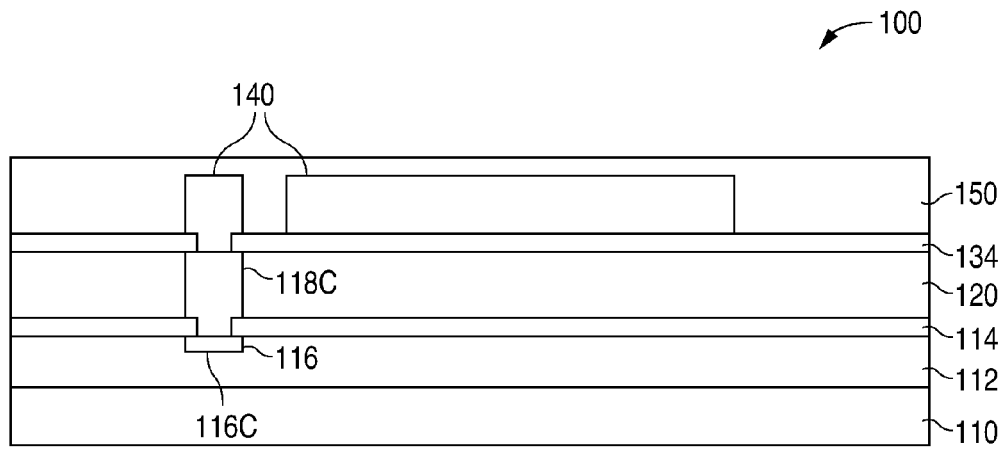
Figure 9D:
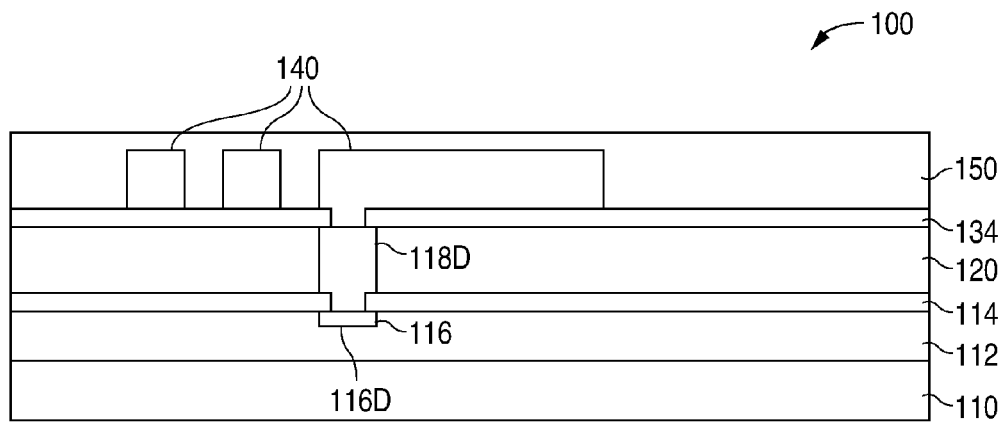
Figure 10A:
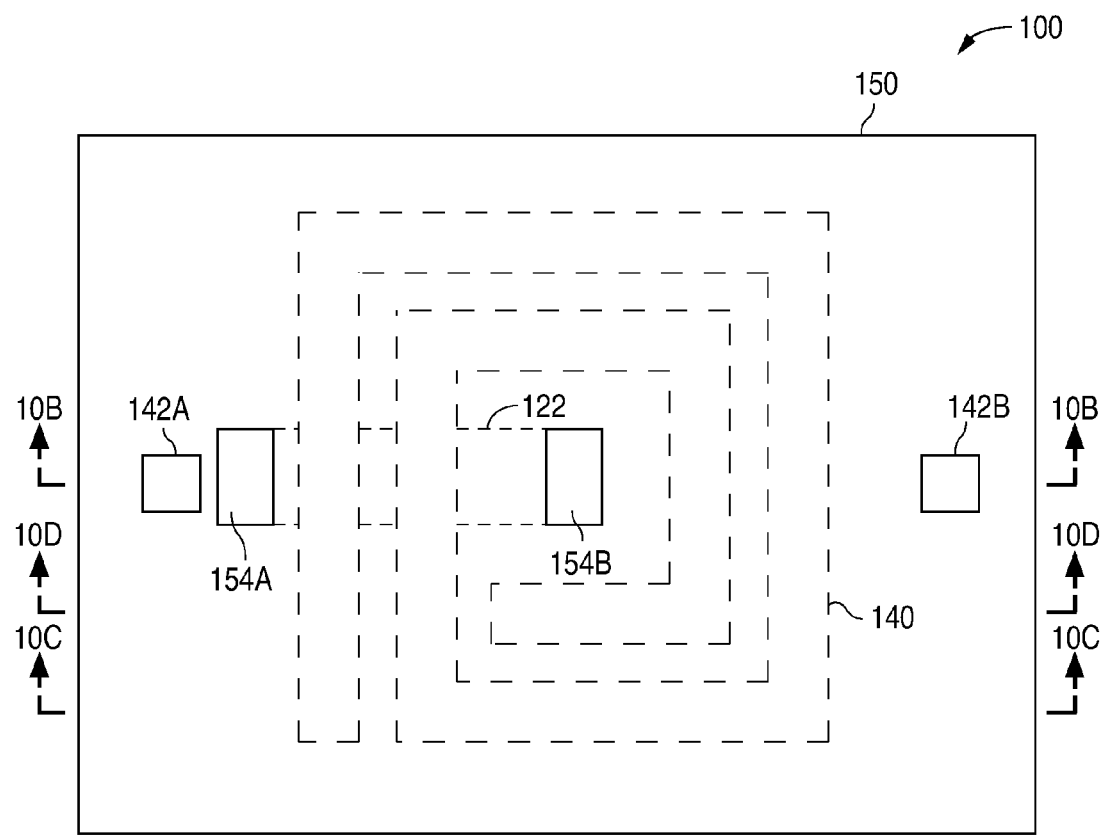
Figure 10B:
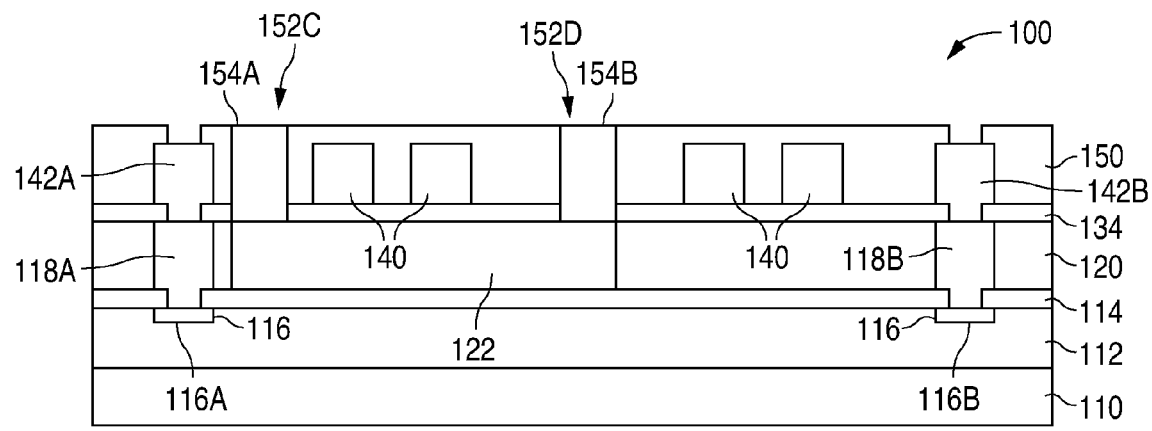
Figure 10C:
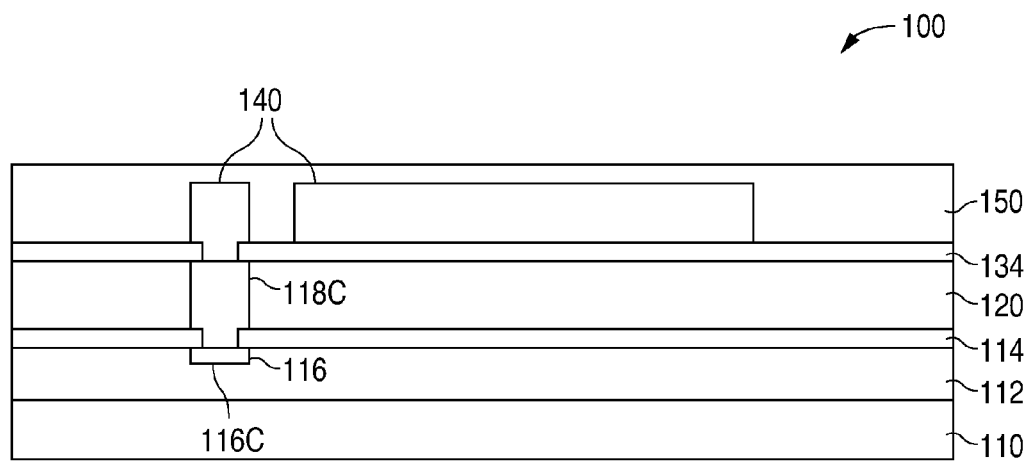
Figure 10D:
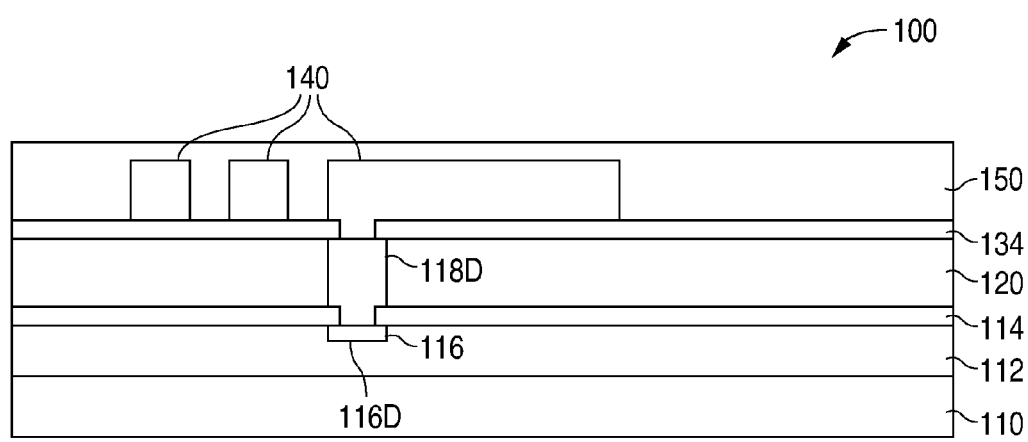
Figure 11A:
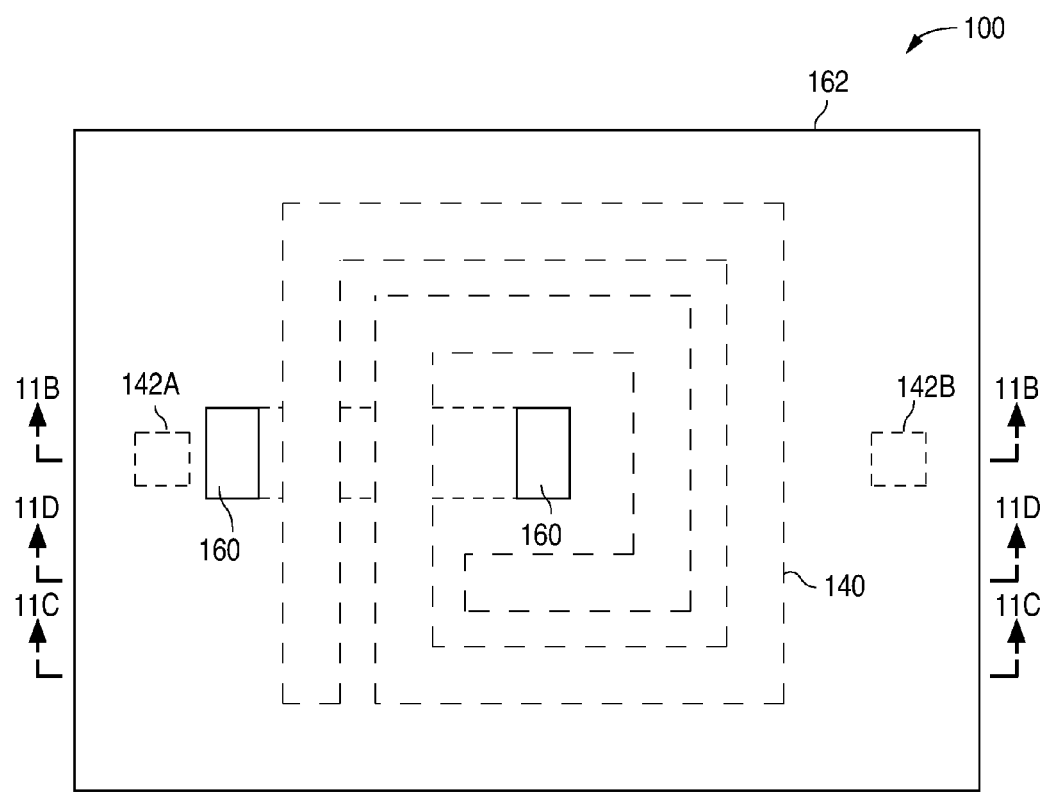
Figure 11B:
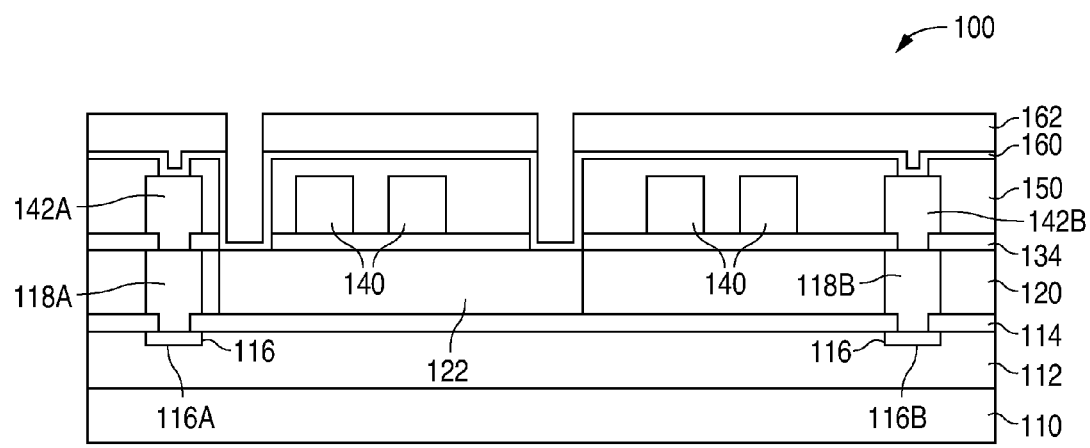
Figure 11C:
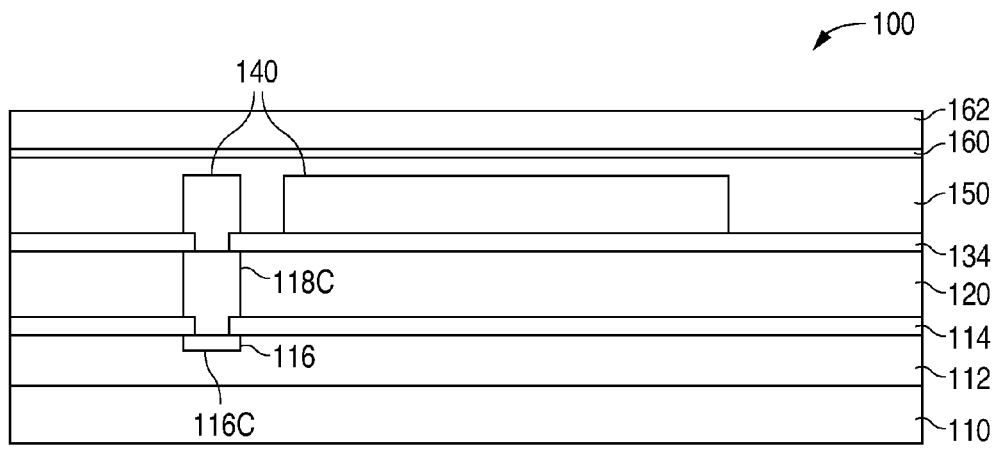
Figure 11D:
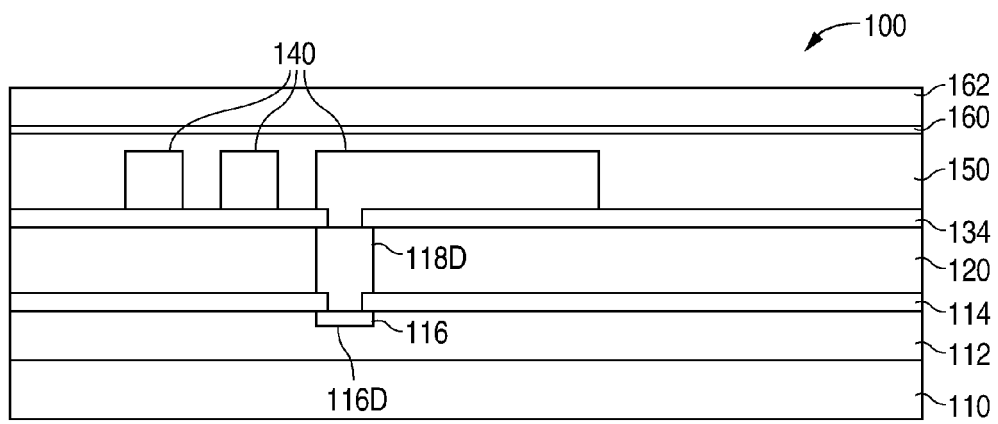
Figure 12A:
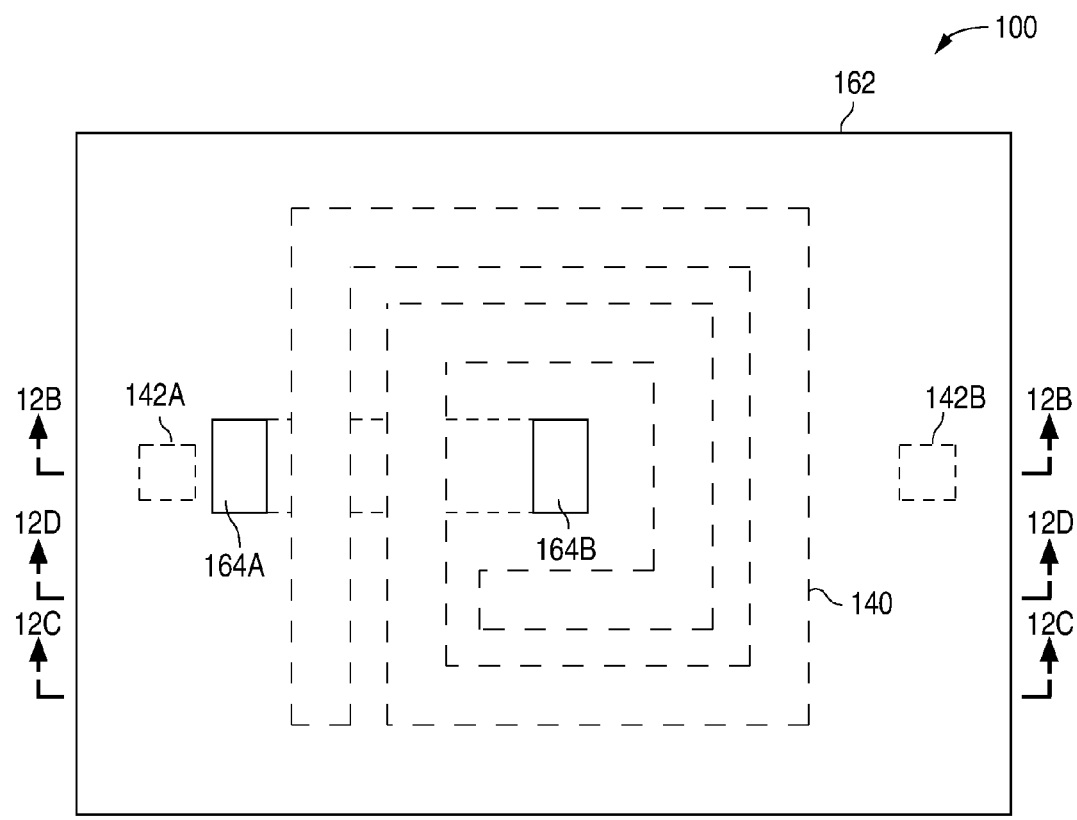
Figure 12B:
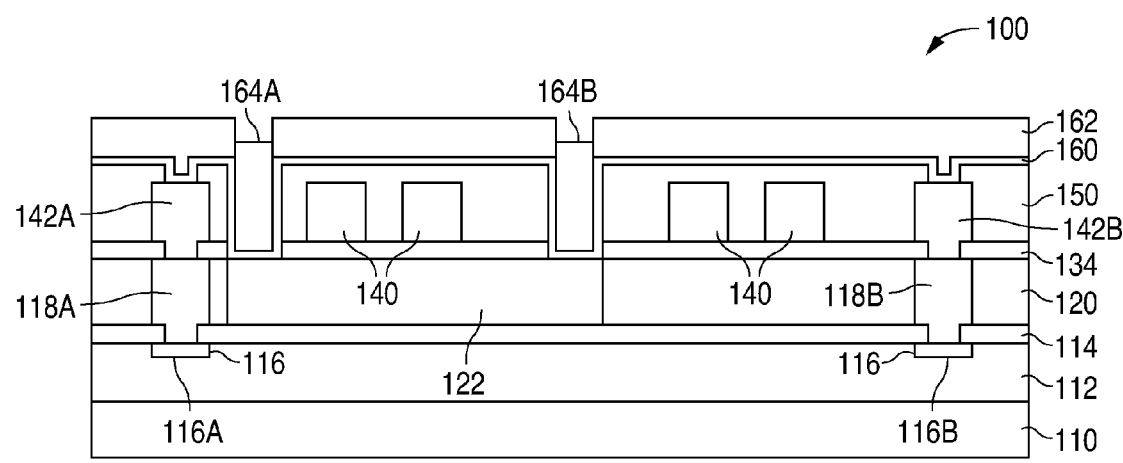
Figure 12C:
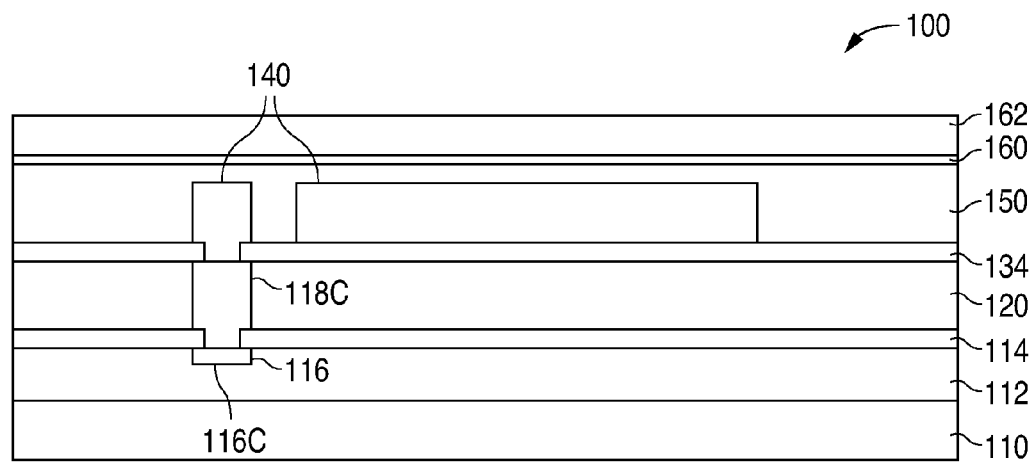
Figure 12D:
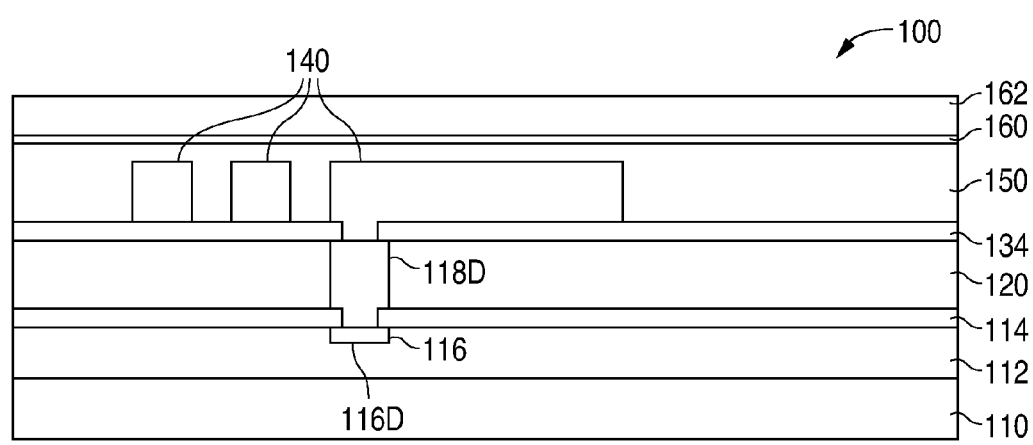
Figure 13A:
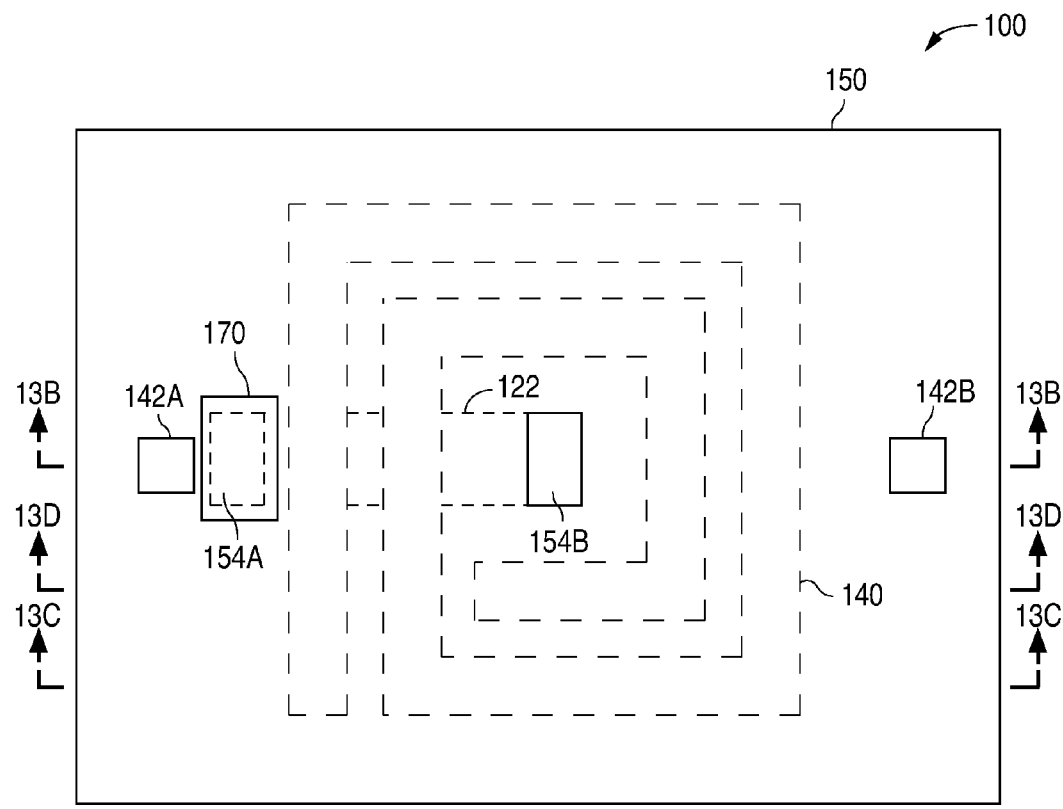
Figure 13B:
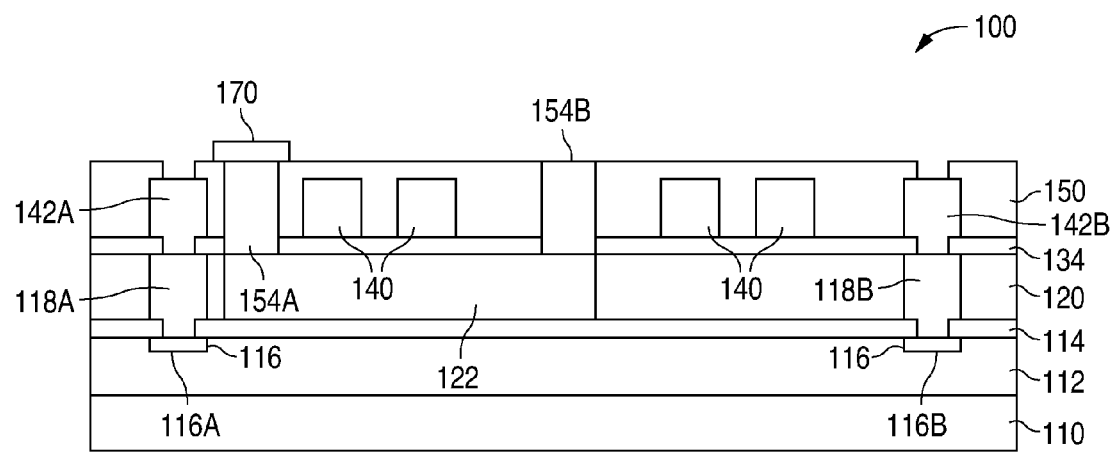
Figure 13C:
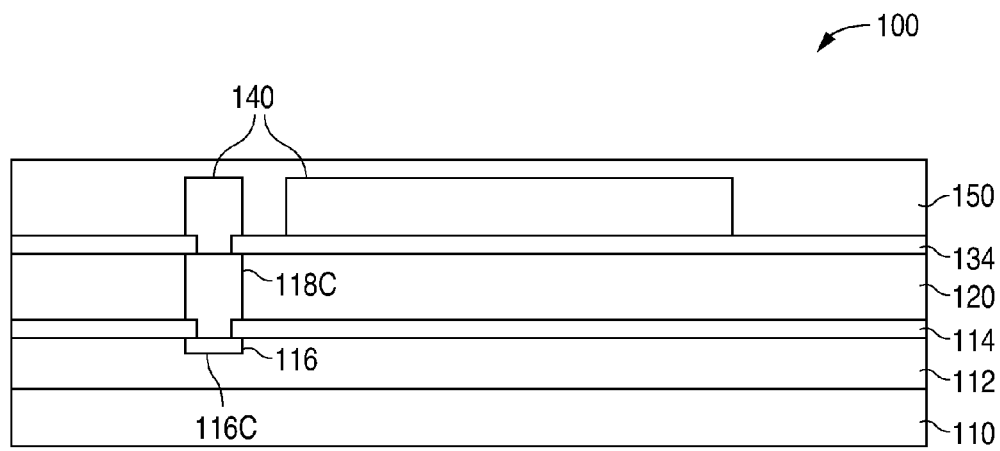
Figure 13D:
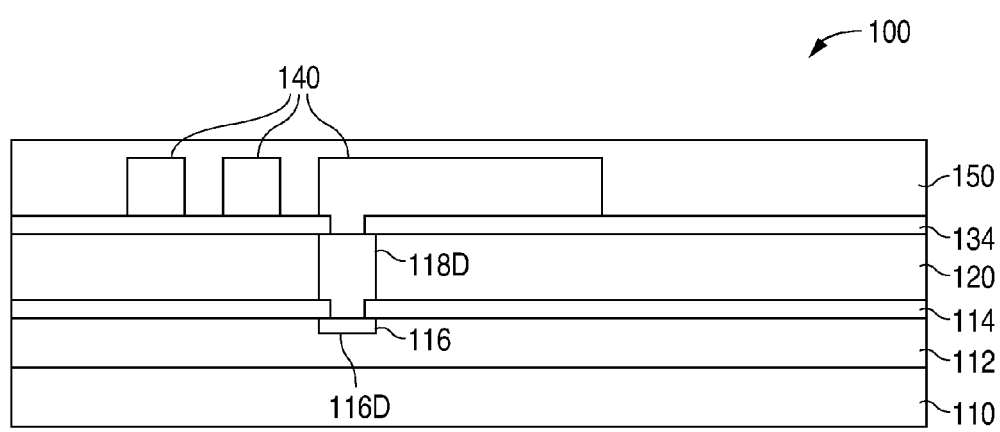
Figure 14A:
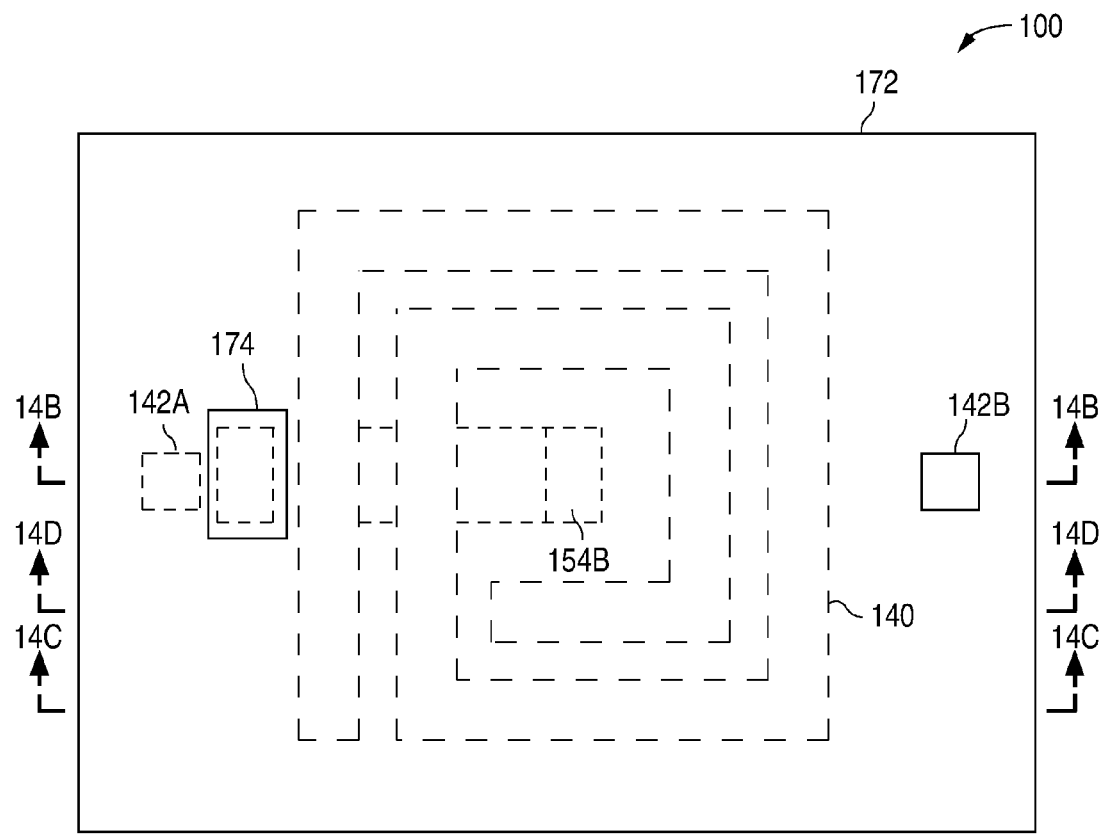
Figure 14B:
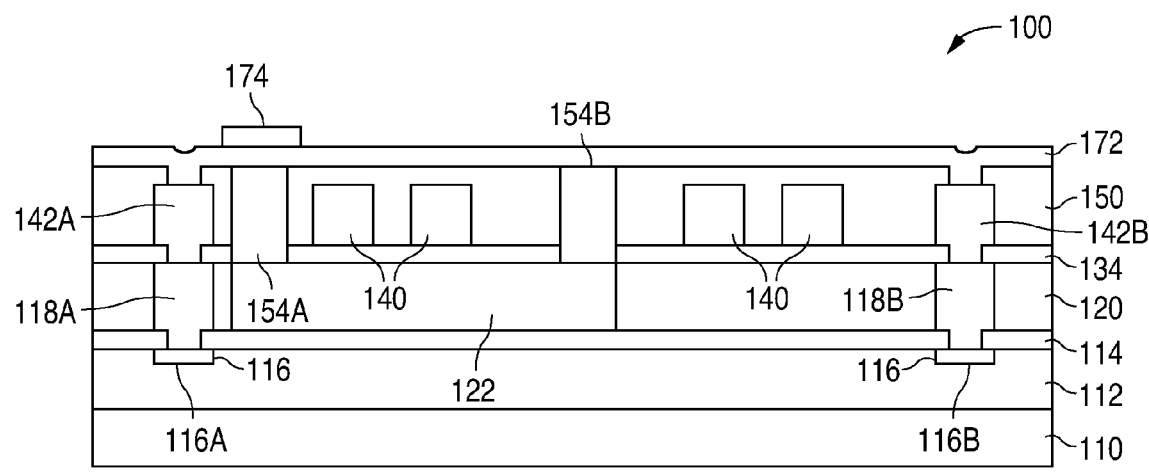
Figure 14C:
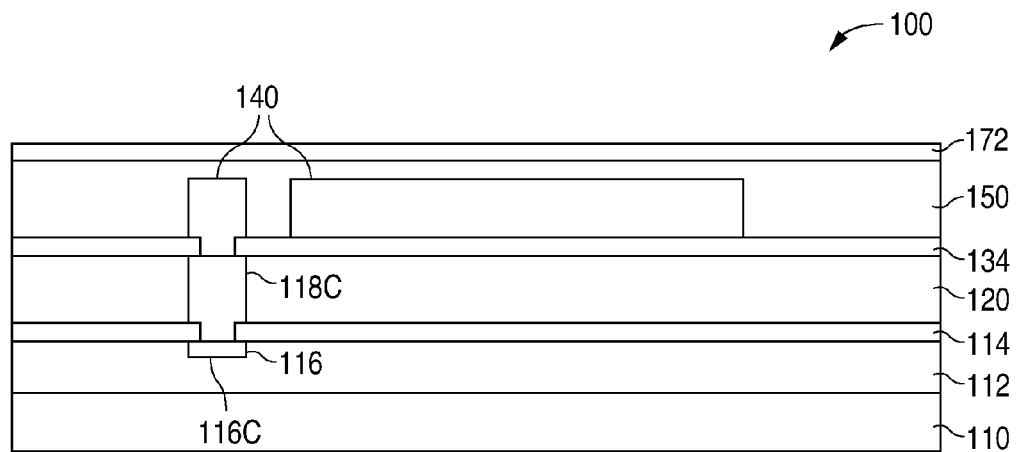
Figure 14D:
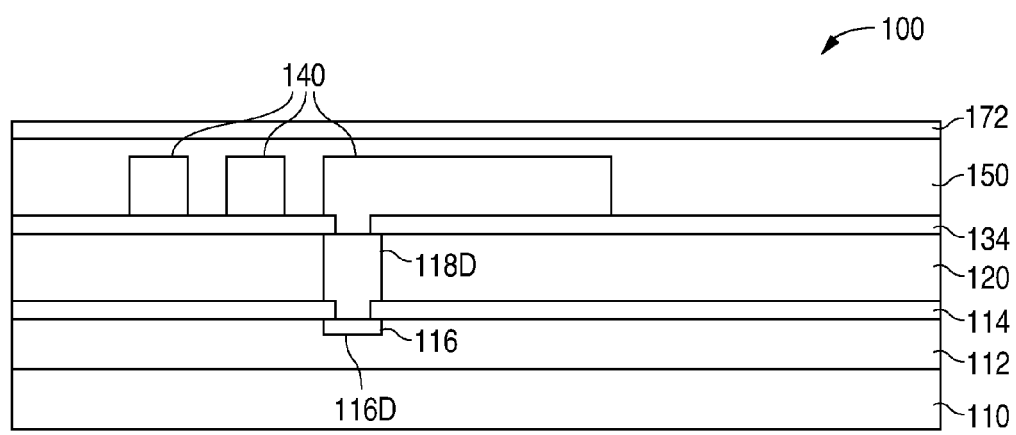
Figure 15A:
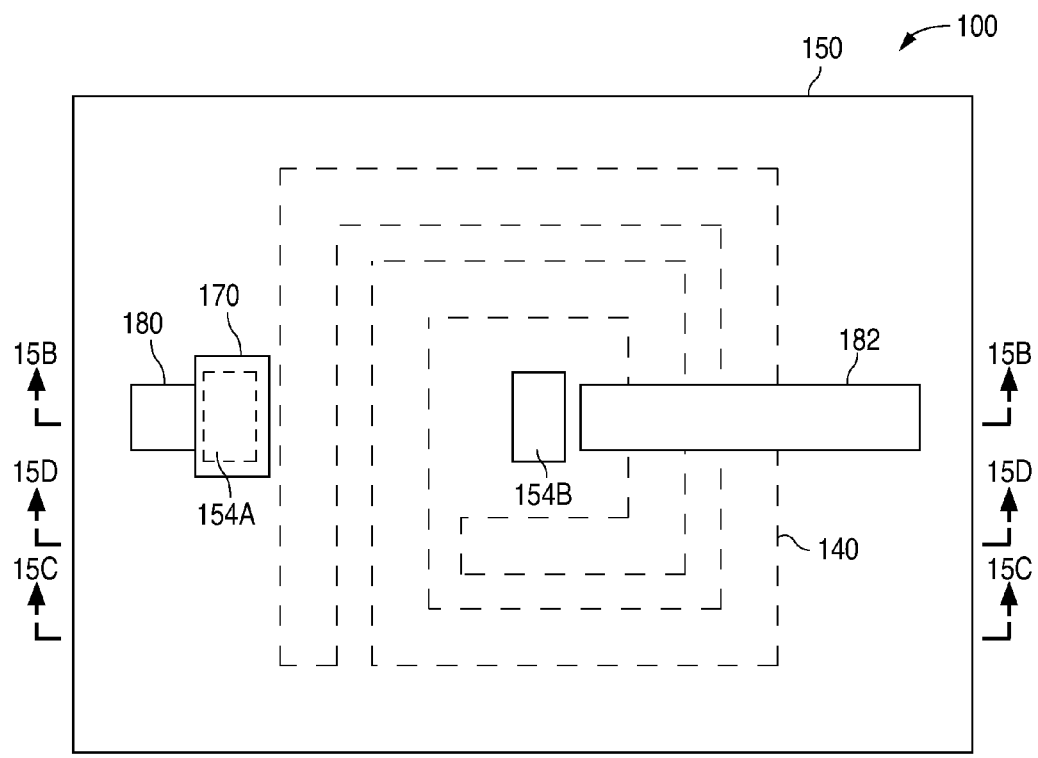
Figure 15B:
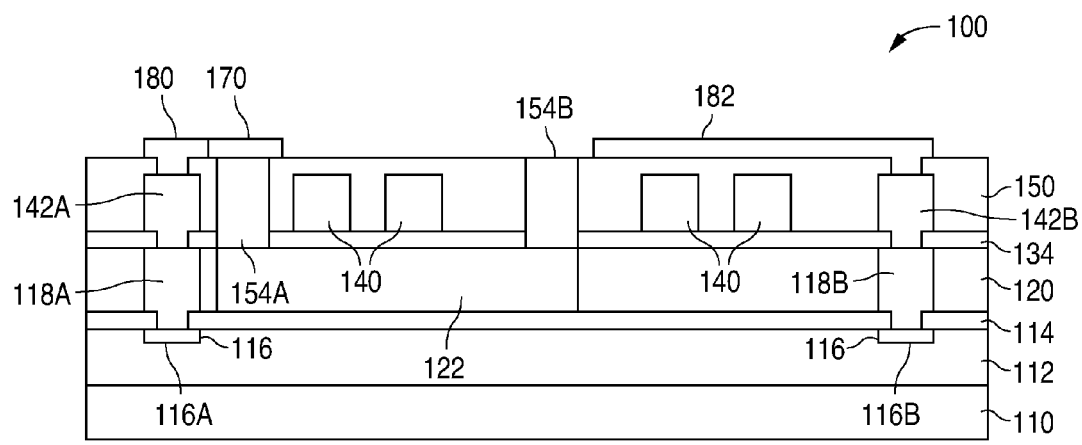
Figure 15C:
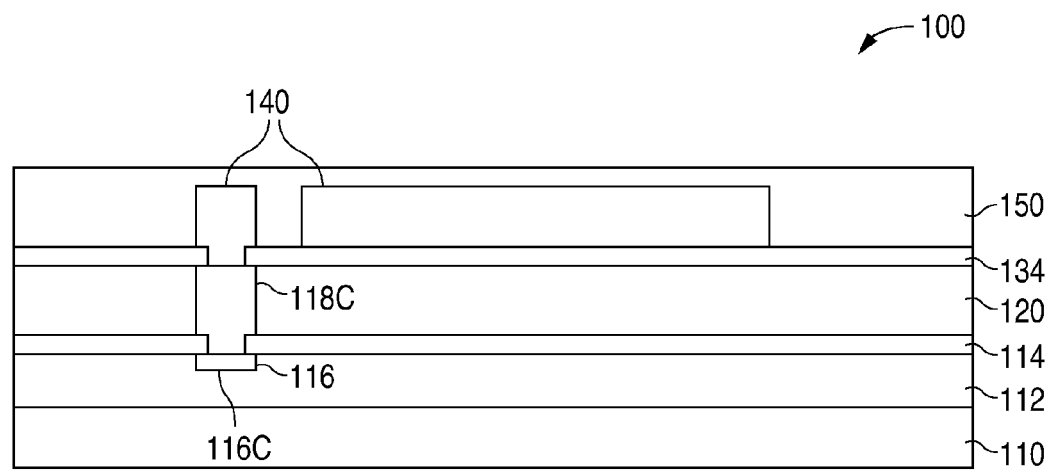
Figure 15D:
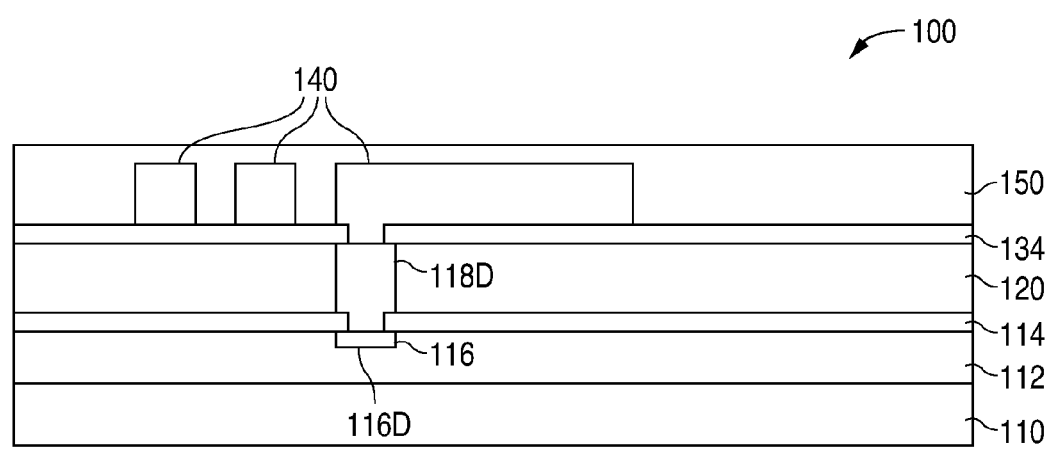
Figure 16A:
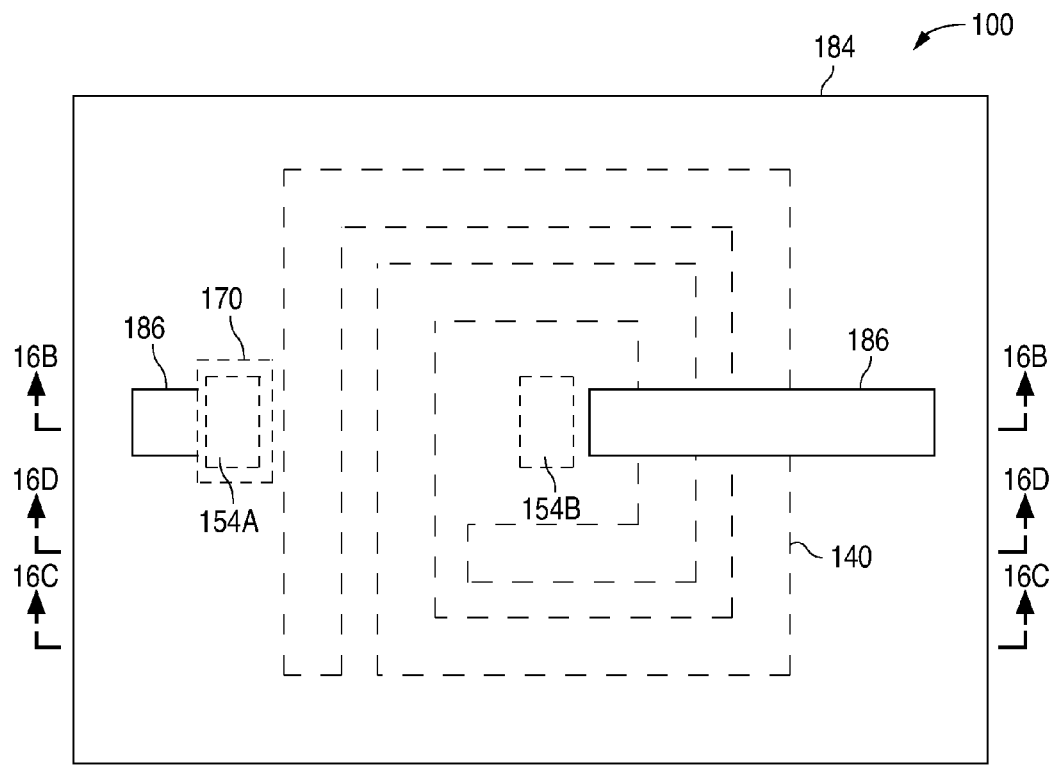
Figure 16B:
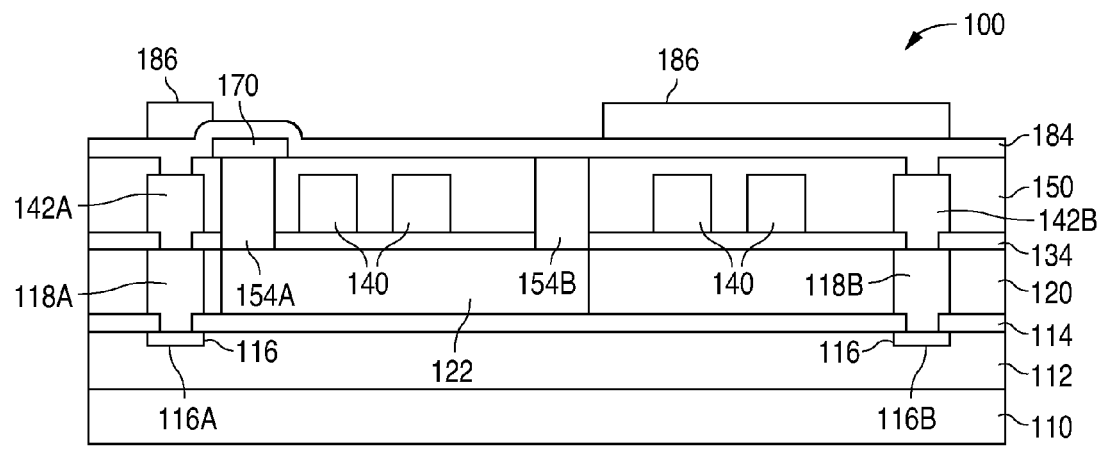
Figure 16C:
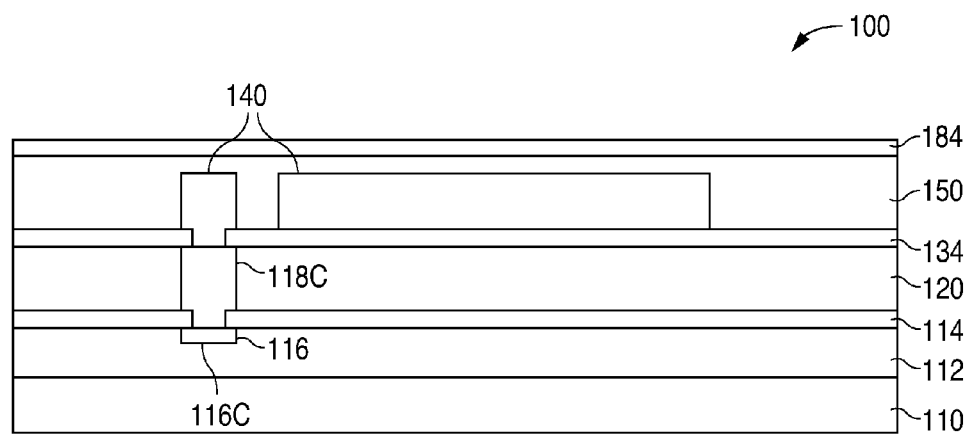
Figure 16D:
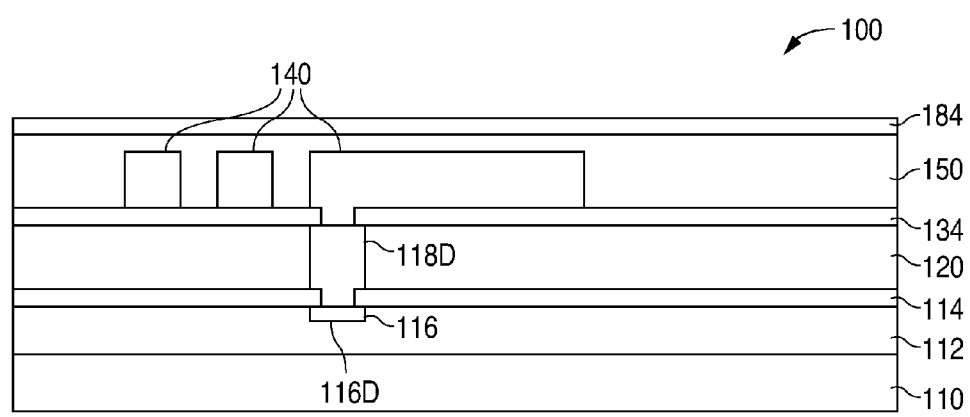
Figure 17A:
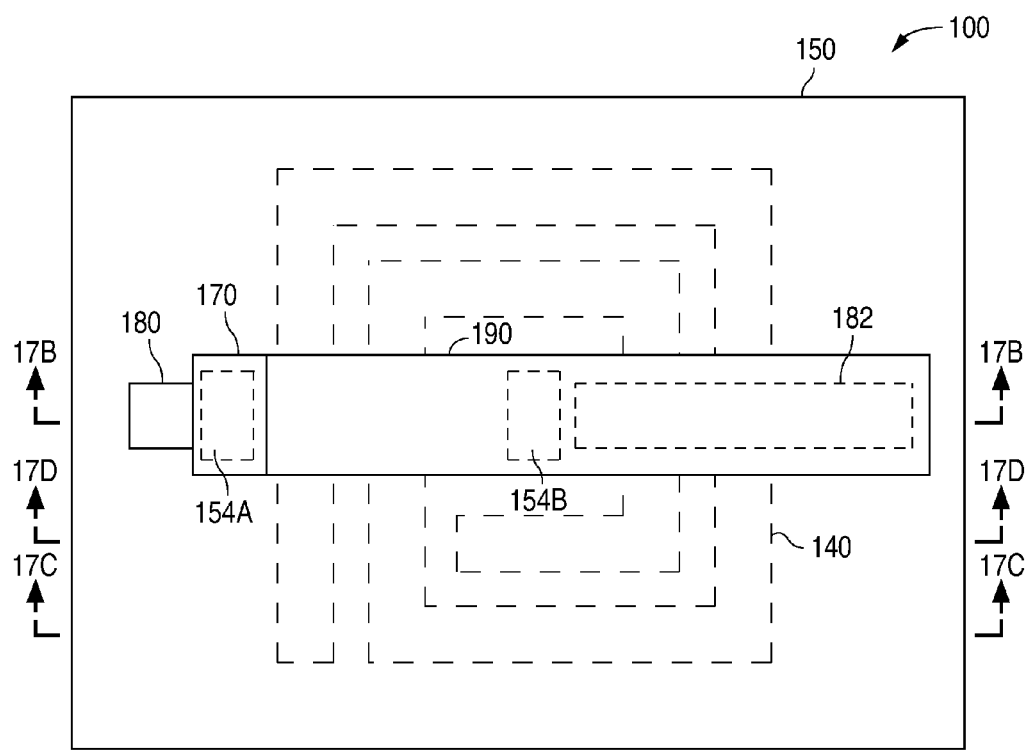
Figure 17B:
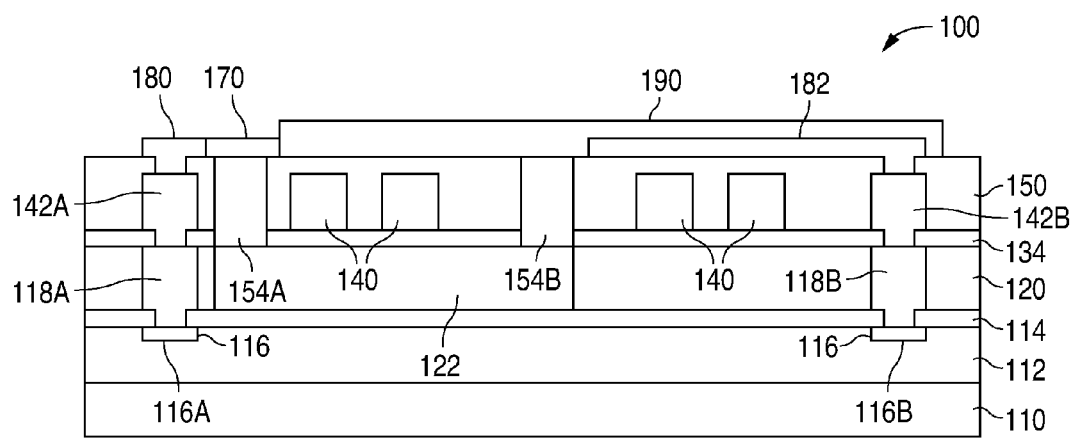
Figure 17C:
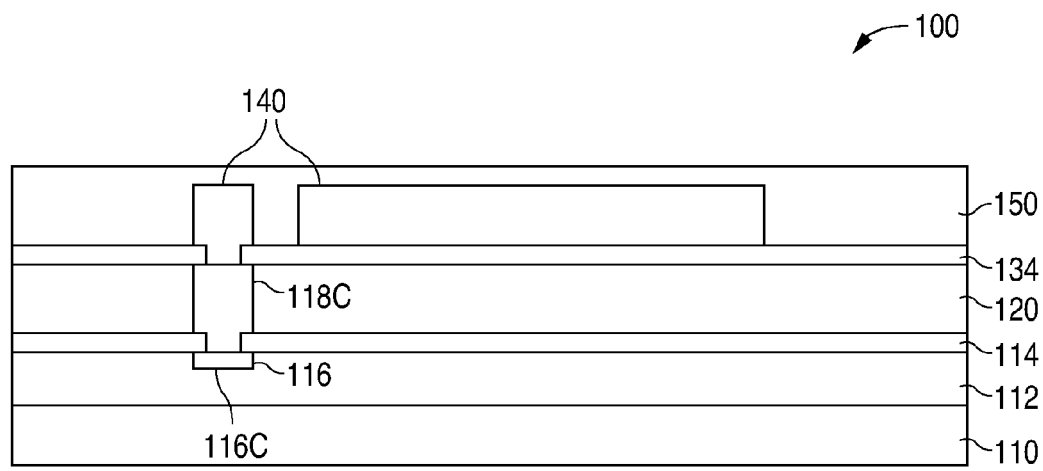
Figure 17D:
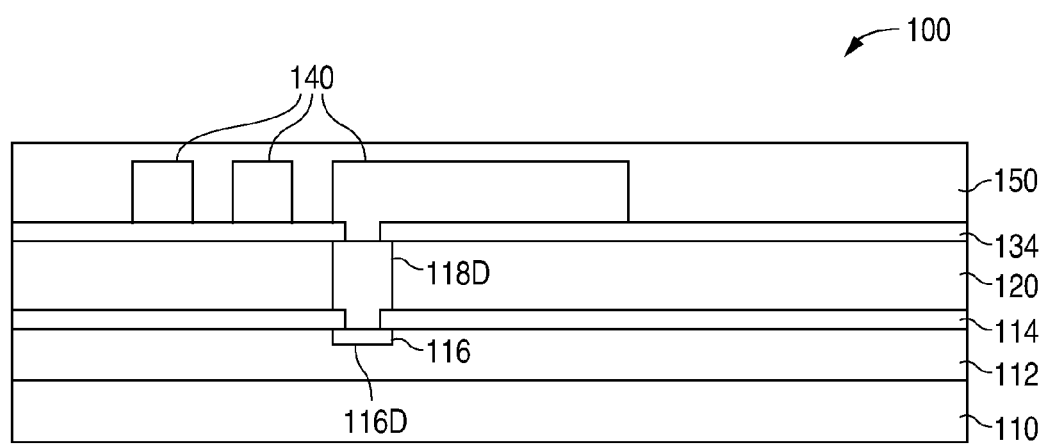
Figure 18A:
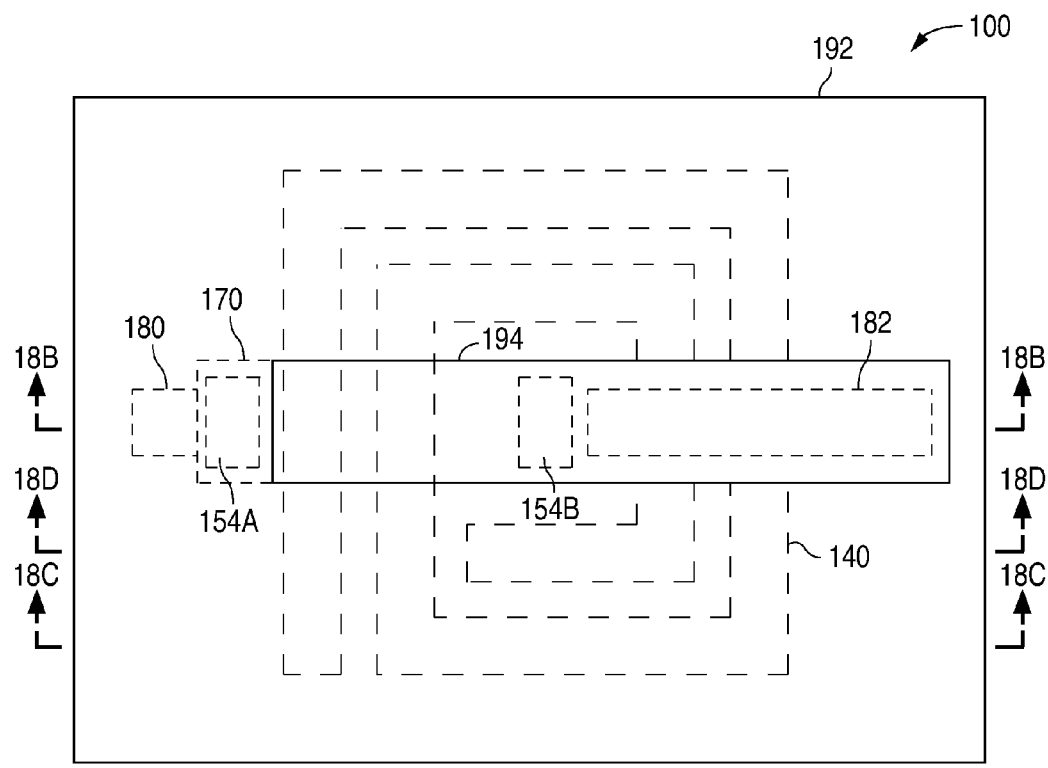
Figure 18B:
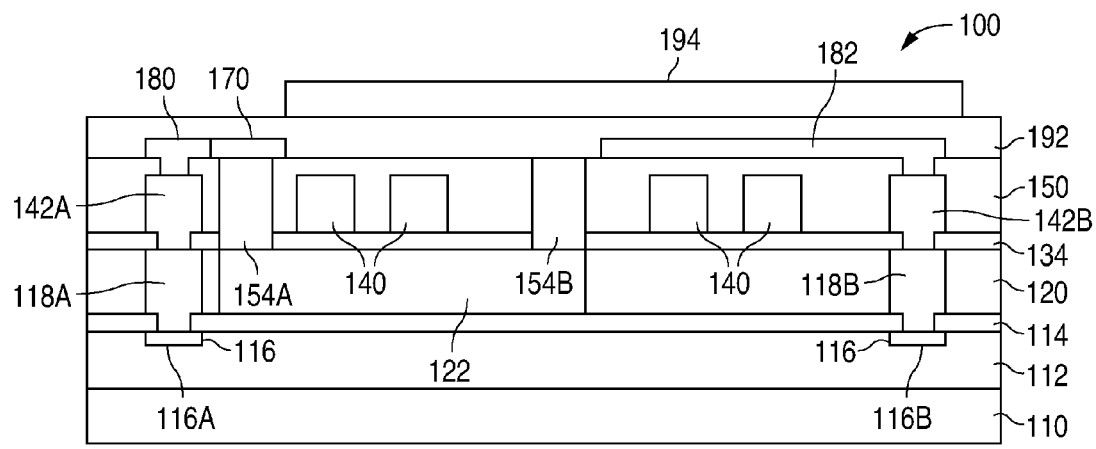
Figure 18C:
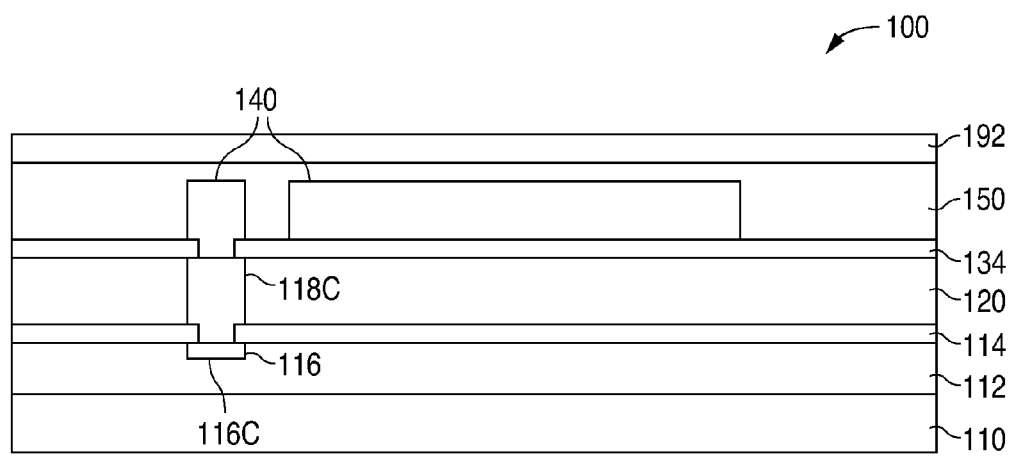
Figure 18D:
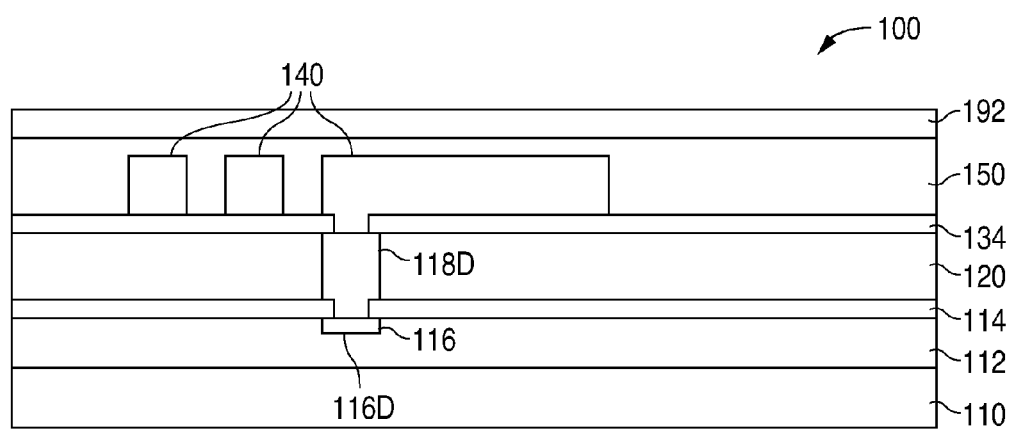
Figure 19A:
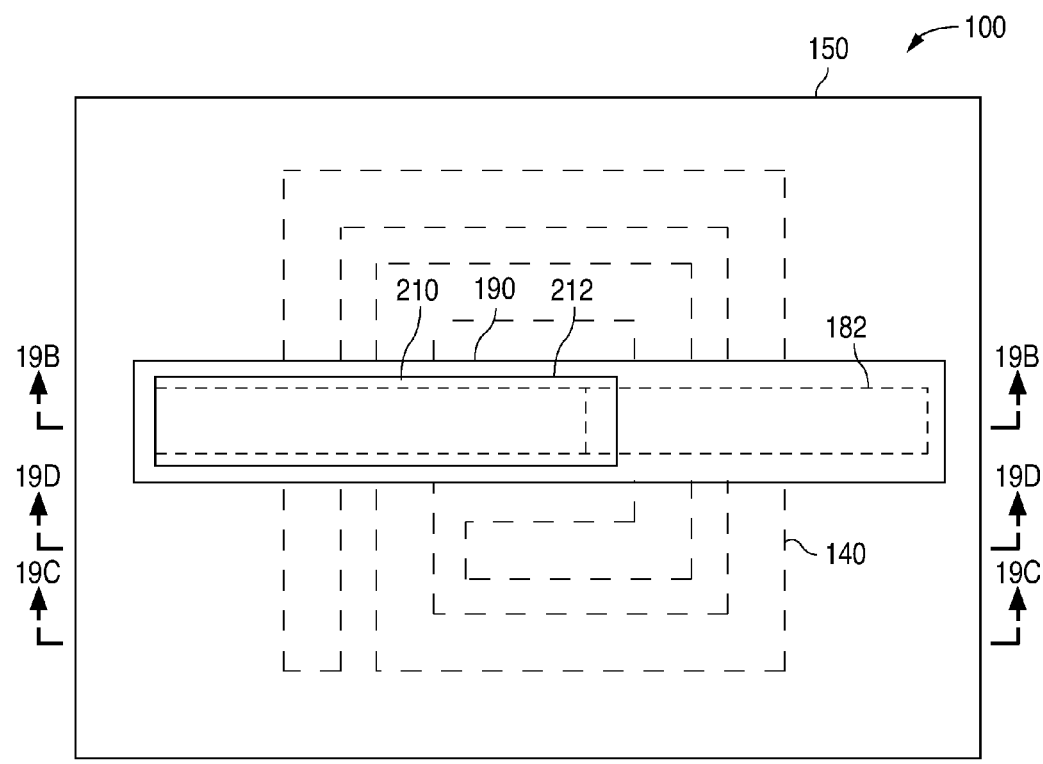
Figure 19B:
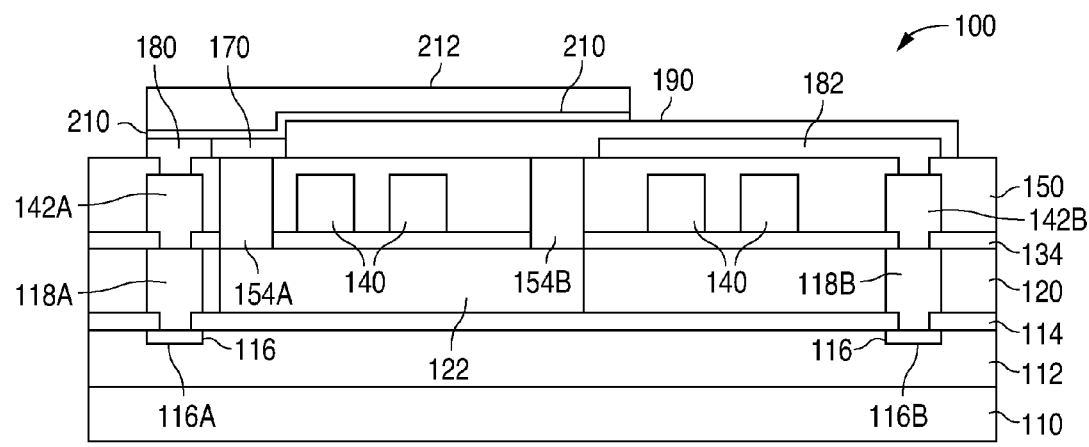
Figure 19C:
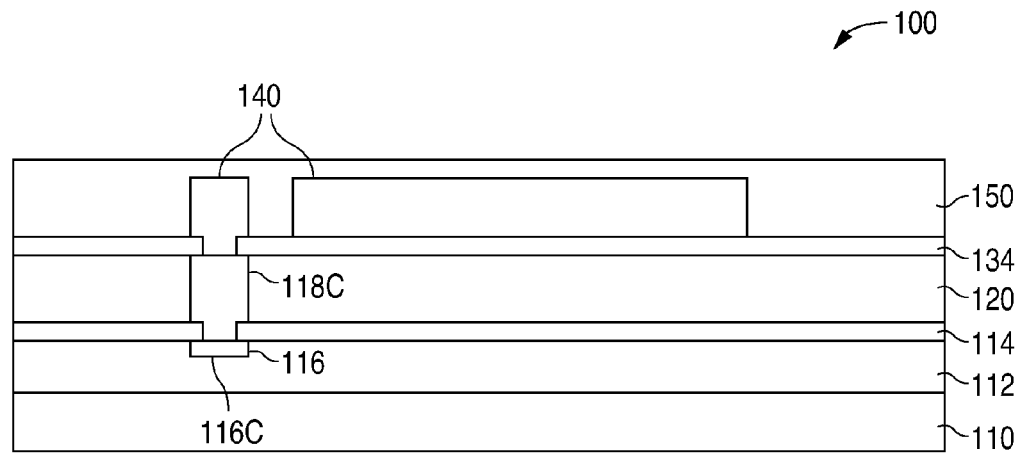
Figure 19D:
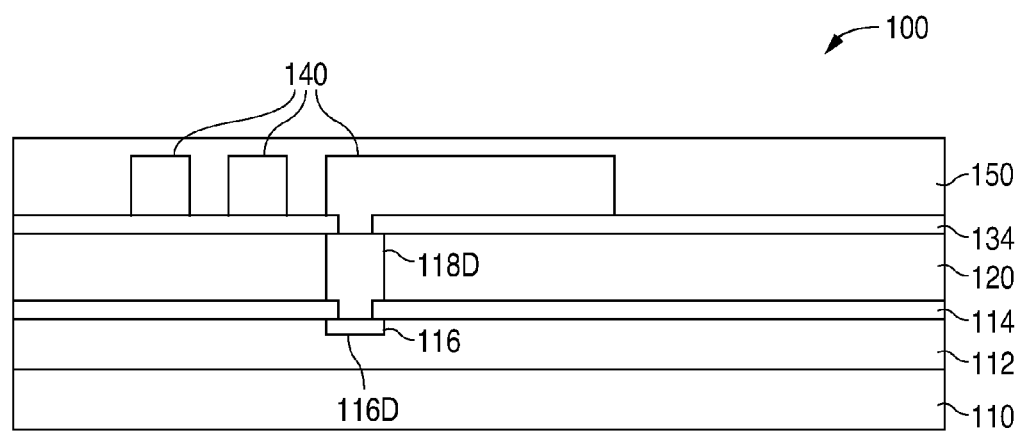

FIGS. 1A-1D through FIGS. 22A-22D show views that illustrate an example of a method of forming a MEMS relay in accordance with the present invention. FIGS. 1A-22A show plan views, while FIGS. 1B-22B show cross-sectional views taken along lines 1B-1B through 22B-22B in FIGS. 1A-22A, FIGS. 1C-22C show cross-sectional views taken along lines 1C-1C through 22C-22C in FIGS. 1A-22A, and FIGS. 1D-22D show cross-sectional views taken along lines 1D-1D through 22D-22D in FIGS. 1A-22A.

As shown in FIGS. 1A-1D, the method utilizes a conventionally-formed semiconductor wafer 100 that has a semiconductor structure 110, and a metal interconnect structure 112 that touches the top surface of semiconductor structure 110. In the present example, semiconductor structure 110 includes a large number of electrical devices, such as transistors, resistors, capacitors, and diodes.

Further, metal interconnect structure 112, which electrically connects together the electrical devices in semiconductor structure 110 to form a circuit, includes a number of levels of metal traces, a large number of contacts that connect the bottom metal trace to electrically conductive regions on semiconductor structure 110, and a large number of inter-metal vias that connect the metal traces in adjacent layers together.

In addition, metal interconnect structure 112 includes a top passivation layer 114 with openings that expose a number of conductive pads 116. The pads 116, in turn, are selected regions of the metal traces in the top metal layer that provide points for external electrical connections, and points for electrical connections to overlying devices.

In the present example, the pads 116 include a pair of switch pads 116A and 116B which provide input and output electrical connections for a to-be-formed switch, and a pair of coil pads 116C and 116D which provide input and output electrical connections for a to-be-formed coil. (Only the pads 116A-116D, and not the entire metal interconnect structure, are shown for clarity.)

As further shown in FIGS. 1A-1D, metal interconnect structure 112 includes a pair of switch metal plugs 118A and 118B that sit on top of and extend through passivation layer 114 to make electrical connections with the switch pads 116A and 116B, respectively. In addition, metal interconnect structure 112 also includes a pair of coil metal plugs 118C and 118D that sit on top of and extend through passivation layer 114 to make electrical connections with the coil pads 116C and 116D, respectively. The metal plugs 118A-118D can be formed in a conventional copper electroplating process.

As additionally shown in FIGS. 1A-1D, the method begins by forming a non-conductive layer 120 that touches the top surface of passivation layer 114 and the side wall surfaces of the metal plugs 118A-118D, and a lower magnetic core section 122 that extends through non-conductive layer 120 to touch the top surface of passivation layer 114. Non-conductive layer 120 and lower magnetic core section 122 are formed so that the top surfaces of the metal plugs 118A-118D, non-conductive layer 120, and lower magnetic core section 122 lie substantially in the same plane P.

For example, as shown in FIG. 2A-2D, non-conductive layer 120 can be formed by depositing a layer of photoimageable epoxy or polymer, such as SU-8, which is substantially self planarizing, on the top surface of passivation layer 114. Once the photoimageable epoxy or polymer has been deposited, a lower core opening 124 is formed by projecting a light through a mask to form a patterned image on the layer of photoimageable epoxy or polymer. The light hardens the regions of the layer of photoimageable epoxy or polymer that are exposed to light. Following this, the softened regions (the regions protected from light) of the layer of photoimageable epoxy or polymer are removed to form non-conductive layer 120 with lower core opening 124 that exposes the top surface of passivation layer 114.

As shown in FIGS. 3A-3D, once non-conductive layer 120 with lower core opening 124 has been formed, lower magnetic core section 122 is formed by depositing a seed layer 126 on passivation layer 114 and non-conductive layer 120. For example, seed layer 126 can be formed by depositing 300 Å of titanium, 3000 Å of copper, and 300 Å of titanium. (Seed layer 126 can also include a barrier layer to prevent copper electromigration if needed.)

After seed layer 126 has been formed, the top titanium layer is stripped and a soft magnetic material, such as an alloy of nickel and iron like permalloy or orthonol, is deposited by electroplating to a thickness of, for example, 10 µm to form a plated layer 130. After this, as shown in FIGS. 4A-4D, wafer 100 is planarized in a conventional manner, such as by chemical-mechanical polishing, to expose the top surfaces of the plugs 118A-118D and form lower magnetic core section 122.

As shown in FIGS. 5A-5D, after non-conductive layer 120 and lower magnetic core section 122 have been formed, a coil structure is next formed. The coil structure is formed by forming a non-conductive layer 134 on non-conductive layer 120 and lower magnetic core section 122. Non-conductive layer 134 has a number of plug openings 136A-136D that expose the plugs 118A-118D, respectively, and a pair of via openings 138A and 138B that expose regions on the top surface of lower magnetic core section 122.

For example, non-conductive layer 134 can be formed with a layer of photoimageable epoxy or polymer, such as SU-8, which is substantially self planarizing. Once the photoimageable epoxy or polymer has been deposited, the openings 136A-136D and 138A-138B are formed by projecting a light through a mask to form a patterned image on the photoimageable epoxy or polymer. The light hardens the regions of the photoimageable epoxy or polymer that are exposed to the light. Following this, the softened regions (the regions protected from light) of the photoimageable epoxy or polymer are removed to form non-conductive layer 134 with the openings 136A-136D and 138A-138B.

As shown in FIGS. 6A-6D, following the formation of non-conductive layer 134 with the openings 136A-136D and 138A-138B, a coil 140 which has a continuous series of loops is formed on non-conductive layer 134 so that a portion of each loop lies directly vertically over lower magnetic core section 122. Coil 140 is electrically connected to the coil plugs 118C and 118D. In addition, a pair of switch plugs 142A-142B is formed through non-conductive layer 134 to make electrical connections with the switch plugs 118A-118B, respectively.

For example, as shown in FIGS. 7A-7D, coil 140 and the switch plugs 142A-142B can be formed by forming a seed layer 144 on the plugs 118A-118D, lower magnetic core section 122, and non-conductive layer 134. Seed layer 144 can be formed by depositing 300 Å of titanium, 3000 Å of copper, and 300 Å of titanium. (Seed layer 144 can also include a barrier layer to prevent copper electromigration if needed.)

Once seed layer 144 has been formed, a plating mold 146 is formed on the top surface of seed layer 144. Plating mold 146, in turn, has an opening that exposes a portion of seed layer 144 that lies over the plugs 118C and 118D and defines the shape of the to-be-formed coil, and openings that expose portions of seed layer 144 that lie over the plugs 118A-118B.

As shown in FIGS. 8A-8D, following the formation of plating mold 146, the top titanium layer is stripped and copper is deposited by electroplating to form coil 140 and the switch plugs 142A-142B. After the electroplating, plating mold 146 and the underlying regions of seed layer 144 are removed.

After coil 140 and the switch plugs 142A-142B have been formed, as shown in FIGS. 9A-9D, a non-conductive layer 150 is deposited on non-conductive layer 134, coil 140, and the plugs 142A-142B to complete the formation of the coil structure. Non-conductive layer 150 has a pair of switch openings 152A and 152B that expose the top surfaces of the switch plugs 142A and 142B, and a pair of core openings 152C and 152D that expose regions on the top surface of lower magnetic core section 122.

For example, non-conductive layer 150 can be formed with a layer of photoimageable epoxy or polymer, such as SU-8, which is substantially self planarizing. Once the photoimageable epoxy or polymer has been deposited, the openings 152A-152D are formed by projecting a light through a mask to form a patterned image on the photoimageable epoxy or polymer. The light hardens the regions of the photoimageable epoxy or polymer that are exposed to the light. Following this, the softened regions (the regions protected from light) of the photoimageable epoxy or polymer are removed to forming non-conductive layer 150 with the openings 152A-152D.

As shown in FIGS. 10A-10D, once non-conductive layer 150 with the openings 152A-152D have been formed, a magnetic core via 154A and a magnetic core via 154B are formed in the openings 152C and 152D, respectively, to touch the opposite ends of lower magnetic core section 122. For example, as shown in FIGS. 11A-11D, the magnetic core vias 154A and 154B can be formed by depositing a seed layer 160 on the top surfaces of lower magnetic core section 122, the switch plugs 142A-142B, and non-conductive layer 150.

Seed layer 160 can be formed by depositing 300 Å of titanium, 3000 Å of copper, and 300 Å of titanium. (Seed layer 160 can also include a barrier layer to prevent copper electromigration if needed.) After seed layer 160 has been formed, a plating mold 162 is formed on the top surface of seed layer 160. Plating mold 162, in turn, has openings that expose portions of seed layer 160 that lie over the ends of lower magnetic core section 122.

As shown in FIGS. 12A-12D, following the formation of plating mold 162, the top titanium layer is stripped and a soft magnetic material, such as an alloy of nickel and iron like permalloy or orthonol, is deposited by electroplating to a thickness of, for example, 4 µm to form plated regions 164A and 164B. After the electroplating, plating mold 162 and the underlying regions of seed layer 164 are removed. Following this, wafer 100 is planarized to remove portions of plated regions 164A and 164B and form the magnetic core vias 154A and 154B. As a result, the continuous series of loops of coil 140 is wound around magnetic core via 154B.

After the magnetic core vias 154A-154B have been formed, as shown in FIGS. 13A-13D, an upper structure is next formed. The upper structure can be formed by forming a non-conductive member 170 on non-conductive layer 150 and magnetic core via 154A to cover core magnetic via 154A. For example, as shown in FIGS. 14A-14D, non-conductive member 170 can be formed by depositing a non-conductive layer 172 on the plugs 142A-142B, non-conductive layer 150, and the magnetic core vias 154A and 154B. After this, a patterned photoresist layer 174 is formed on the top surface of non-conductive layer 172.

Patterned photoresist layer 174 is formed in a conventional manner, which includes depositing a layer of photoresist, and projecting a light through a patterned black/clear glass plate known as a mask to form a patterned image on the layer of photoresist. The light softens the photoresist regions exposed to the light. Following this, the softened photoresist regions are removed. After patterned photoresist layer 174 has been formed, the exposed regions of non-conductive layer 172 are etched in a conventional manner to form non-conductive member 170. Patterned photoresist layer 174 is then removed with conventional solvents and processes.

As shown in FIGS. 15A-15D, following the formation of non-conductive member 170, a metal plug 180 and a metal trace 182 are formed to make electrical connections to switch plugs 142A and 142B, respectively. For example, as shown in FIGS. 16A-16D, metal plug 180 and metal trace 182 can be formed by depositing a gold layer 184 approximately 3000 Å thick that touches the switch plugs 142A-142B, non-conductive layer 150, core via 154B, and non-conductive member 170.

After this, a patterned photoresist layer 186 is formed on the top surface of gold layer 184. Patterned photoresist layer 186 is formed in a conventional manner. After patterned photoresist layer 186 has been formed, the exposed regions of gold layer 184 are etched in a conventional manner to form metal plug 180 and metal trace 182. Patterned photoresist layer 186 is then removed with conventional solvents and processes.

As shown in FIGS. 17A-17D, following the formation of metal plug 180 and metal trace 182, a sacrificial structure 190 is formed to touch the top surface of non-conductive layer 150, magnetic core via 154B, non-conductive member 170, and metal trace 182. For example, as shown in FIGS. 18A-18D, sacrificial structure 190 can be fabricated by forming a sacrificial layer 192 on non-conductive layer 150, magnetic core via 154B, non-conductive member 170, metal plug 180, and metal trace 182.

After this, a patterned photoresist layer 194 is formed on the top surface of sacrificial layer 192. Patterned photoresist layer 194 is formed in a conventional manner. After patterned photoresist layer 194 has been formed, the exposed regions of sacrificial layer 192 are etched in a conventional manner to form sacrificial structure 190. Patterned photoresist layer 194 is then removed with conventional solvents and processes.

As shown in FIGS. 19A-19D, following the formation of sacrificial structure 190, a metal trace 210 is formed to touch the top surface of non-conductive member 170, metal plug 180, and sacrificial structure 190 to lie over lower magnetic core section 122 and a contact region of metal trace 182. After the formation of metal trace 210, a magnetic cantilever core section 212 is formed to touch the top surface of metal trace 210 and lie over lower magnetic core section 122.

For example, as shown in FIGS. 20A-20D, metal trace 210 and magnetic cantilever core section 212 can be formed by depositing a gold layer 220 approximately 3000 Å thick on the top surfaces of non-conductive layer 150, non-conductive member 170, metal plug 180, metal trace 182, and sacrificial structure 190 to lie over lower magnetic core section 122. After gold layer 220 has been formed, a plating mold 222 is formed on the top surface of gold layer 220. Plating mold 222, in turn, has an opening that exposes a portion of gold layer 220 that defines the shape of the to-be-formed magnetic cantilever core section 212.

As shown in FIGS. 21A-21D, following the formation of plating mold 222, a soft magnetic material, such as an alloy of nickel and iron like permalloy or orthonol, is deposited by electroplating to a thickness of, for example, 2 µm to form magnetic cantilever core section 212. After the electroplating, plating mold 222 and the underlying regions of gold layer 220 are removed to form metal trace 210. Thus, gold layer 220 is used to form metal trace 210 as well as a seed layer for electroplating the soft magnetic material.

After this, as shown in FIGS. 22A-22D, sacrificial structure 190 is etched away to form a MEMS relay 230. As a result, sacrificial structure 190 can be implemented with any material which can selectively etched away without removing excessive amounts of the exposed elements of MEMS relay 230. Thus, as further shown in FIGS. 22A-22D, MEMS relay 230 includes a switch 232, which has a contact region 234 at the end of metal trace 182, and a contact region 236 at the end of metal trace 210 that opposes contact region 234.

In operation, contact region 236 is movable between a first position and a second position. Switch 232 is open when no current flows through coil 140. In this condition, contact region 234 is in the first position, which is vertically spaced apart from contact region 236 by a gap 240. FIG. 22A-22D show MEMS relay 230 in the open position. FIG. 23 shows a cross-sectional view taken along line 22B-22B of FIG. 22A that illustrates MEMS relay 230 in the closed position in accordance with the present invention.

As shown in FIG. 23, switch 232 closes when a current flows through coil 140. The current generates a magnetic field that pulls magnetic cantilever core section 212 towards magnetic core via 154B and lower magnetic core section 122 which, in turn, causes contact region 236 to move to the second position and touch contact region 234.

One of the advantages of MEMS relay 230 is that MEMS relay 230 only requires a small vertical movement to close gap 240 between the contacts 234 and 236 and therefore is mechanically robust. In addition, MEMS relay 230 has a small footprint and, therefore, can be formed on top of small integrated circuits.

In order for switch 232 to close when current flows through coil 140, the electromagnetic force generated by coil 140 must be greater than the spring force of magnetic cantilever core section 212 (the force required to deflect contact region 236 of magnetic cantilever core section 212 the amount required to close gap 240) combined with a contact force (the force required to ensure that contact region 236 fully touches contact region 234).

The spring force of magnetic cantilever core section 212, in turn, is a function of the thickness of magnetic cantilever core section 212. In the present example, the thickness of magnetic cantilever core section 212 is much thinner (two microns) than the thickness of lower magnetic core section 122 (ten microns). As a result, the cross-sectional area of magnetic cantilever core section 212 (thickness of two microns times a width) is much less than the cross-sectional area of lower magnetic core section 122 (thickness of ten microns times the same width).

The maximum amount of magnetic flux that can flow through a core member is a function of the cross-sectional area of the core member and the permeability of the core member. Thus, if lower magnetic core section 122, the magnetic core vias 154A and 154B, and magnetic cantilever core section 212 are formed from the same material, substantially more magnetic flux flows through lower magnetic core section 122 than flows through the magnetic core vias 154A and 154B and magnetic cantilever core section 212. (The magnetic core vias 154A and 154B and magnetic cantilever core section 212 can be formed to have the same cross-sectional areas.)

To increase the amount of magnetic flux that flows through magnetic cantilever core section 212, and thus better contain the magnetic flux around magnetic cantilever core section 212, lower magnetic core section 122 can be formed from a material that has a different permeability than the material used to form the magnetic core vias 154A and 154B and magnetic cantilever core section 212.

For example, magnetic cantilever core section 212 and the magnetic core vias 154A and 154B can be formed from permalloy, which has a high permeability. Permalloy is approximately 80% nickel and 20% iron. Adjusting the relative percentages of the materials lowers the permeability. For example, orthonol is a nickel-iron alloy of 50% nickel and 50% iron that has a lower permeability than permalloy.

Thus, the differences between the cross-sectional areas of lower magnetic core section 122 and magnetic cantilever core section 212, which effect the maximum amount of flux that can pass through sections 122 and 212, can be compensated for by forming lower magnetic core section 122 with a material that has a lower permeability than the material used to form the magnetic core vias 154A and 154B and magnetic cantilever core section 212.

Alternately, the amount of magnetic flux that flows through magnetic cantilever core section 212 can be increased by increasing the widths of the magnetic core vias 154A and 154B and magnetic cantilever core section 212. Increasing the widths increases the cross-sectional areas of the magnetic core vias 154A and 154B and magnetic cantilever core section 212.

Figure 22A:
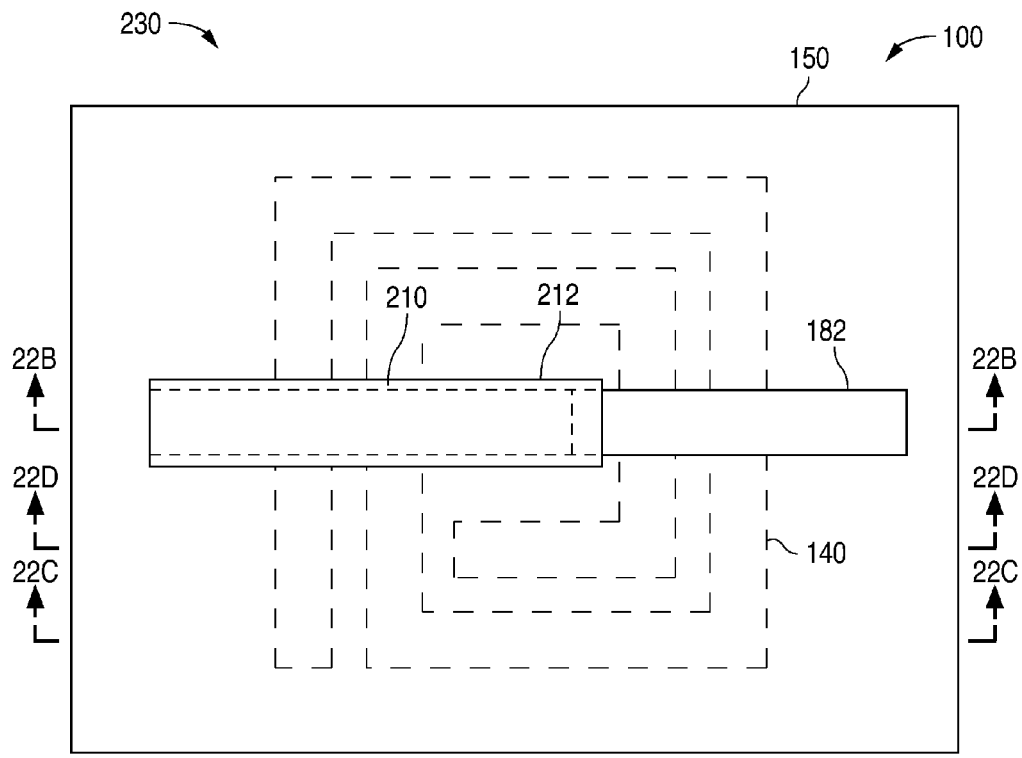
Figure 22B:
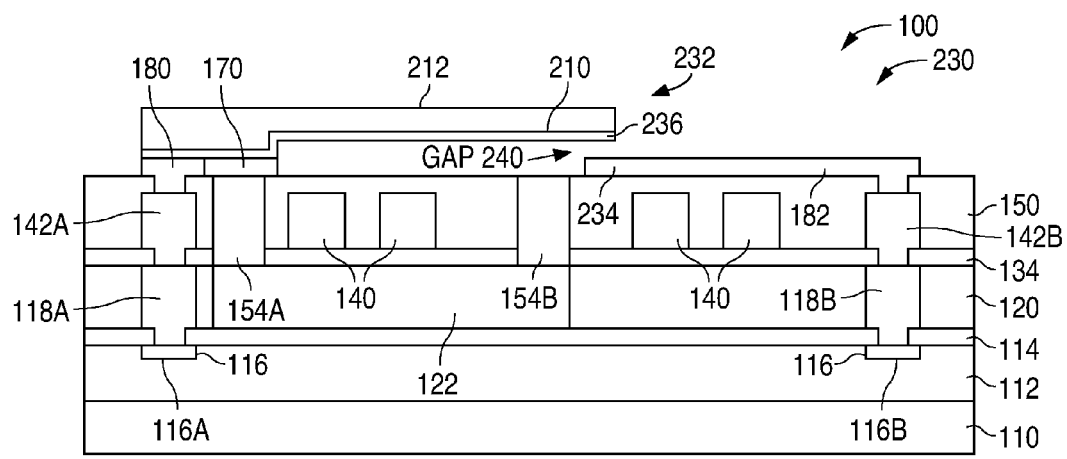
Figure 22C:
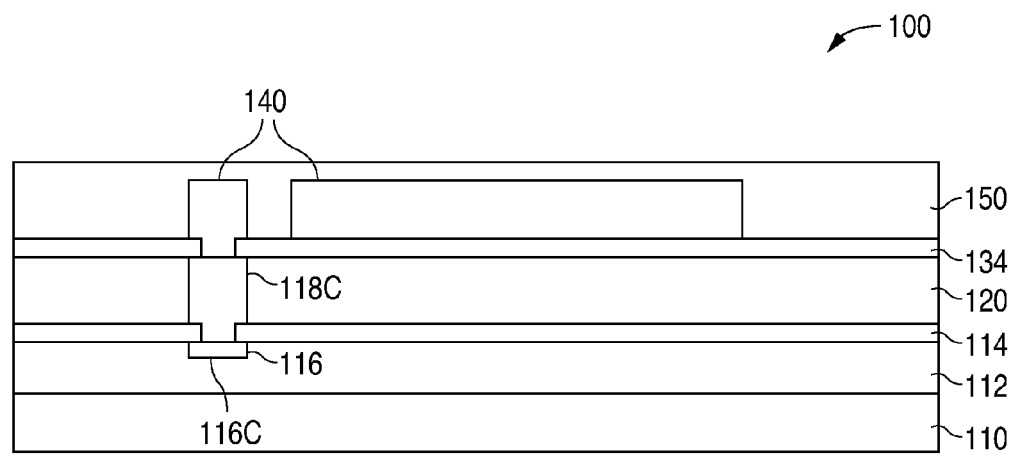
Figure 22D:
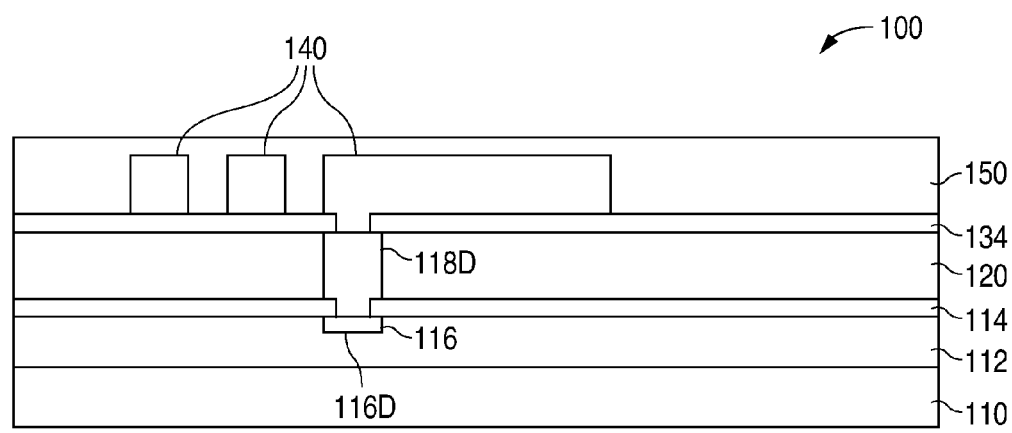
Figure 23:
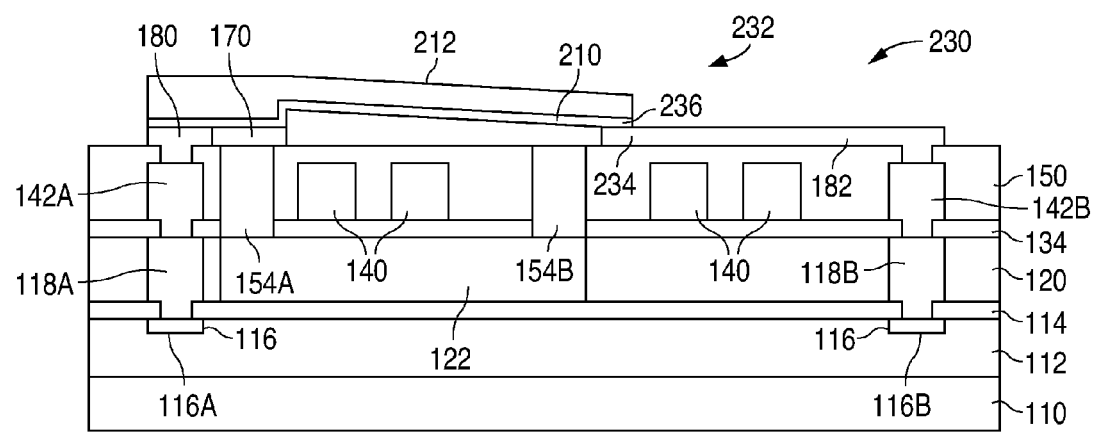
FIG. 23 is a cross-sectional view taken along line 22B-22B of FIG. 22A illustrating MEMS relay 230 in the closed position in accordance with the present invention.
Figure 24:
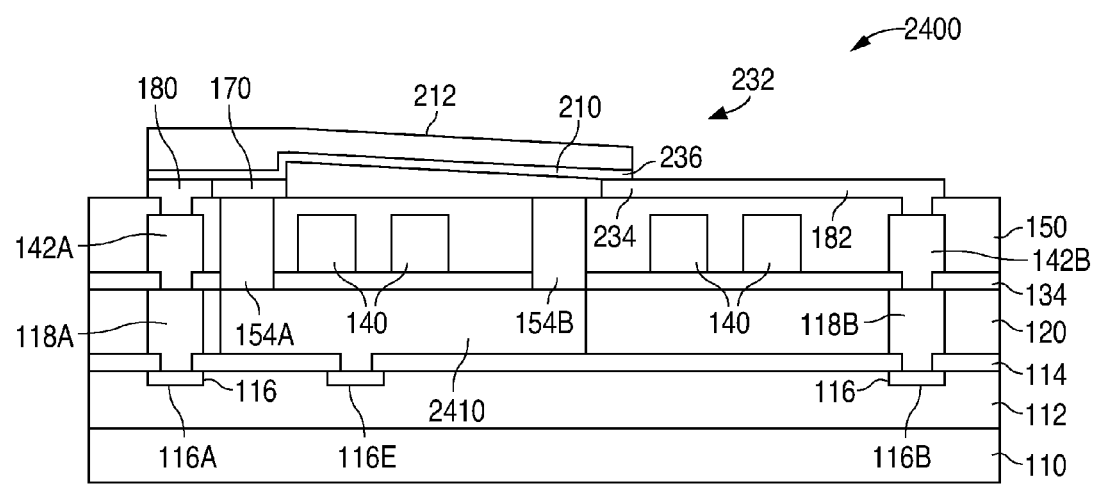
FIG. 24 is a cross-sectional view taken along line 22B-22B of FIG. 22A illustrating an example of a MEMS relay 2400 in accordance with an alternate embodiment of the present invention.

FIG. 24 shows a cross-sectional view taken along line 22B-22B of FIG. 22A that illustrates an example of a MEMS relay 2400 in accordance with an alternate embodiment of the present invention. MEMS relay 2400 is similar to MEMS relay 230 and, as a result, utilizes the same reference numerals to designate the structures which are common to both relays.

As shown in FIG. 24, MEMS relay 2400 differs from MEMS relay 230 in that MEMS relay 2400 utilizes a lower magnetic core section 2410 in lieu of lower magnetic core section 122. Lower magnetic core section 2410 is the same as lower magnetic core section 122 except that lower magnetic core section 2410 also extends through passivation layer 114 to make an electrical connection with a pad 116E, which allows a voltage to be placed on lower magnetic core section 2410 and the magnetic core vias 154A and 154B.

In operation, after switch 232 has closed in response to current flowing through coil 140, a holding voltage with a magnitude that is sufficient to electrostaticly hold switch 232 in the closed position is placed on lower magnetic core section 2410 and the magnetic core vias 154A and 154B by way of pad 116E. (The voltage required to electrostaticly hold switch 232 closed is substantially less than the voltage required to electrostaticly close switch 232.)

After the holding voltage has been applied, the current fed into coil 140 is stopped, utilizing the holding voltage to keep switch 232 closed. One of the advantages of the present embodiment is that no current is required, and thus no power is consumed, to maintain switch 232 in the closed position. (The holding voltage can also be applied to lower magnetic core section 2410 before current is fed into coil 140 to close switch 232.)

For example, if switch 232 is a ground switch such that ground is placed on the metal traces 182 and 210 when switch 232 is closed, then a positive holding voltage can placed on lower magnetic core section 2410 and the magnetic core vias 154A and 154B by way of pad 116E after switch 232 has been closed. (If the positive holding voltage is less than a power supply voltage, the power supply voltage can be placed on lower magnetic core section 2410 and the magnetic core vias 154A and 154B by way of pad 116E after switch 232 has been closed.) The current fed into coil 140 is then stopped, utilizing the holding voltage to keep switch 232 closed.

Similarly, if switch 232 is a power switch such that a power supply voltage is placed on the metal traces 182 and 210 when switch 232 is closed, then a voltage equal to the power supply voltage less the holding voltage can be placed on lower magnetic core section 2410 and the magnetic core vias 154A and 154B by way of pad 116E after switch 232 has been closed. (If the holding voltage is less than the power supply voltage, ground can be placed on lower magnetic core section 2410 and the magnetic core vias 154A and 154B by way of pad 116E after switch 232 has been closed.) The current fed into coil 140 is then stopped, utilizing the holding voltage to keep switch 232 closed.

If switch 232 is a signal switch such that the voltage placed on the metal traces 182 and 210 varies between ground and the power supply voltage when switch 232 is closed, then a voltage equal to the power supply voltage plus the holding voltage can be placed on lower magnetic core section 2410 and the magnetic core vias 154A and 154B by way of pad 116E after switch 232 has been closed. (Alternately, a voltage equal to ground less the holding voltage can be placed on lower magnetic core section 2410 and the magnetic core vias 154A and 154B by way of pad 116E after switch 232 has been closed.) The current fed into coil 140 is then stopped, utilizing the holding voltage to keep switch 232 closed.

Figure 25:
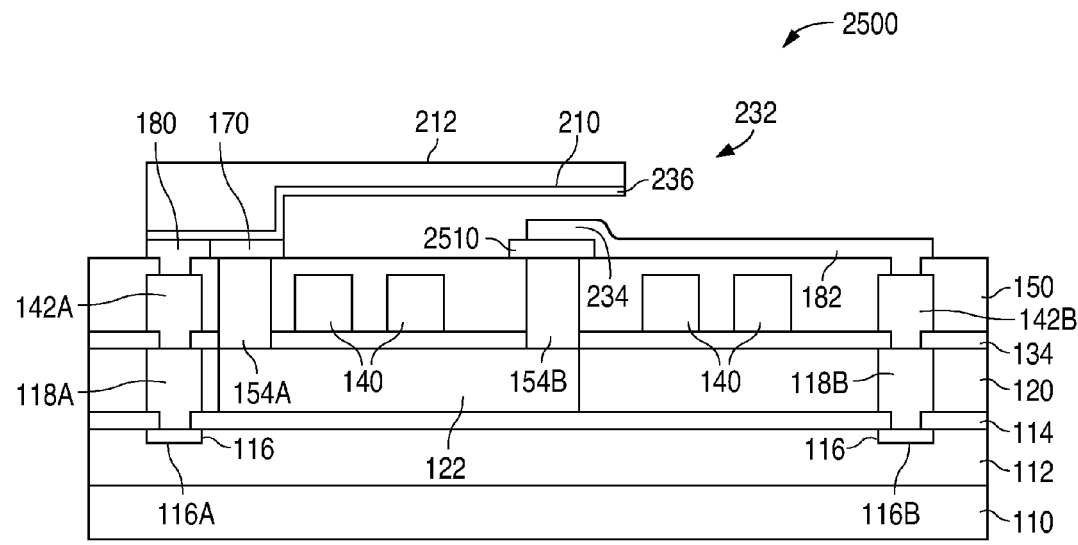
FIG. 25 is a cross-sectional view taken along line 22B-22B of FIG. 22A illustrating an example of a MEMS relay 2500 in accordance with an alternate embodiment of the present invention.

FIG. 25 shows a cross-sectional view taken along line 22B-22B of FIG. 22A that illustrates an example of a MEMS relay 2500 in accordance with an alternate embodiment of the present invention. MEMS relay 2500 is similar to MEMS relay 230 and, as a result, utilizes the same reference numerals to designate the structures which are common to both relays.

As shown in FIG. 25, MEMS relay 2500 differs from MEMS relay 230 in that MEMS relay 2500 includes a non-conductive member 2510 that is formed on non-conductive layer 150 and magnetic core via 154B to cover magnetic core via 154B. In addition, metal trace 182 is formed to lie over non-conductive member 2510. In this embodiment, non-conductive member 2510 is formed at the same time that non-conductive member 170 is formed by modifying patterned photoresist layer 174 shown in FIGS. 14A-14D. MEMS relay 2500 illustrates that contact region 234 can lie directly vertically over magnetic core via 154B.

Figure 26:
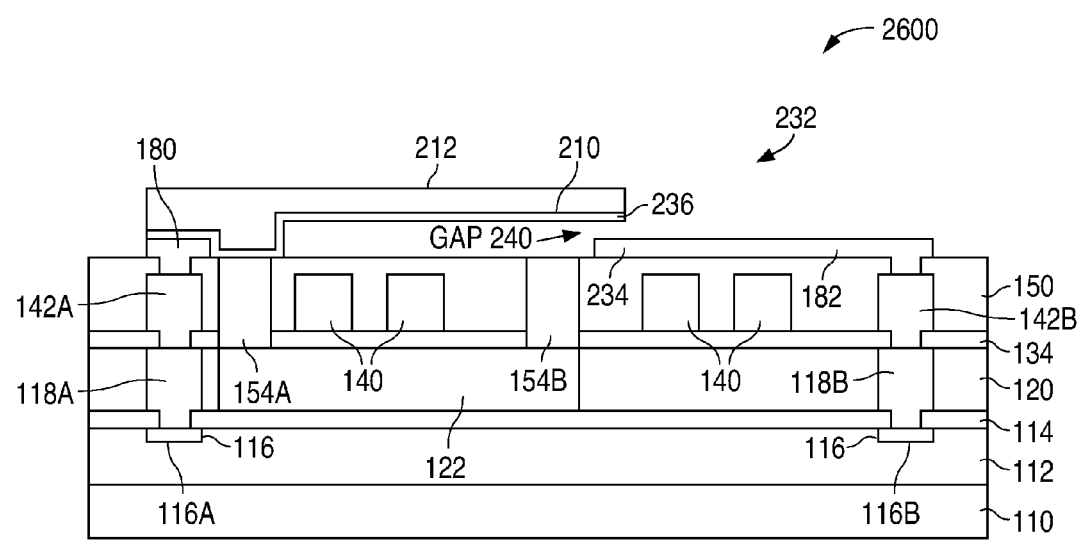
FIG. 26 is a cross-sectional view taken along line 22B-22B of FIG. 22A illustrating an example of a MEMS relay 2600 in accordance with an alternate embodiment of the present invention.

FIG. 26 shows a cross-sectional view taken along line 22B-22B of FIG. 22A that illustrates an example of a MEMS relay 2600 in accordance with an alternate embodiment of the present invention. MEMS relay 2600 is similar to MEMS relay 230 and, as a result, utilizes the same reference numerals to designate the structures which are common to both relays.

As shown in FIG. 26, MEMS relay 2600 differs from MEMS relay 230 in that the upper structure of MEMS relay 2600 does not include non-conductive member 170. In this embodiment, MEMS relay 2600 is formed by omitting the fabrication of non-conductive member 170 discussed in FIGS. 13A-13D and FIGS. 14A-14D.

The removal of non-conductive member 170 electrically connects metal trace 210 to the core structure which, in turn, prevents a holding voltage from being applied to lower magnetic core section 122 to maintain switch 232 in the closed position. Thus, when switch 232 does not need to be electrostatically held in the closed position, a number of steps can be omitted from the fabrication sequence by skipping the formation of non-conductive member 170.

Figure 27A:
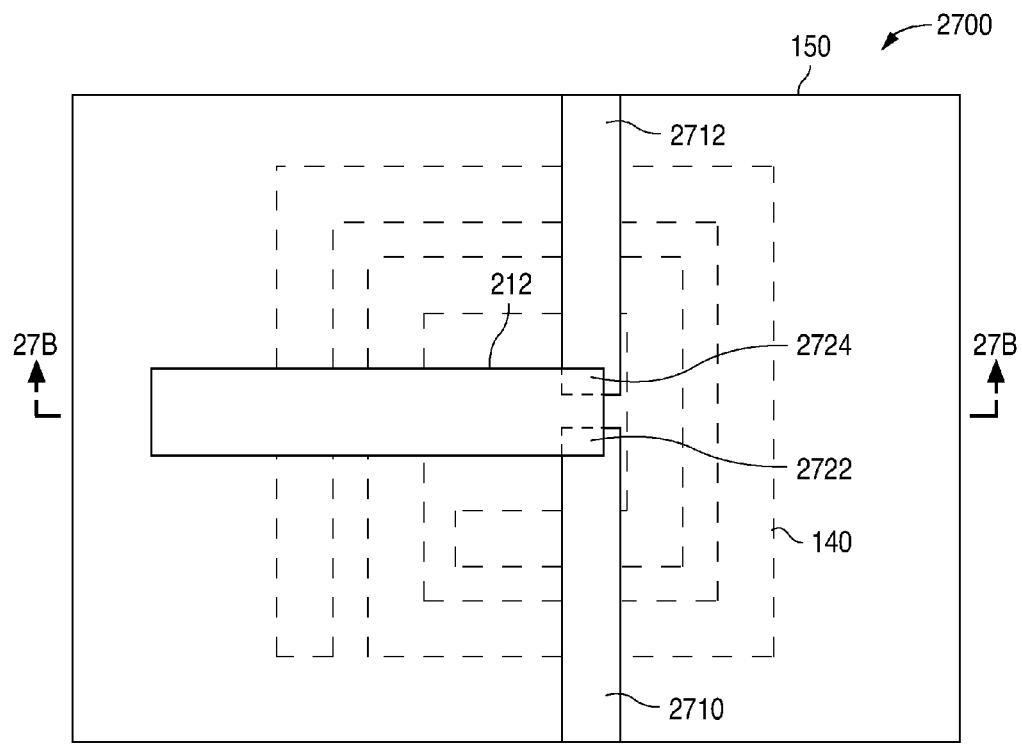
FIGS. 27A-27B are views illustrating an example of a MEMS relay 2700 in accordance with an alternate embodiment of the present invention.
Figure 27B:
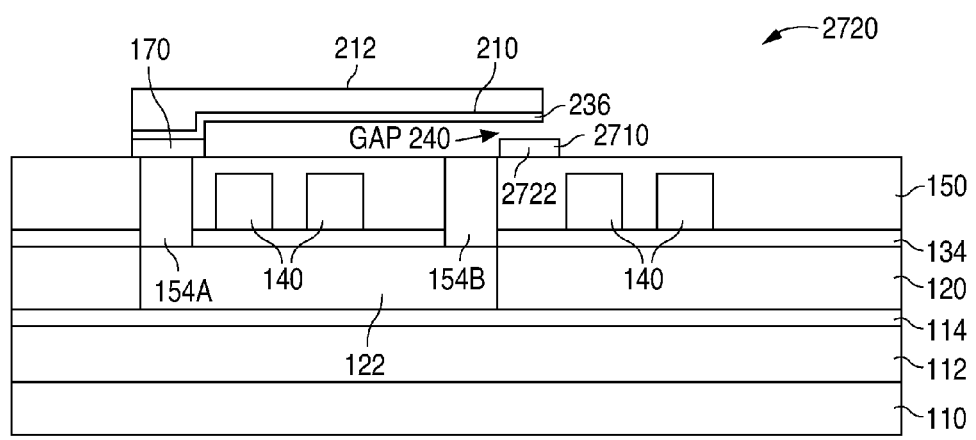

FIGS. 27A-27B show views that illustrate an example of a MEMS relay 2700 in accordance with an alternate embodiment of the present invention. FIG. 27A shows a plan view, while FIG. 27B shows a cross-sectional view taken along line 27B-27B of FIG. 27A. MEMS relay 2700 is similar to MEMS relay 230 and, as a result, utilizes the same reference numerals to designate the structures which are common to both relays.

As shown in FIGS. 27A-27B, MEMS relay 2700 differs from MEMS relay 230 in that MEMS relay 2700 includes a pair of metal traces 2710 and 2712 in lieu of metal trace 182. Further, metal trace 210 is no longer connected to switch pad 116A by way of switch plug 142A and switch metal plug 118A.

Instead, metal trace 2710 is electrically connected to a switch pad like switch pad 116A by way of a switch plug and a switch metal plug that are formed in the same manner that switch plug 142A and switch metal plug 118A are formed. Similarly, metal trace 2712 is electrically connected to a switch pad like switch pad 116B by way of a switch plug and a switch metal plug that are formed in the same manner that switch plug 142B and switch metal plug 118B are formed. The metal traces 2710 and 2712 can be formed at the same time and in the same manner as metal trace 182.

Thus, MEMS relay 2700 includes a switch 2720, which has a contact region 2722 at the end of metal trace 2710, a contact region 2724 at the end of metal trace 2712, and contact region 236 at the end of metal trace 210 that opposes the contact regions 2722 and 2724.

In operation, contact region 236 is movable between a first position and a second position. Switch 2720 is open when no current flows through coil 140. In this condition, contact region 236 is in the first position vertically spaced apart from the contact regions 2722 and 2724 by gap 240. FIGS. 27A-27B show switch 2720 in the open position. Switch 2720 closes when a current flows through coil 140. The current generates a magnetic field that pulls magnetic cantilever core section 212 towards magnetic core via 154B and lower magnetic core section 122 which, in turn, causes contact region 236 to move to the second position and touch the contact regions 2722 and 2724. (Relay 2700 can alternately use a lower magnetic core section like lower magnetic core section 2410 in place of lower magnetic core section 122 to allow the use of an electrostatic holding voltage.)

Figure 28B:
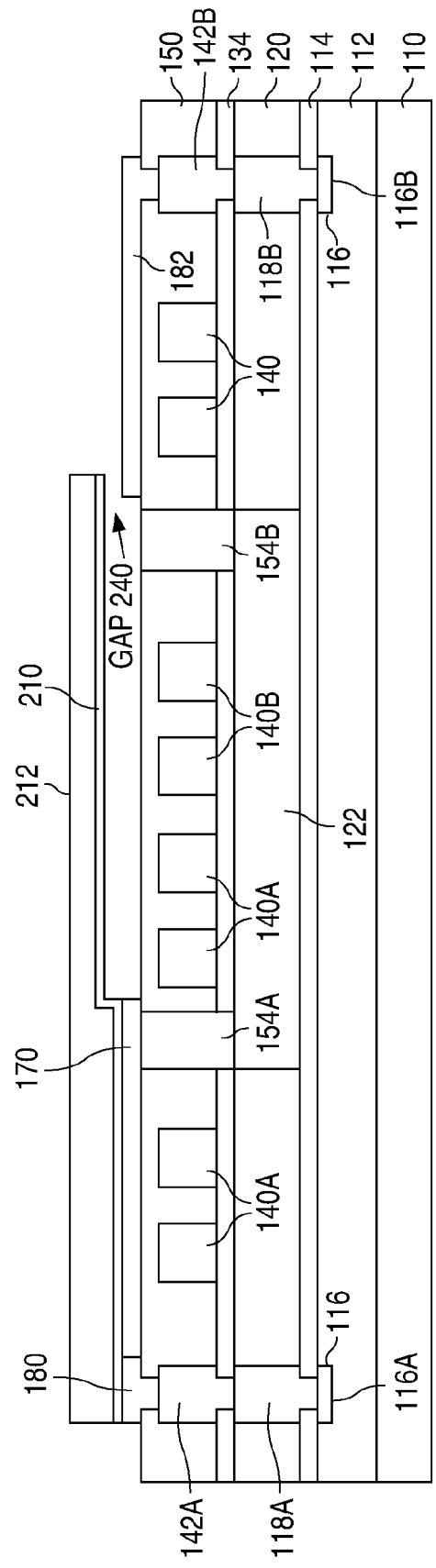

FIGS. 28A-28B show views that illustrate an example of a MEMS relay 2800 in accordance with an alternate embodiment of the present invention. FIG. 28A shows a plan view, while FIG. 28B shows a cross-sectional view taken along line 28B-28B of FIG. 28A. MEMS relay 2800 is similar to MEMS relay 230 and, as a result, utilizes the same reference numerals to designate the structures which are common to both relays.

As shown in FIGS. 28A-28B, MEMS relay 2800 differs from MEMS relay 230 in that MEMS relay 2800 utilizes two coils 140A and 140B in lieu of coil 140. In this embodiment, the coils 140A and 140B are formed at the same time and in the same manner that coil 140 is formed by modifying mold 146 shown in FIGS. 7A-7D and FIGS. 8A-8D.

As a result, each coil 140A and 140B has a continuous series of loops, and a portion of each loop lies directly vertically over the lower magnetic core section 122. Further, the continuous series of loops of coil 140A are wrapped around magnetic core via 154A, while the continuous series of loops of coil 140A are wrapped around magnetic core via 154B.

In operation, coils 140A and 140B effectively increase the number of loops of coil 140 by two loops. Increasing the number of loops of coil 140 by two loops increases the magnetic field created by coil 140, when the same current that was input to coil 140 is input to each coil 140A and 140B. One of the advantages of MEMS relay 2800 is that coils 140A and 140B, which effectively provide two additional loops to coil 140, have a smaller footprint than would be required to add two additional loops to coil 140. Another advantage is that coil 140A and 140B are each shorter in length than coil 140 would be after two additional loops were added. As a result, coil 140A and 140B provide less overall resistance and power consumption.

Figure 29A:
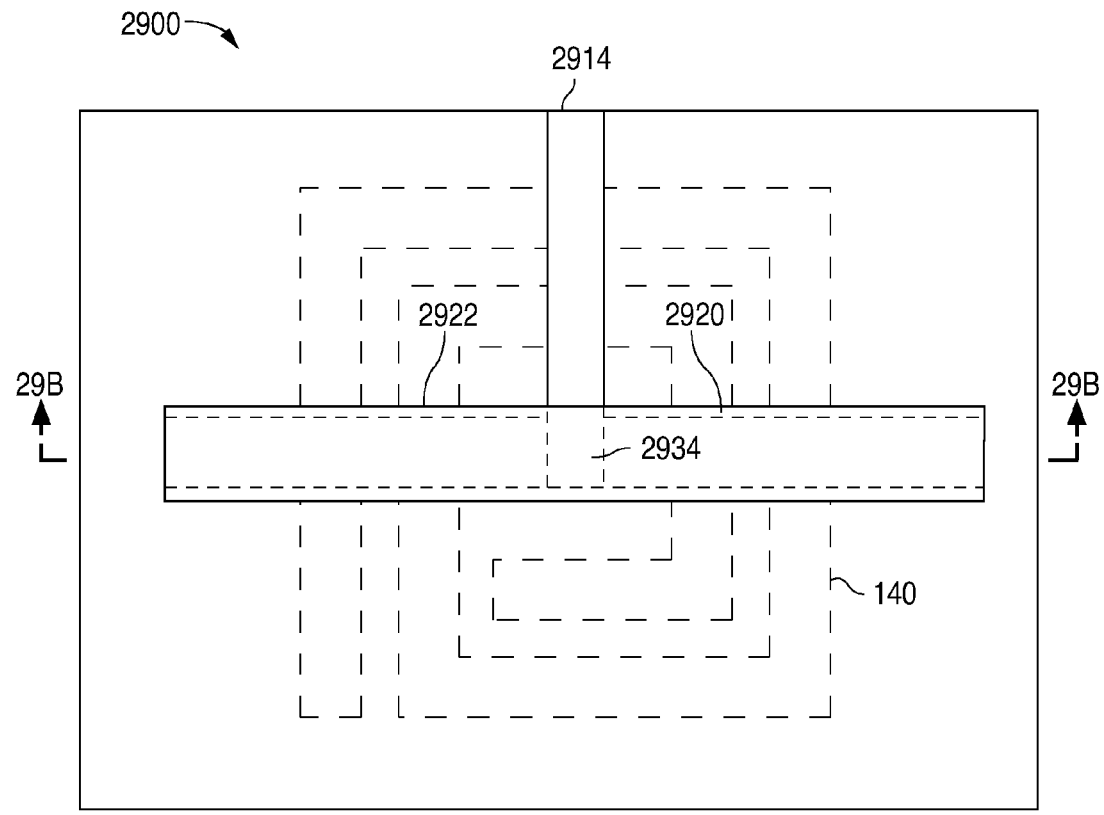
FIGS. 29A-29B are views illustrating an example of a MEMS relay 2900 in accordance with an alternate embodiment of the present invention.
Figure 29B:
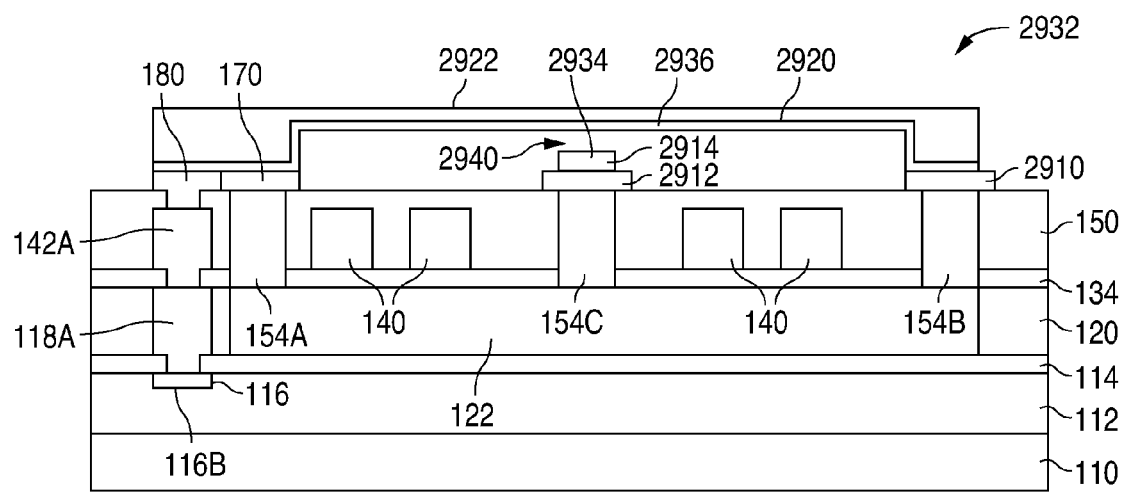

FIGS. 29A-29B show views that illustrate an example of a MEMS relay 2900 in accordance with an alternate embodiment of the present invention. FIG. 29A shows a plan view, while FIG. 29B shows a cross-sectional view taken along line 29B-29B of FIG. 29A. MEMS relay 2900 is similar to MEMS relay 230 and, as a result, utilizes the same reference numerals to designate the structures which are common to both relays.

As shown in FIGS. 29A-29B, MEMS relay 2900 differs from MEMS relay 230 in that MEMS relay 2900 includes a magnetic core via 154C that touches lower magnetic core section 122 and lies midway between and spaced apart from magnetic core vias 154A and 154B so that each loop of coil 140 lies between the magnetic core vias 154A-154C. Magnetic core via 154C is formed at the same time and in the same manner as magnetic core vias 154A and 154B to be substantially the same as magnetic core vias 154A and 154B.

MEMS relay 2900 also includes non-conductive members 2910 and 2912 that touch non-conductive layer 150 and the magnetic core vias 154B and 154C, respectively, to cover the magnetic core vias 154B and 154C. Non-conductive members 2910 and 2912 are spaced apart from each other and from non-conductive member 170, and formed at the same time and in the same manner as non-conductive member 170 to be substantially the same as non-conductive member 170. (A single non-conductive member can alternately be used in place of non-conductive members 170, 2910, and 2912.)

As further shown in FIGS. 29A-29B, MEMS relay 2900 differs from MEMS relay 230 in that MEMS relay 2900 includes a metal trace 2914 in lieu of metal trace 182. Metal trace 2914 is formed at the same time and in the same manner as metal trace 182 was formed. Further, a first end of metal trace 2914 is electrically connected to a switch pad, like switch pad 116A, by way of switch plugs and switch metal plugs that are formed at the same time and in the same manner that switch plug 142A and switch metal plug 118A are formed.

Further, MEMS relay 2900 has an upper structure that utilizes a metal trace 2920 in lieu of metal trace 210, and a magnetic beam core section 2922 in lieu of cantilever core section 212. Metal trace 2920 is formed at the same time and in the same manner that metal trace 210 was formed, except that sacrificial structure 190 is formed to lie between and touch non-conductive member 170 and non-conductive member 2910, and metal trace 2920 is formed on sacrificial structure 190 to extend from metal plug 180 to the top surface of non-conductive member 2910.

Figure 20A:
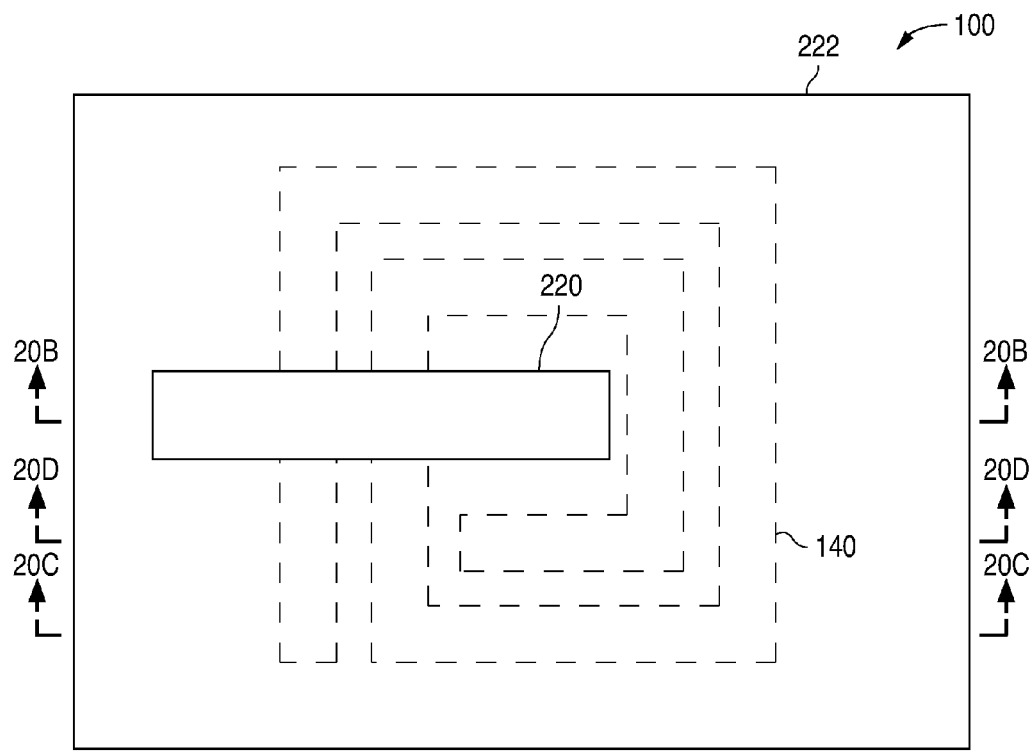
Figure 20B:
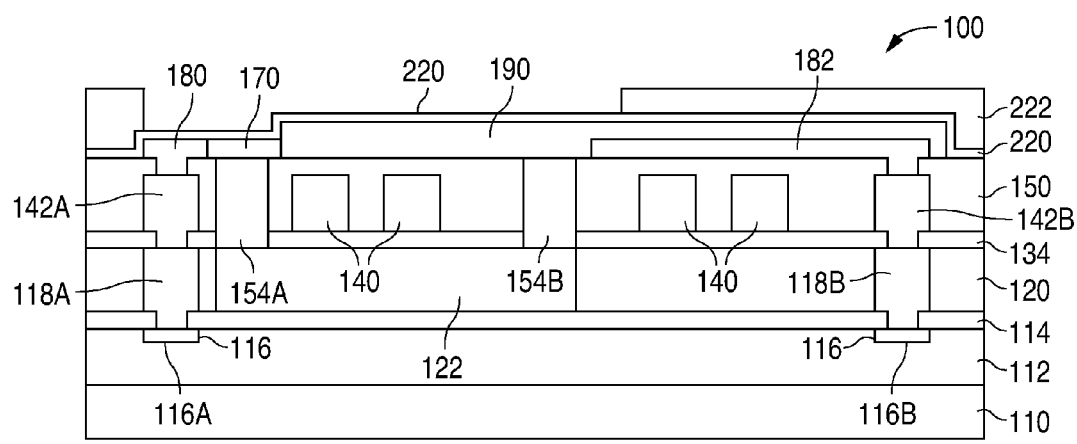
Figure 20C:
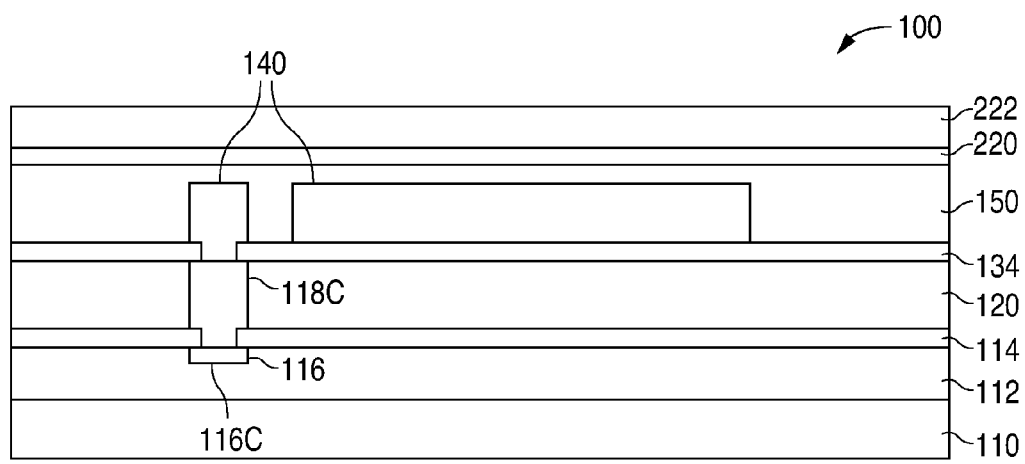
Figure 20D:
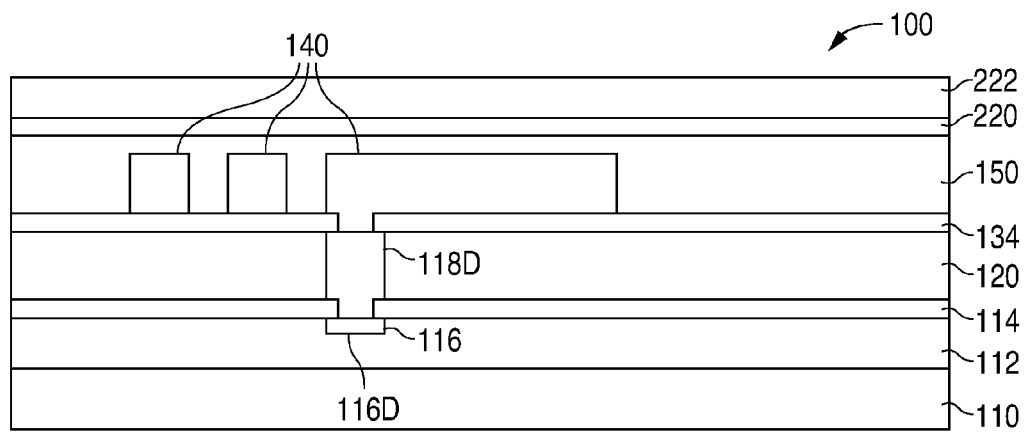
Figure 21A:
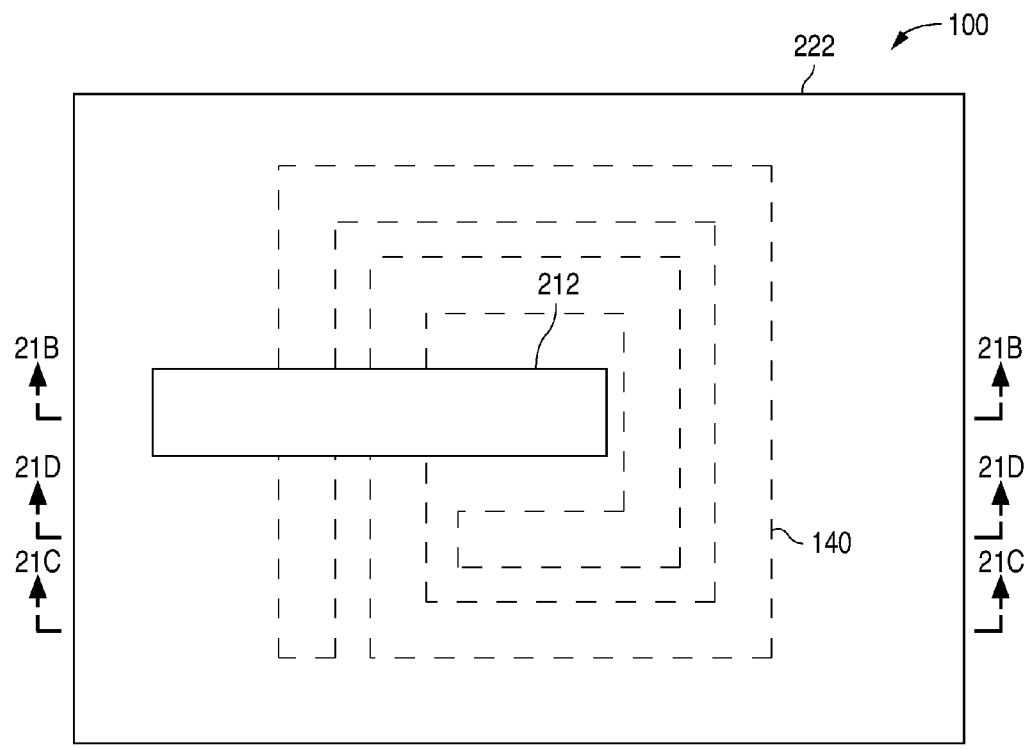
Figure 21B:
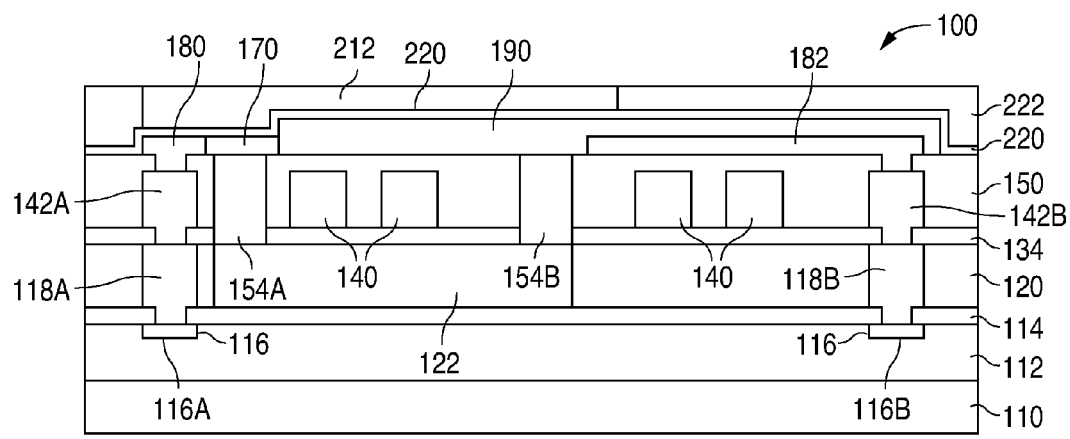
Figure 21C:
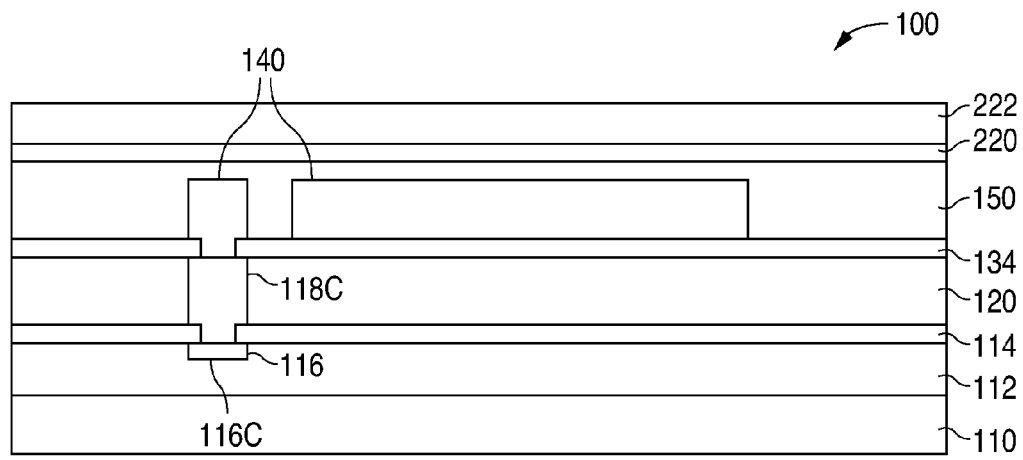
Figure 21D:
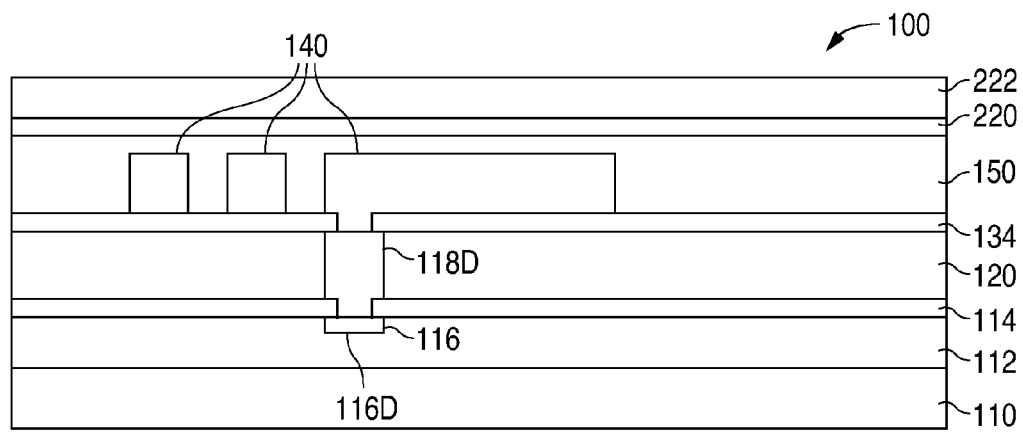

In addition, magnetic beam core section 2922 is formed at the same time and in the same manner that cantilever core section 212 was formed, except that plating mask 222 shown in FIGS. 20A-20B exposes a region of metal trace 2920 that extends from metal plug 180 to a point directly vertically over magnetic core via 154B, extending over magnetic core via 154C. As a result, MEMS relay 2900 includes a switch 2932 that has a contact region 2934 at a second end of metal trace 2914, and a contact region 2936 in the middle region of metal trace 2920 that opposes contact region 2934.

Figure 30:
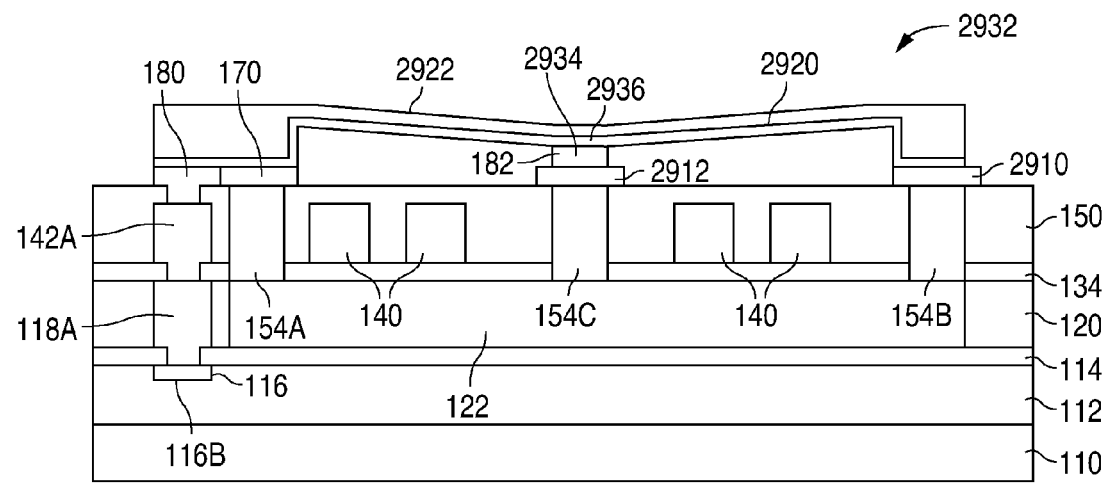
FIG. 30 is a cross-sectional view taken along line 29B-29B of FIG. 29A illustrating MEMS relay 2900 in the closed position in accordance with the present invention.

In operation, contact region 2936 is movable between a first position and a second position. Switch 2932 is open when no current flows through coil 140. In this condition, contact region 2936 is in the first position vertically spaced apart from contact region 2934 by a gap 2940. FIG. 29B shows MEMS relay 2900 in the open position. FIG. 30 shows a cross-sectional view taken along line 29B-29B of FIG. 29A that illustrates MEMS relay 2900 in the closed position in accordance with the present invention.

As shown in FIG. 30, switch 2932 closes when a current flows through coil 140. The current generates a magnetic field that pulls the middle of magnetic beam core section 2922 towards magnetic core via 154C and lower magnetic core section 122 which, in turn, causes contact region 2936 to move to the second position and touch contact region 2934.

One of the advantages of switch 2932 is that the spring force of magnetic beam core structure 2922 is different from the spring force of magnetic cantilever core structure 212. Thus, MEMS relay 2900 illustrates that the spring force of the moving member of the switch (i.e., magnetic cantilever core section 122 and magnetic beam core section 2922) is a function of structure utilized to realize the moving member.

Figure 31:
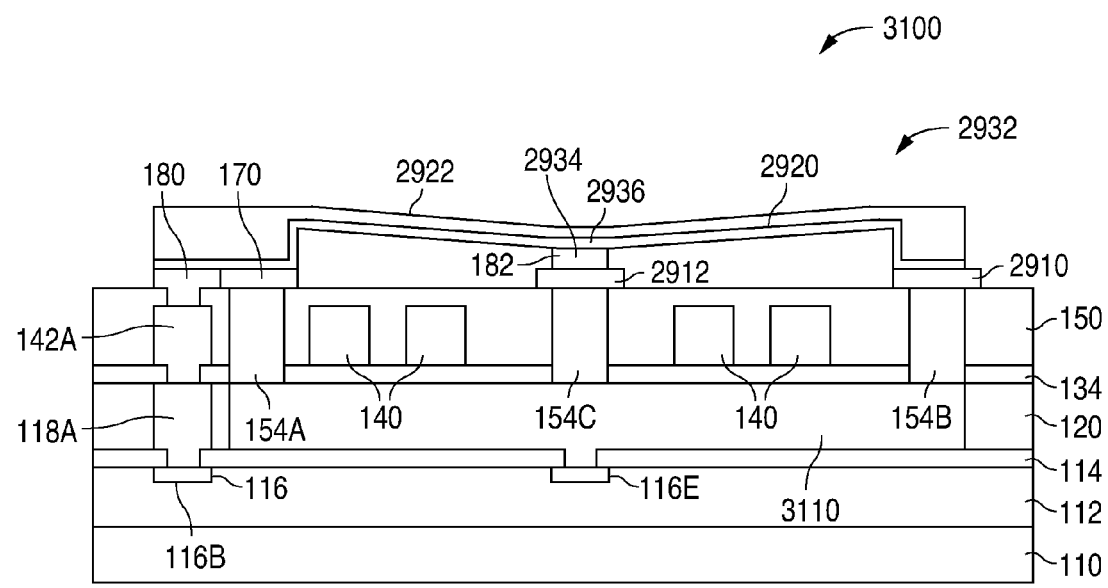
FIG. 31 is a cross-sectional view taken along line 29B-29B of FIG. 29A illustrating an example of a MEMS relay 3100 in accordance with an alternate embodiment of the present invention.

FIG. 31 shows a cross-sectional view taken along line 29B-29B of FIG. 29A that illustrates an example of a MEMS relay 3100 in accordance with an alternate embodiment of the present invention. MEMS relay 3100 is similar to MEMS relay 2900 and, as a result, utilizes the same reference numerals to designate the structures which are common to both relays.

As shown in FIG. 31, MEMS relay 3100 differs from MEMS relay 2900 in that MEMS relay 3100 utilizes a lower magnetic core section 3110 in lieu of lower magnetic core section 122. Lower magnetic core section 3110 is the same as lower magnetic core section 122 except that lower magnetic core section 3110 also extends through passivation layer 114 to make an electrical connection with a pad 116E, which allows a voltage to be placed on lower magnetic core section 3110 and the magnetic core vias 154A-154C.

MEMS relay 3100 operates the same as MEMS relay 2900, except that lower magnetic core section 3110 allows a holding voltage to be placed on lower magnetic core section 3110 in the same manner that lower magnetic core section 2410 allows a holding voltage to be placed on lower magnetic core section 2410. As a result, MEMS relay 3100 can be operated with a holding voltage in the same manner that MEMS relay 2400 in FIG. 24 can be operated with a holding voltage.

Figure 32A:
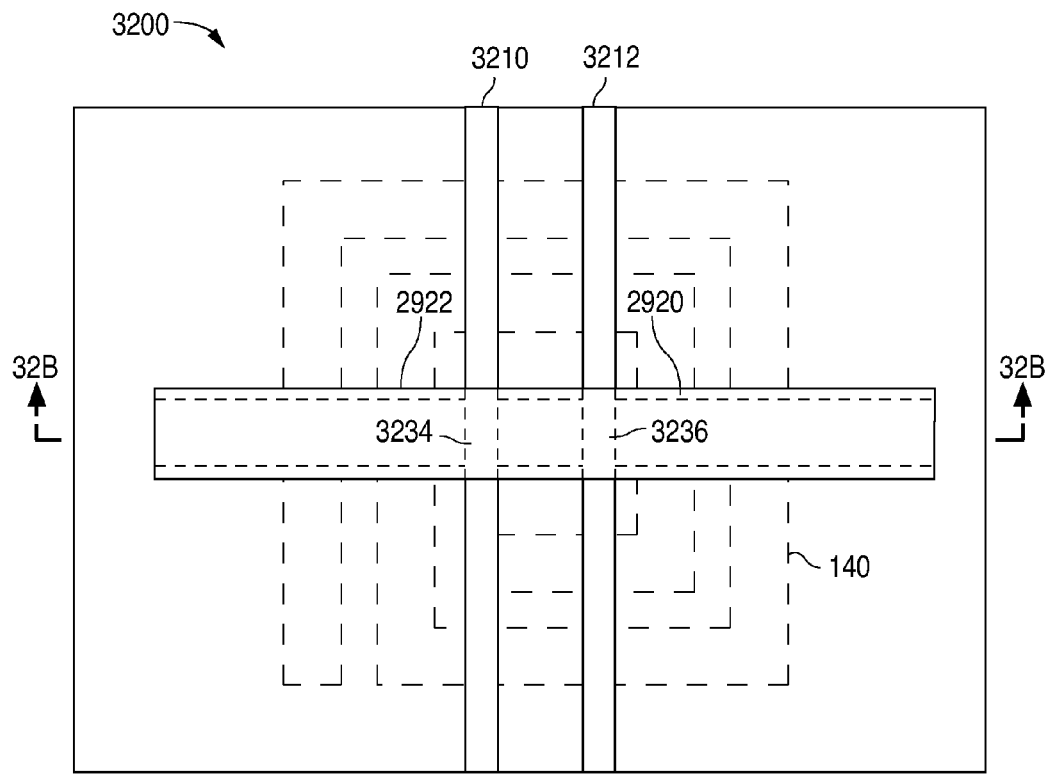
FIGS. 32A-32C are views illustrating an example of a MEMS relay 3200 in accordance with an alternate embodiment of the present invention.
Figure 32B:
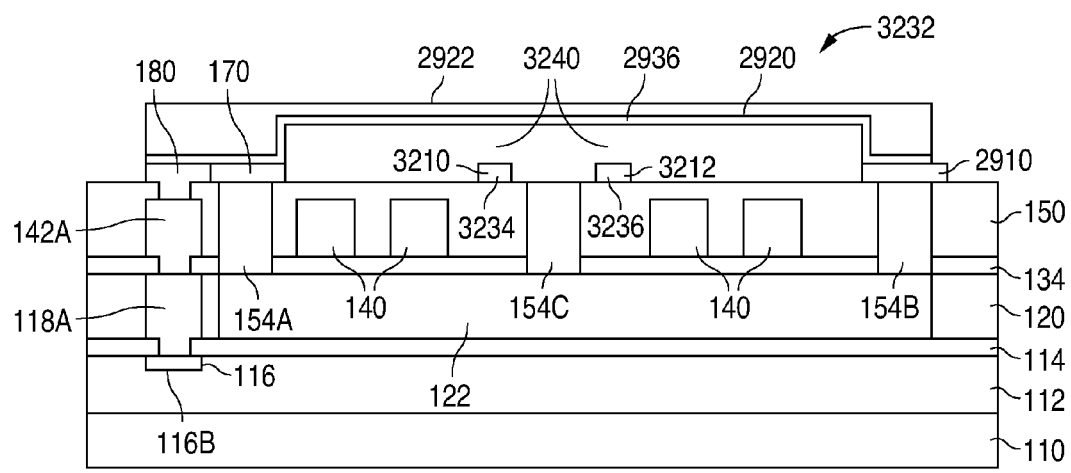
Figure 32C:
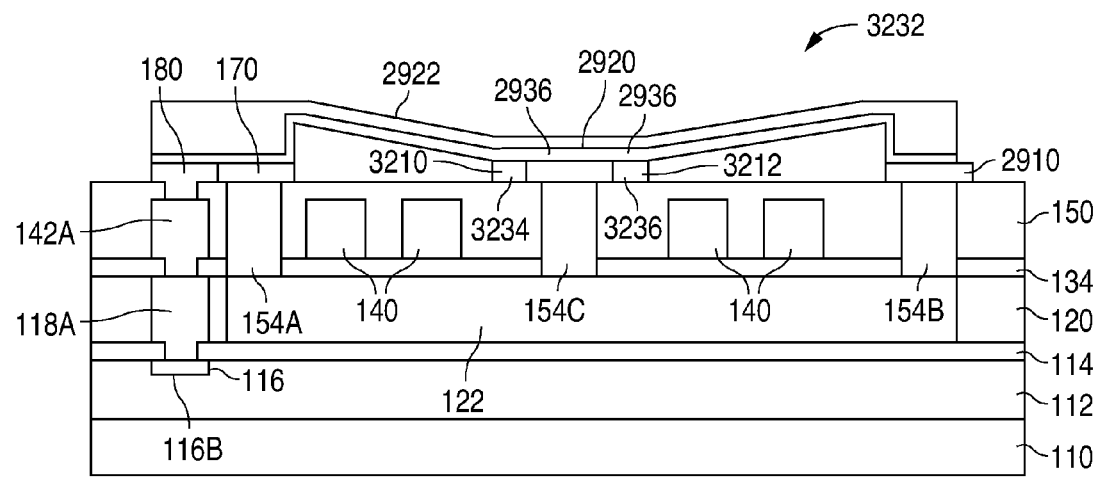

FIGS. 32A-32C show views that illustrate an example of a MEMS relay 3200 in accordance with an alternate embodiment of the present invention. FIG. 32A shows a plan view, while FIGS. 32B and 32C show a cross-sectional view taken along line 32B-32B of FIG. 32A. MEMS relay 3200 is similar to MEMS relay 2900 and, as a result, utilizes the same reference numerals to designate the structures which are common to both relays.

As shown in FIGS. 32A-32B, MEMS relay 3200 differs from MEMS relay 2900 in that MEMS relay 3200 includes a pair of metal traces 3210 and 3212 in lieu of metal trace 2914. The metal traces 3210 and 3212 are formed at the same time and in the same manner as metal trace 2914 was formed. In addition, non-conductive member 2912 is also omitted.

Further, both ends of metal trace 3210 are electrically connected to switch pads, each like switch pad 116A, by way of switch plugs and switch metal plugs that are formed at the same time in the same manner that switch plug 142A and switch metal plug 118A are formed. Similarly, both ends of metal trace 3212 are electrically connected to switch pads, each like switch pad 116A, by way of switch plugs and switch metal plugs that are formed at the same time and in the same manner that switch plug 142A and switch metal plug 118A are formed.

As a result, MEMS relay 3200 includes a switch 3232 that has a contact region 3234 on metal trace 3210, a contact region 3236 on metal trace 3212, and contact region 2936 in the middle region of metal trace 2920 that lies directly vertically above contact region 3234 and contact region 3236.

In operation, contact region 2936 is movable between a first position and a second position. Switch 3232 is open when no current flows through coil 140. In this condition, contact region 2936 is in the first position vertically spaced apart from contact region 3234 and contact region 3236 by a gap 3240. FIG. 32B shows MEMS relay 3200 in the open position. FIG. 32C shows a cross-sectional view taken along line 32B-32B of FIG. 32A that illustrates MEMS relay 3200 in the closed position in accordance with the present invention.

As shown in FIG. 32C, switch 3232 closes when a current flows through coil 140. The current generates a magnetic field that pulls the middle of magnetic beam core section 2922 towards magnetic core via 154C and lower magnetic core section 122 which, in turn, causes contact region 2936 to move to the second position and touch contact regions 3234 and 3236. (Relay 3200 can alternately use a lower magnetic core section like lower magnetic core section 3110 in place of lower magnetic core section 122 to allow the use of an electrostatic holding voltage.)

Figure 33:
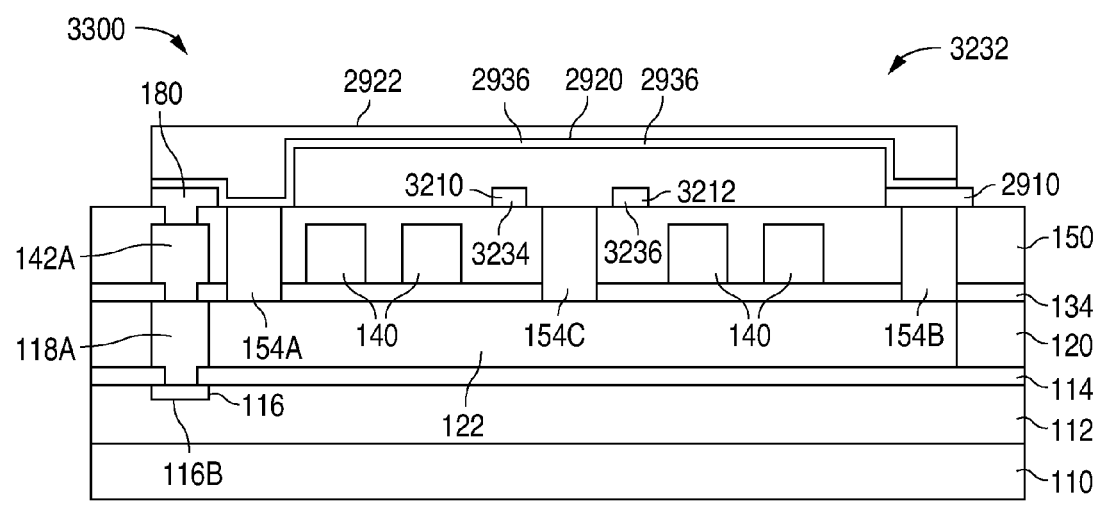
FIG. 33 is a cross-sectional view taken along line 32B-32B of FIG. 32A illustrating an example of a MEMS relay 3300 in accordance with an alternate embodiment of the present invention.

FIG. 33 shows a cross-sectional view taken along line 32B-32B of FIG. 32A that illustrates an example of a MEMS relay 3300 in accordance with an alternate embodiment of the present invention. MEMS relay 3300 is similar to MEMS relay 3200 and, as a result, utilizes the same reference numerals to designate the structures which are common to both relays.

As shown in FIG. 33, MEMS relay 3300 differs from MEMS relay 3200 in that the upper structure of MEMS relay 3300 does not include non-conductive members 170 and 2910. In this embodiment, MEMS relay 3300 is formed by omitting the fabrication of non-conductive members 170 and 2910. The removal of non-conductive members 170 and 2910 electrically connects metal trace 2910 to the core structure which, in turn, prevents a holding voltage from being applied to lower magnetic core section 122 to maintain switch 3232 in the closed position. Thus, when switch 3232 does not need to be electrostatically held in the closed position, a number of steps can be omitted from the fabrication sequence by skipping the formation of the non-conductive members 170 and 2910.

Figure 34A:
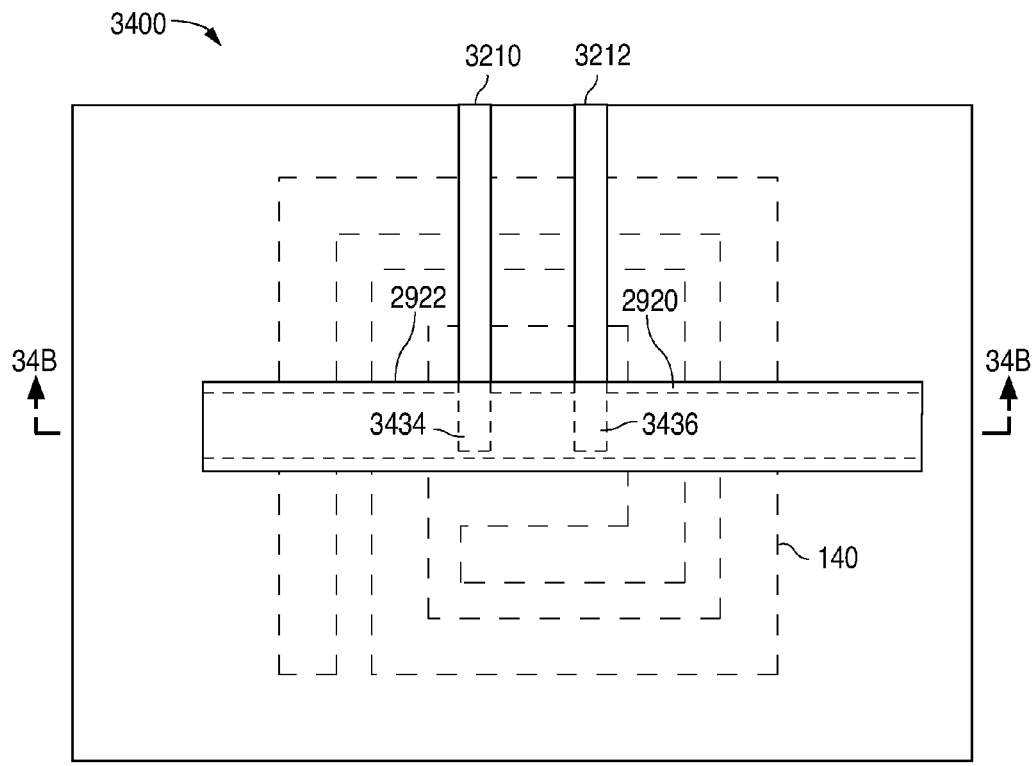
FIGS. 34A-34C are views illustrating an example of a MEMS relay 3400 in accordance with an alternate embodiment of the present invention.
Figure 34B:
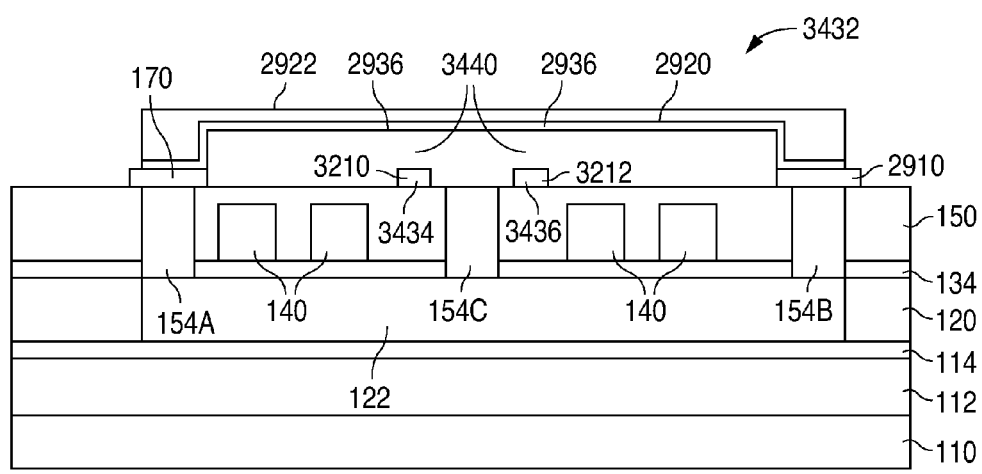
Figure 34C:
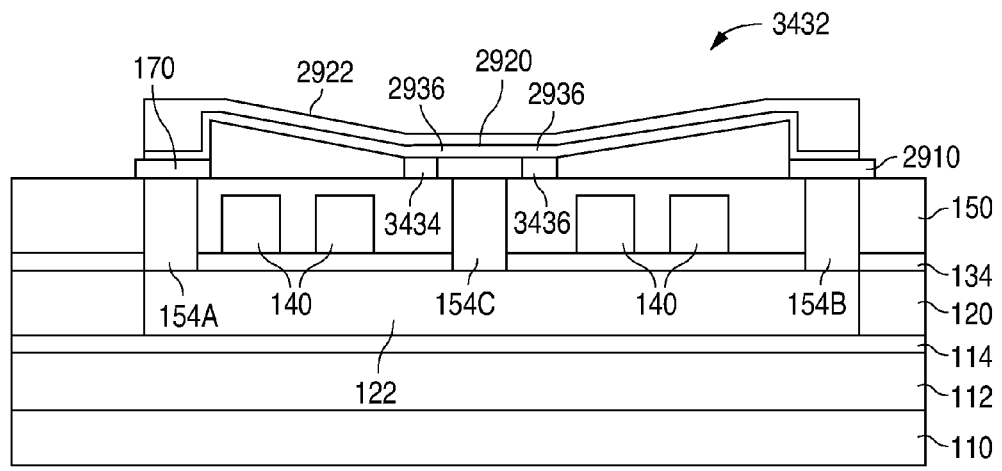

FIGS. 34A-34C show views that illustrate an example of a MEMS relay 3400 in accordance with an alternate embodiment of the present invention. FIG. 34A shows a plan view, while FIGS. 34B-34C show a cross-sectional view taken along line 34B-34B of FIG. 34A. MEMS relay 3400 is similar to MEMS relay 3200 and, as a result, utilizes the same reference numerals to designate the structures which are common to both relays.

As shown in FIGS. 34A-34B, MEMS relay 3400 differs from MEMS relay 3200 in that the metal traces 3210 and 3212 each have a first end that lies directly vertically below the middle region of magnetic beam core section 2922. Further, only a second end of metal trace 3210 is electrically connected to a switch pad, like switch pad 116A, by way of switch plugs and switch metal plugs that are formed in the same manner that switch plug 142A and switch metal plug 118A are formed. Similarly, only a second end of metal trace 3212 is electrically connected to a switch pad, like switch pad 116A, by way of switch plugs and switch metal plugs that are formed in the same manner that switch plug 142A and switch metal plug 118A are formed.

As a result, MEMS relay 3400 includes a switch 3432 that has a contact region 3434 at the end of metal trace 3210, a contact region 3436 at the end of metal trace 3212, and contact region 2936 in the middle region of metal trace 2920 that opposes contact region 3434 and contact region 3436.

In operation, contact region 3434 is movable between a first position and a second position. Switch 3432 is open when no current flows through coil 140. In this condition, metal trace 2920 is electrically isolated from all other conductive structures, and contact region 2936 is in the first position vertically spaced apart from contact region 3434 and contact region 3436 by a gap 3440. FIG. 34B shows MEMS relay 3400 in the open position. FIG. 34C shows a cross-sectional view taken along line 34B-34B of FIG. 34A that illustrates MEMS relay 3400 in the closed position in accordance with the present invention.

As shown in FIG. 34C, switch 3432 closes when a current flows through coil 140. The current generates a magnetic field that pulls the middle of magnetic beam core section 2922 towards magnetic core via 154C and lower magnetic core section 122 which, in turn, causes contact region 2936 to move to the second position and touch contact regions 3434 and 3436. (Relay 3400 can alternately use a lower magnetic core section like lower magnetic core section 3110 in place of lower magnetic core section 122 to allow the use of an electrostatic holding voltage.)

Figure 35:
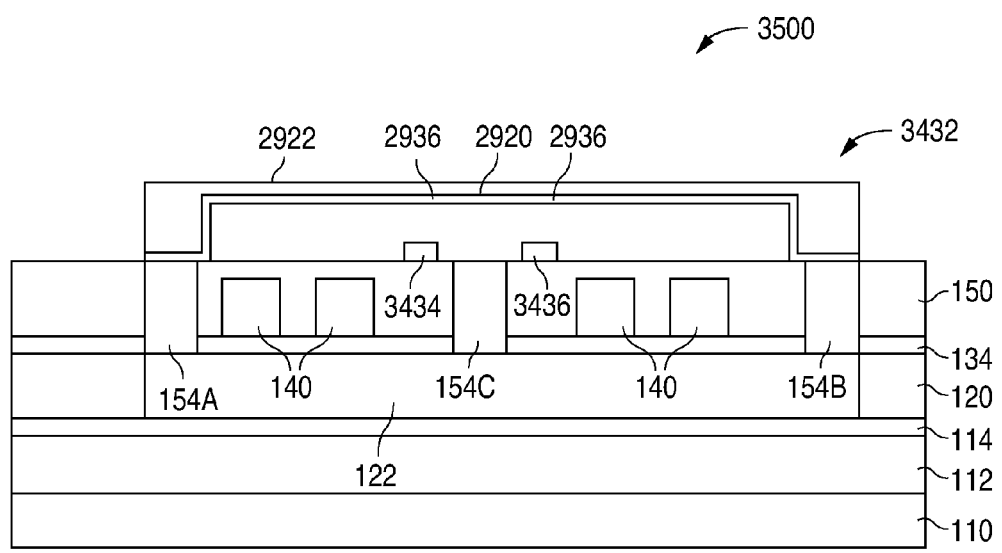
FIG. 35 is a cross-sectional view taken along line 34B-34B of FIG. 34A illustrating an example of a MEMS relay 3500 in accordance with an alternate embodiment of the present invention.

FIG. 35 shows a cross-sectional view taken along line 34B-34B of FIG. 34A that illustrates an example of a MEMS relay 3500 in accordance with an alternate embodiment of the present invention. MEMS relay 3500 is similar to MEMS relay 3400 and, as a result, utilizes the same reference numerals to designate the structures which are common to both relays.

As shown in FIG. 35, MEMS relay 3500 differs from MEMS relay 3400 in that the upper structure of MEMS relay 3500 does not include non-conductive members 170 and 2910. In this embodiment, MEMS relay 3500 is formed by omitting the fabrication of non-conductive members 170 and 2910.

The removal of non-conductive members 170 and 2910 electrically connects metal trace 2920 to the core structure which, in turn, prevents a holding voltage from being applied to lower magnetic core section 122 to maintain switch 3432 in the closed position. Thus, when switch 3432 does not need to be electrostatically held in the closed position, a number of steps can be omitted from the fabrication sequence by skipping the formation of non-conductive members 170 and 2910.

Figure 36A:
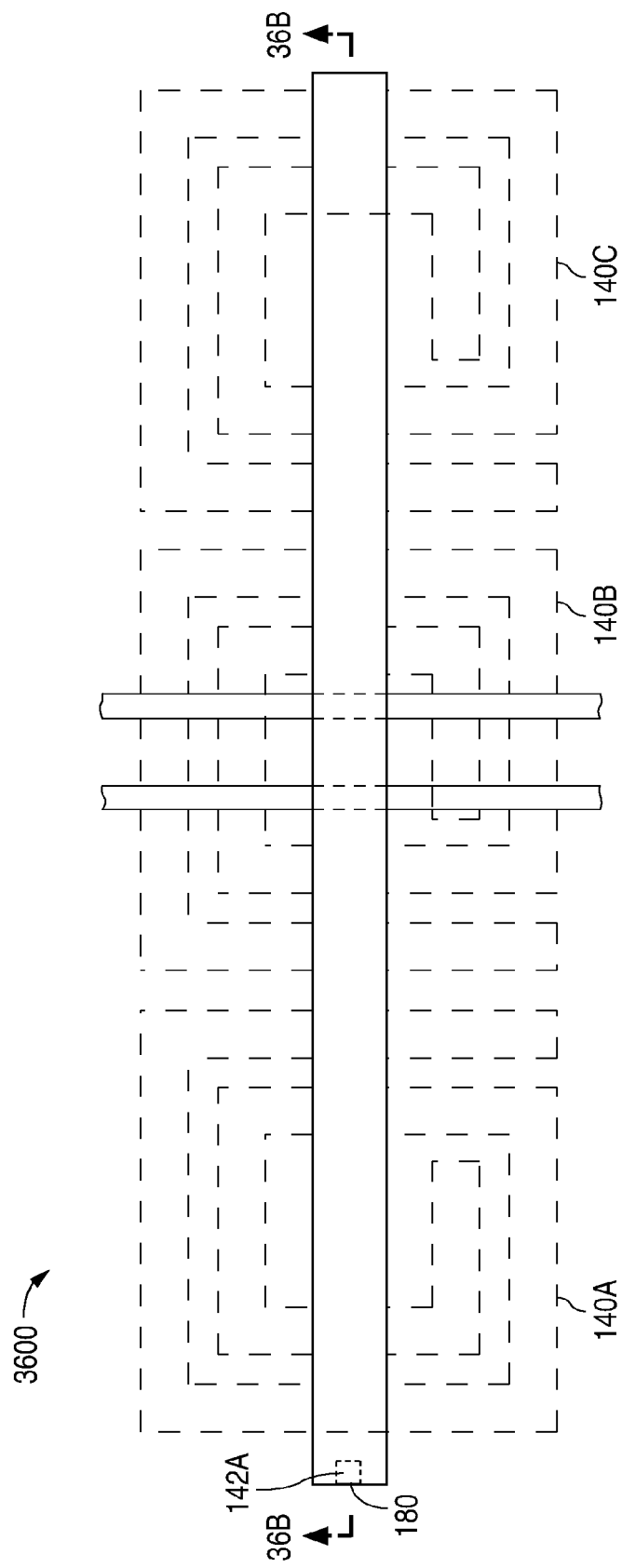
FIGS. 36A-36B are views illustrating an example of a MEMS relay 3600 in accordance with an alternate embodiment of the present invention.
Figure 36B:
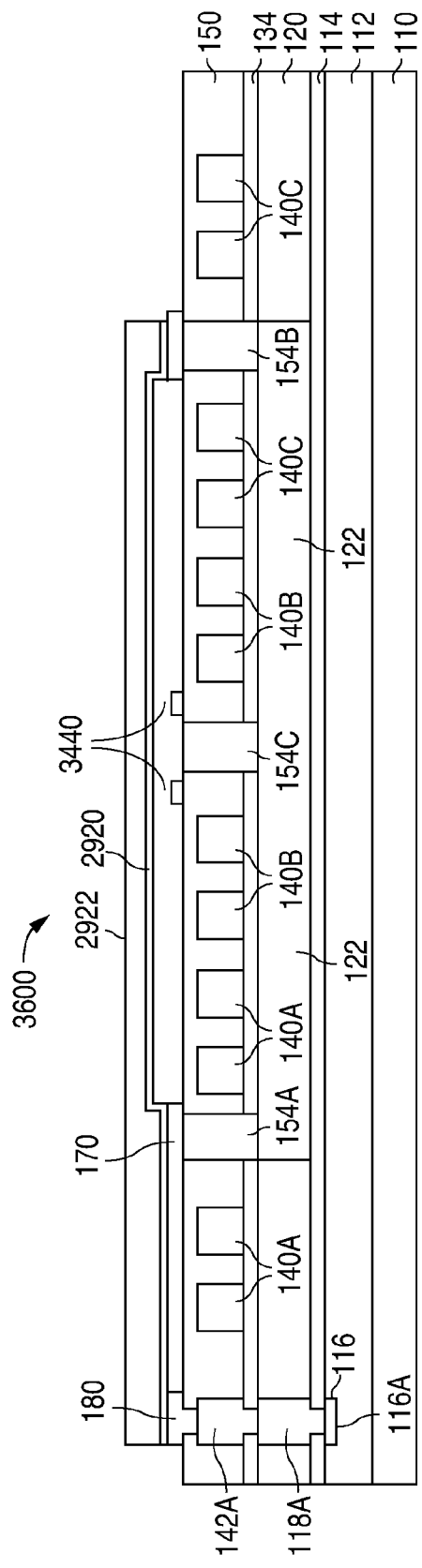

FIGS. 36A-36B show views that illustrate an example of a MEMS relay 3600 in accordance with an alternate embodiment of the present invention. FIG. 36A shows a plan view, while FIG. 36B shows a cross-sectional view taken along line 36B-36B of FIG. 36A. MEMS relay 3600 is similar to MEMS relay 3200 and, as a result, utilizes the same reference numerals to designate the structures which are common to both relays.

As shown in FIGS. 36A-36B, MEMS relay 3600 differs from MEMS relay 3200 in that MEMS relay 3600 utilizes three coils 140A, 140B, and 140C in lieu of coil 140. In this embodiment, the coils 140A-140C are formed at the same time and in the same manner that coil 140 is formed by modifying mold 146 shown in FIGS. 7A-7D and FIGS. 8A-8D.

As a result, each coil 140A, 140B, and 140C has a continuous series of loops, and a portion of each loop lies directly vertically over the lower magnetic core section 122. Further, the continuous series of loops of coil 140A are wrapped around magnetic core via 154A, while the continuous series of loops of coil 140C are wrapped around magnetic core via 154B and the continuous series of loops of coil 140B are wrapped around magnetic core via 154C.

In operation, coils 140A-140C effectively increase the number of loops of coil 140 by two loops. Increasing the number of loops of coil 140 by two loops increases the magnetic field created by coil 140, when the same current that was input to coil 140 is input to each coil 140A-140C. One of the advantages of MEMS relay 3600 is that coils 140A-140C, which effectively provide two additional loops to coil 140, consume less silicon real estate than would be required to add two additional loops to coil 140. Another advantage is that coils 140A-140C are each shorter in length than coil 140 would be after two additional loops were added. As a result, coils 140A-140C provide less overall resistance and power consumption.

Figure 37A:
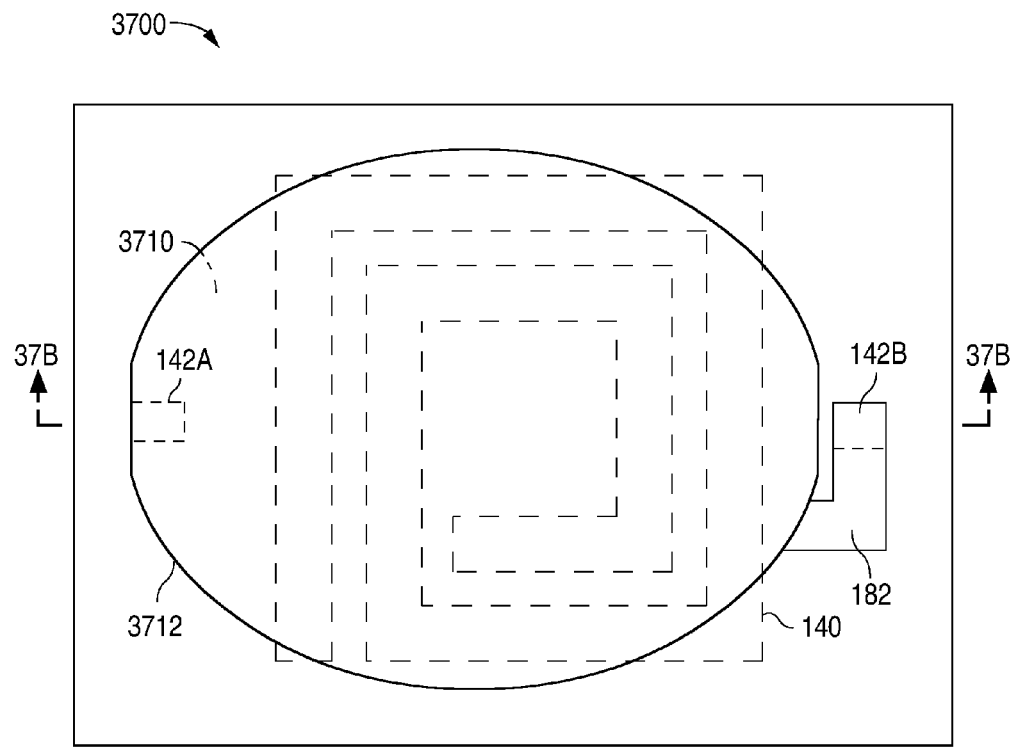
FIGS. 37A-37B are views illustrating an example of a MEMS relay 3700 in accordance with an alternate embodiment of the present invention.
Figure 37B:
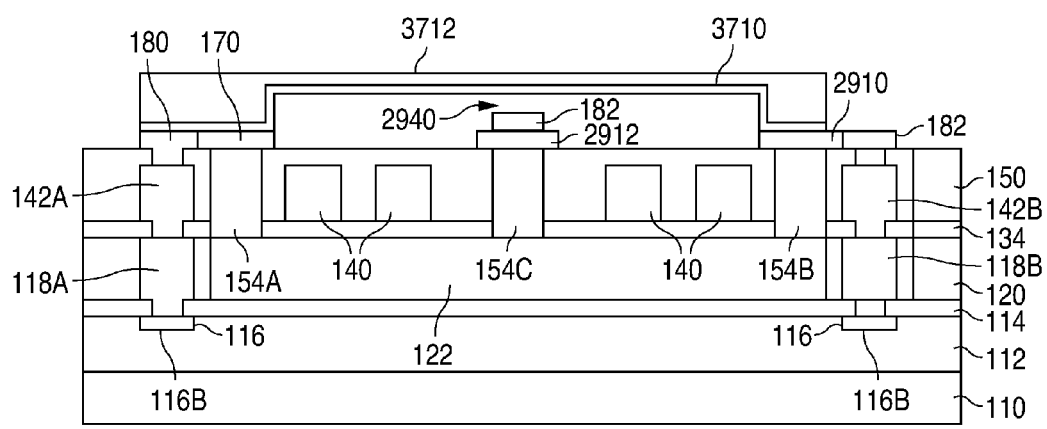

FIGS. 37A-37B show views that illustrate an example of a MEMS relay 3700 in accordance with an alternate embodiment of the present invention. FIG. 37A shows a plan view, while FIG. 37B shows a cross-sectional view taken along line 37B-37B of FIG. 37A. MEMS relay 3700 is similar to MEMS relay 2900 and, as a result, utilizes the same reference numerals to designate the structures which are common to both relays.

As shown in FIGS. 37A-37B, MEMS relay 3700 differs from MEMS relay 2900 in that the upper structure of MEMS relay 3700 utilizes a metal trace 3710 in lieu of metal trace 2920, and a magnetic beam core section 3712 in lieu of magnetic beam core section 2922. Metal trace 3710 is the same as metal trace 2920 except for the shape of metal trace 3710. Similarly, magnetic beam core section 3712 is the same as magnetic beam core section 2922 except for the shape of magnetic beam core section 3712.

One of the advantages of MEMS relay 3700 is that the spring force of magnetic beam core structure 3712 is different from the spring force of magnetic beam core section 2922. Thus, MEMS relay 3700 illustrates that the spring force of the moving member of the switch (i.e., magnetic beam core section 2922 and magnetic beam core section 3712) is a function of structure utilized to realize the moving member.

Figure 38A:
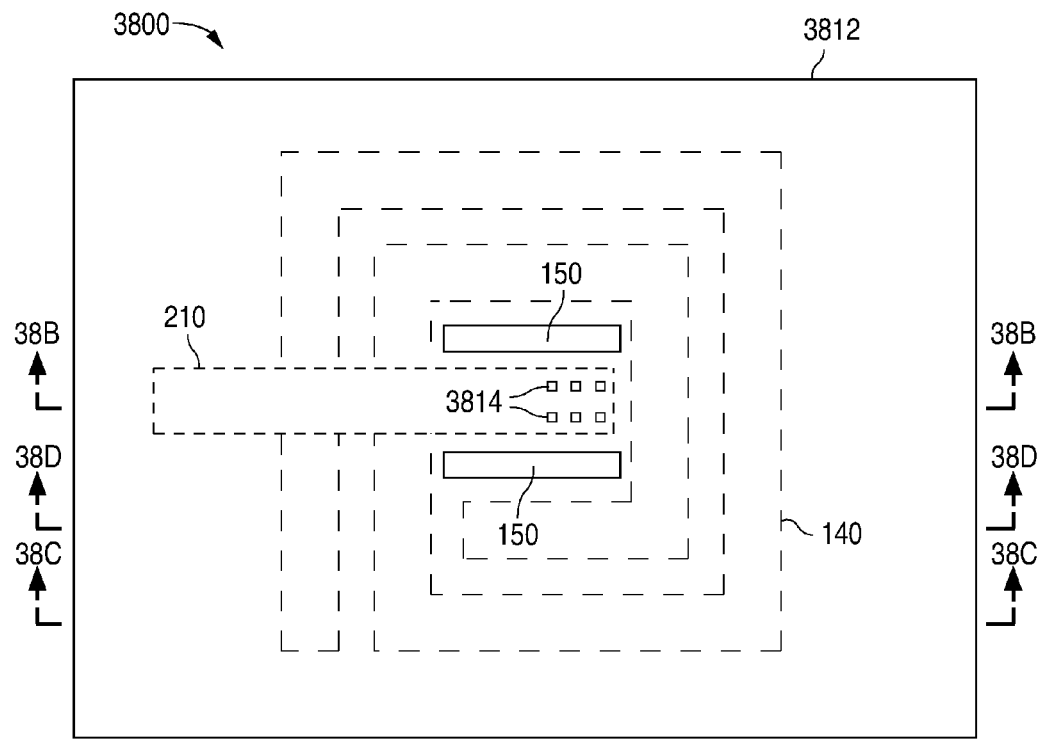
FIGS. 38A-38D are views illustrating an example of a MEMS relay 3800 in accordance with an alternate embodiment of the present invention.
Figure 38B:
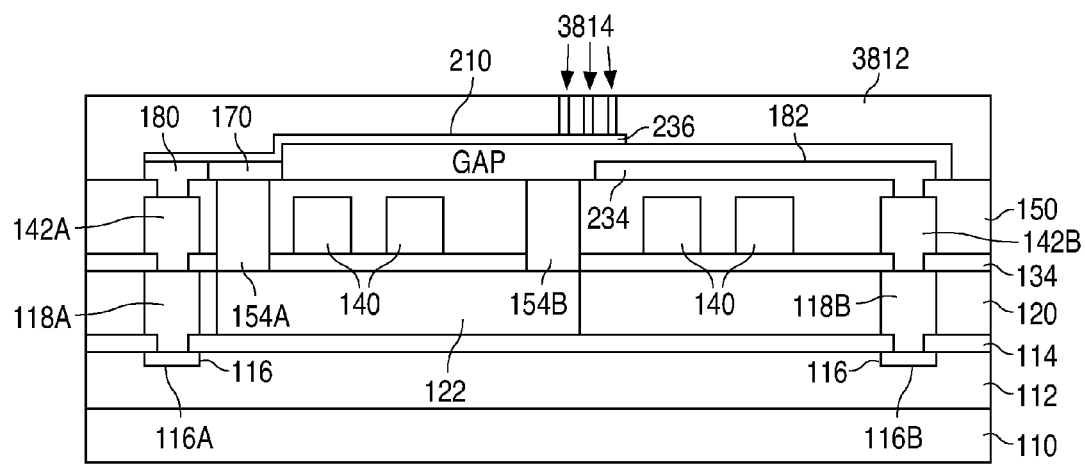
Figure 38C:
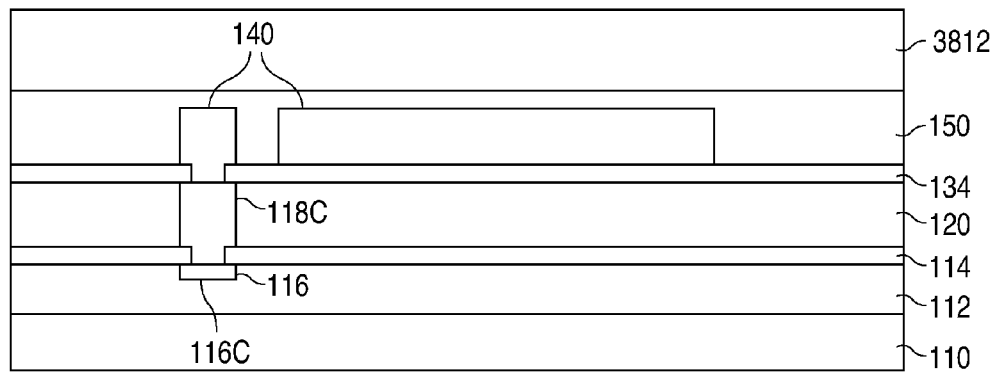
Figure 38D:
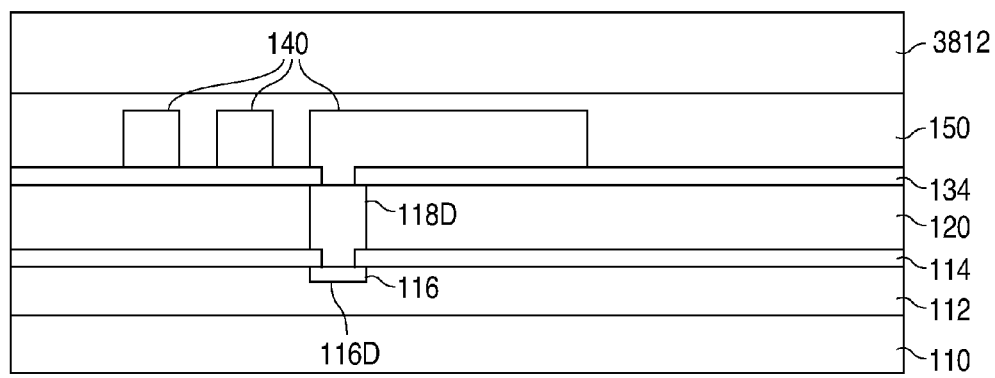
Figure 39A:
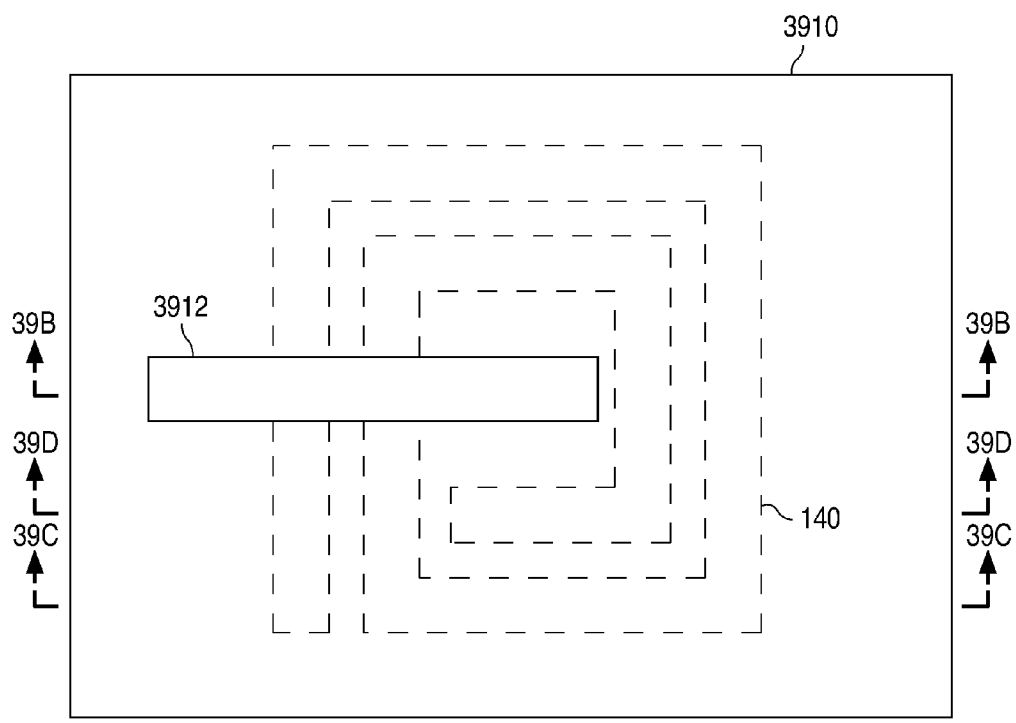
FIGS. 39A-39D through FIGS. 42A-42D are views illustrating an example of a method of forming MEMS relay 3800 in accordance with the present invention.
Figure 39B:
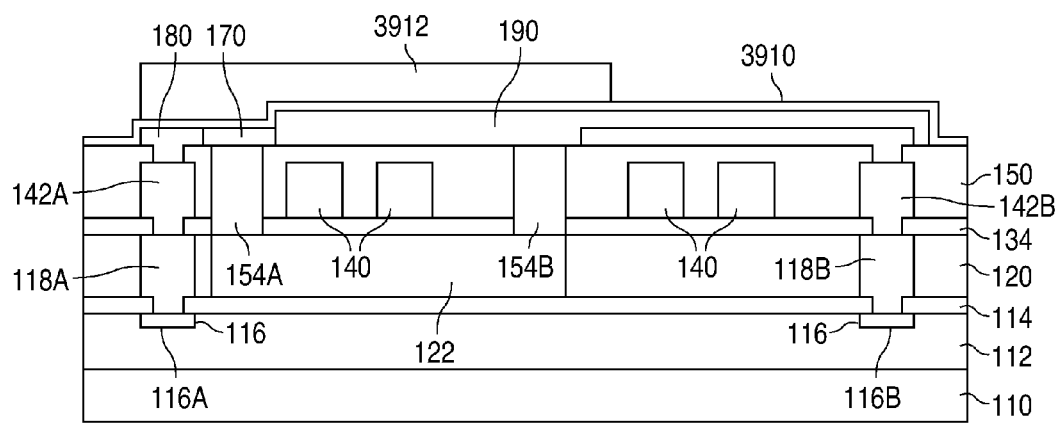
Figure 39C:
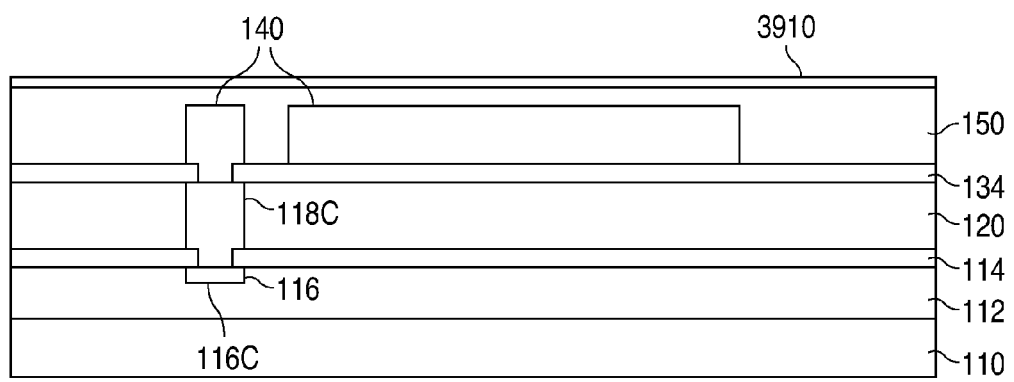
Figure 39D:
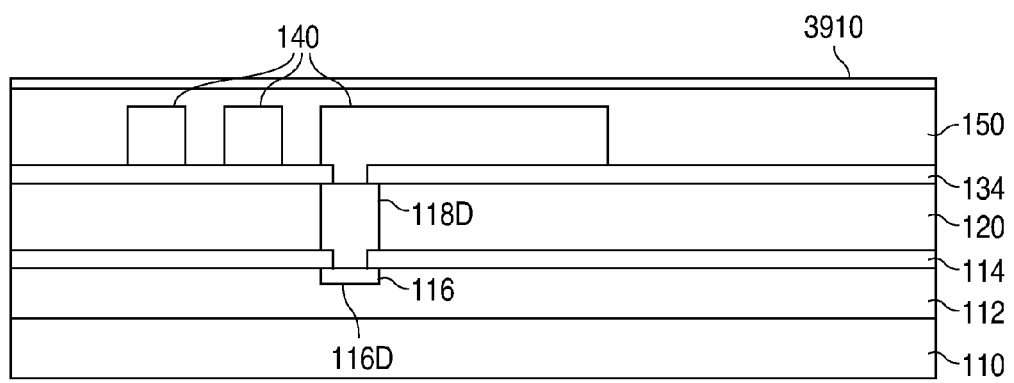
Figure 40A:
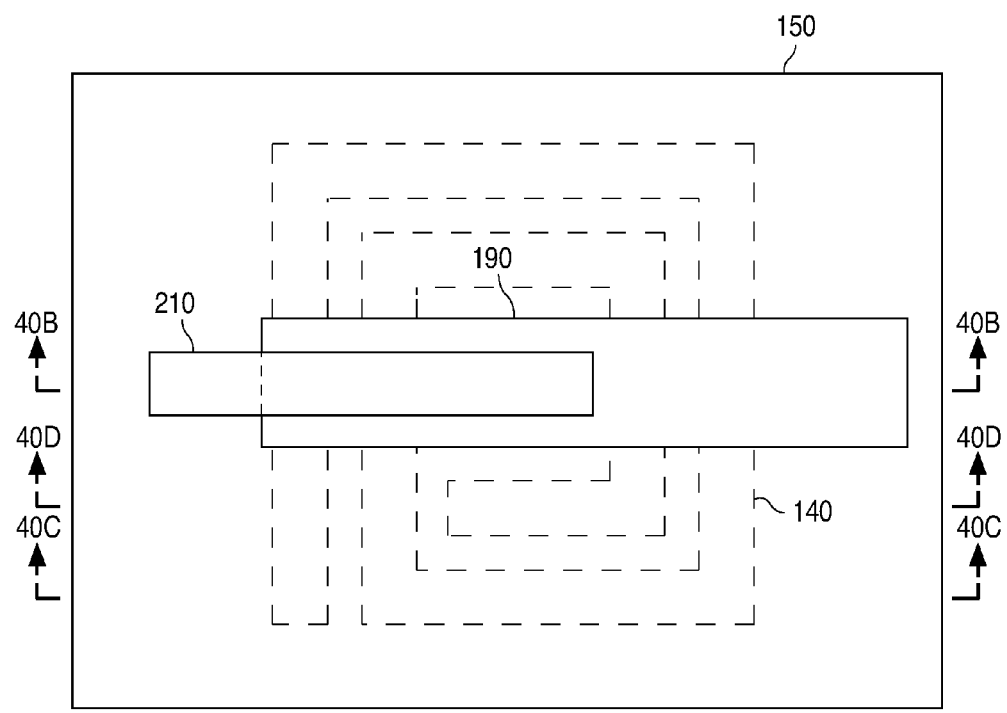
Figure 40B:
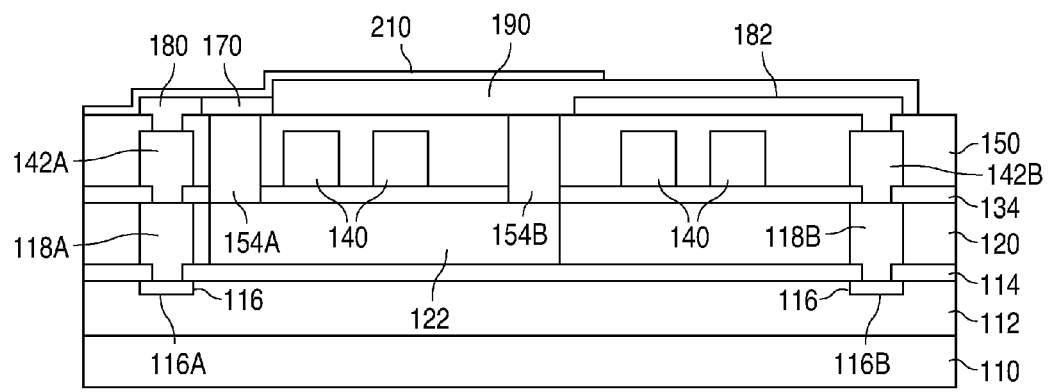
Figure 40C:
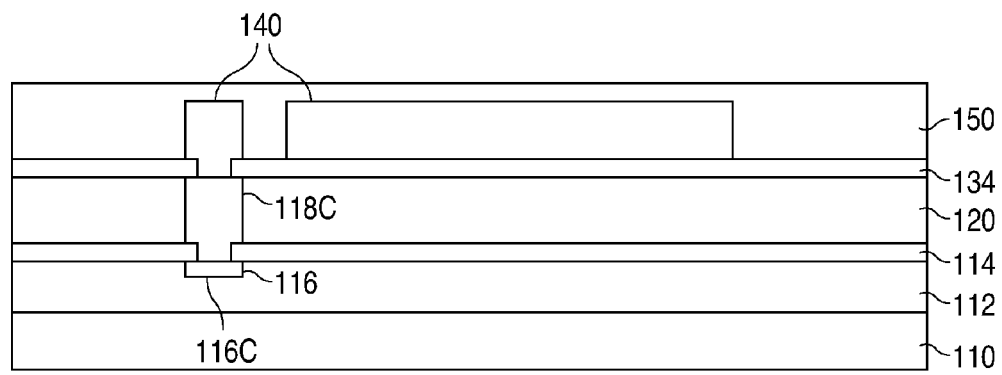
Figure 40D:
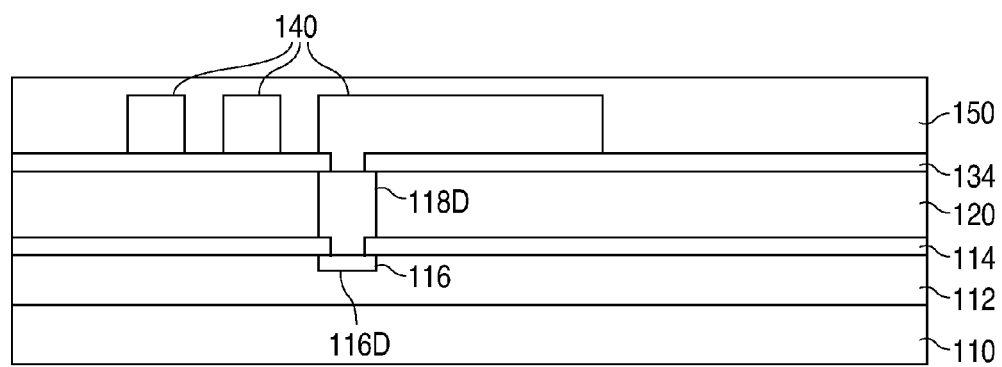
Figure 41A:
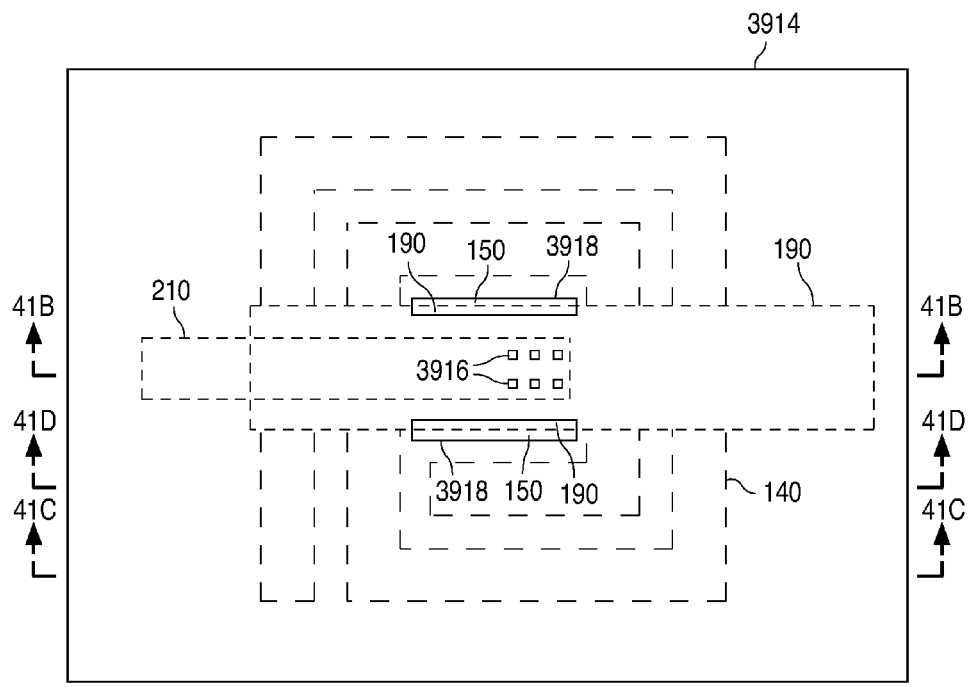
Figure 41B:
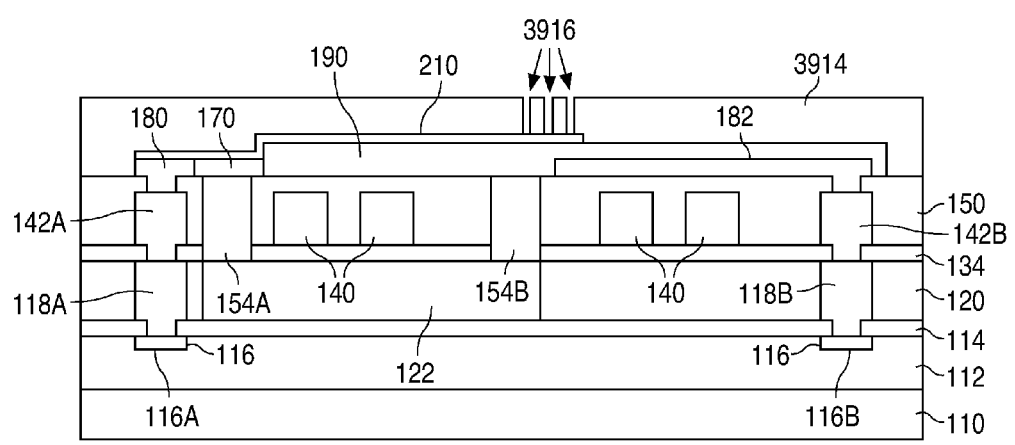
Figure 41C:
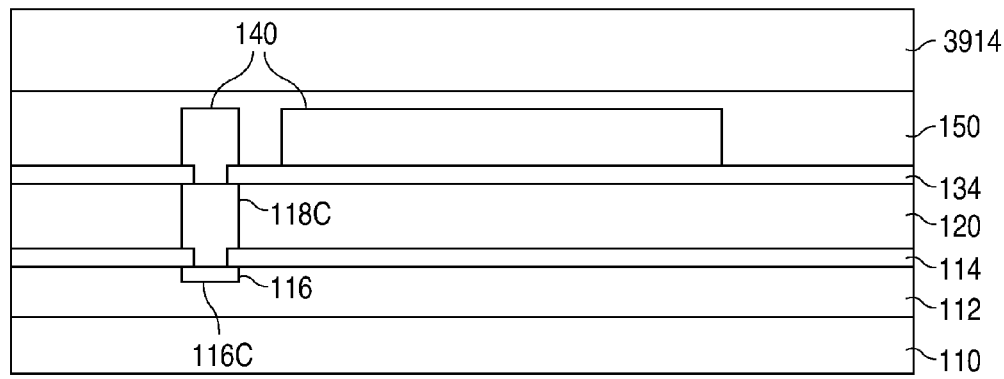
Figure 41D:
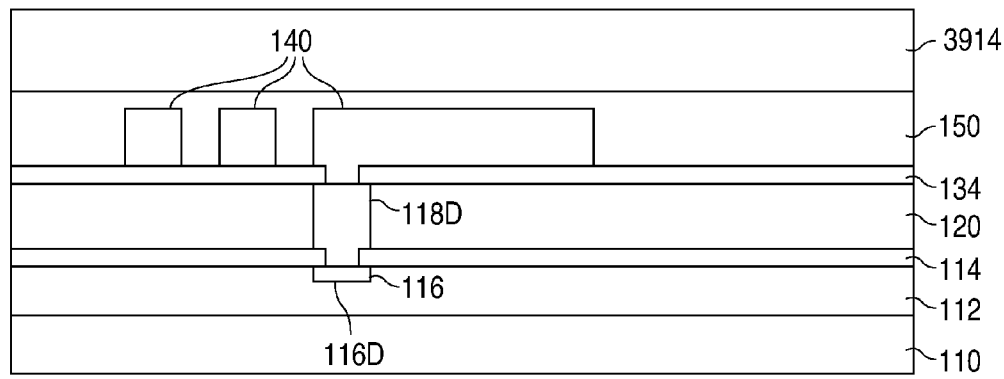
Figure 42A:
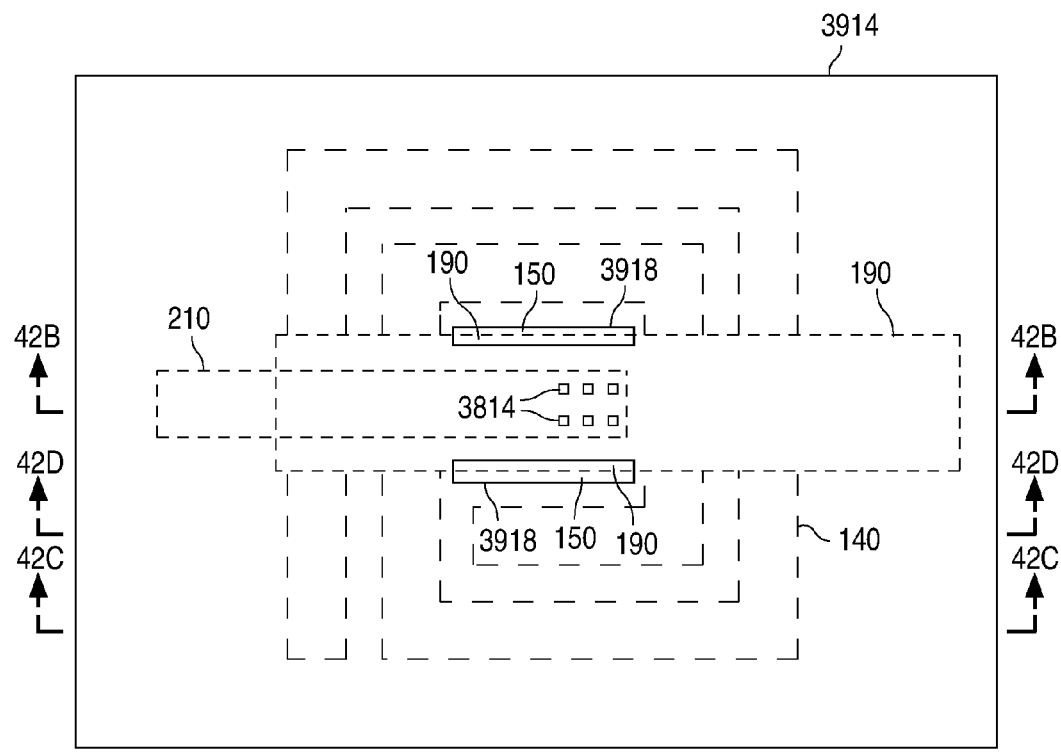
Figure 42B:
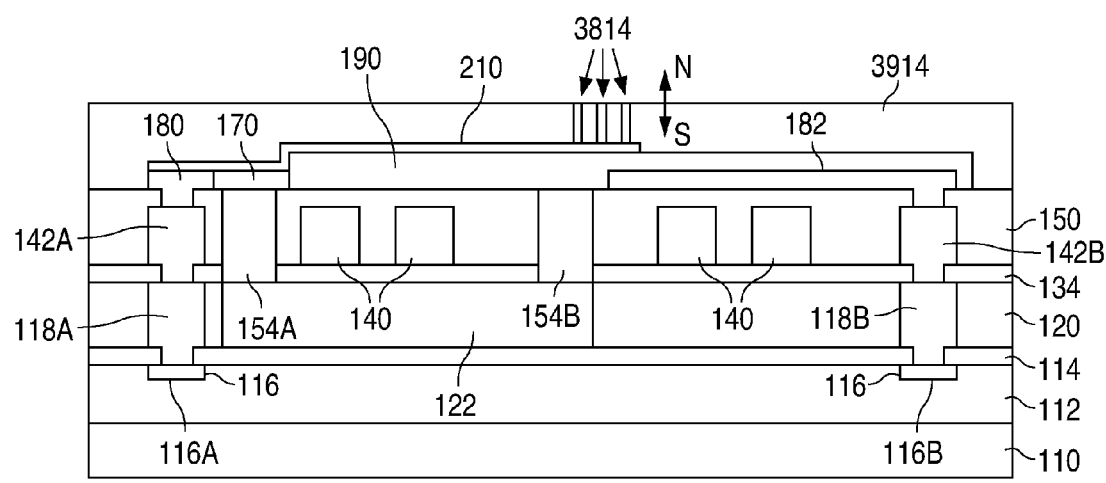
Figure 42C:
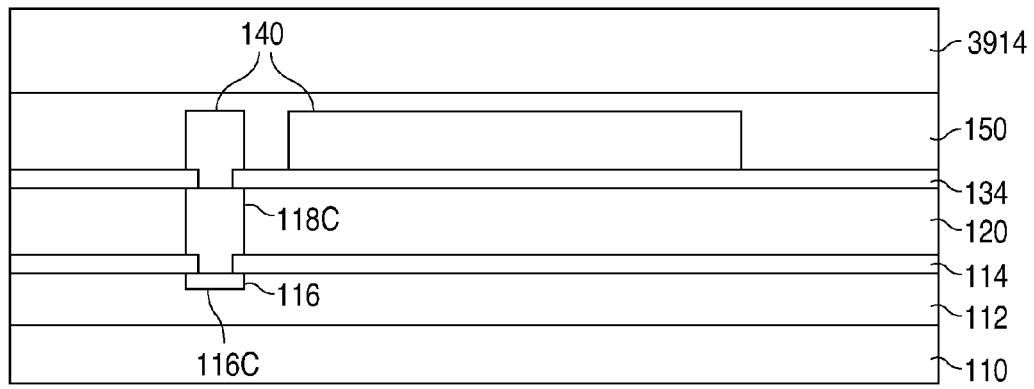
Figure 42D:
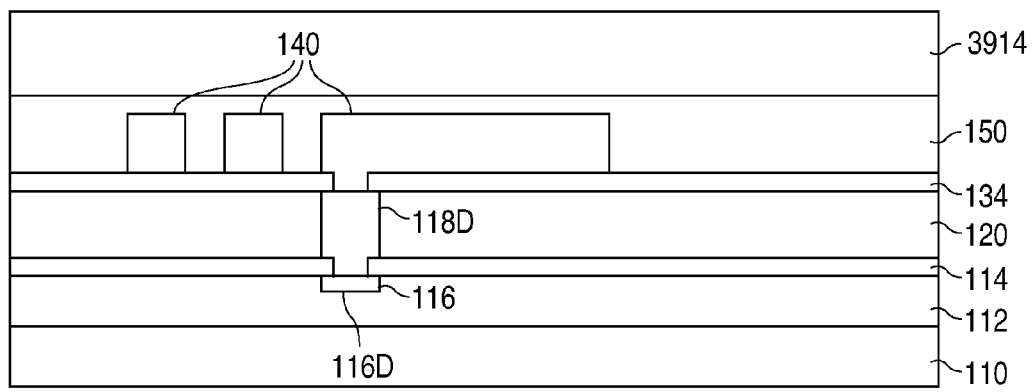

FIGS. 38A-38D show views that illustrate an example of a MEMS relay 3800 in accordance with an alternate embodiment of the present invention. FIG. 38A shows a plan view, while FIG. 38B shows a cross-sectional view taken along line 38B-38B of FIG. 38A, FIG. 38C shows a cross-sectional view taken along line 38C-38C of FIG. 38A, and FIG. 38D shows a cross-sectional view taken along line 38D-38D of FIG. 38A.

MEMS relay 3800 is similar to MEMS relay 230 and, as a result, utilizes the same reference numerals to designate the structures which are common to both relays. As shown in FIGS. 38A-38B, MEMS relay 3800 differs from MEMS relay 230 in that the upper structure of MEMS relay 3800 utilizes a non-conductive layer 3812 and a number of permanent magnets 3814 that extend through non-conductive layer 3812 to touch the top surface of metal trace 210 in lieu of cantilever core section 212. (Non-conductive member 170 can optionally be omitted if MEMS relay 3800 does not require an electrostatic holding voltage.)

FIGS. 39A-39D through FIGS. 42A-42D show views that illustrate an example of a method of forming MEMS relay 3800 in accordance with the present invention. FIGS. 39A-42A show plan views, while FIGS. 39B-42B show cross-sectional views taken along lines 39B-39B through 42B-42B in FIGS. 39A-42A, FIGS. 39C-42C show cross-sectional views taken along lines 39C-39C through 42C-42C in FIGS. 39A-42A, and FIGS. 39D-42D show cross-sectional views taken along lines 39D-39D through 42D-42D in FIGS. 39A-42A.

As shown in FIGS. 39A-39D, the method utilizes the structure shown in FIGS. 17A-17D, and begins by depositing a gold layer 3910 approximately 3000 Å thick on the top surfaces of non-conductive layer 150, non-conductive member 170, metal plug 180, and sacrificial structure 190 to lie over lower magnetic core section 122. After this, a patterned photoresist layer 3912 is formed on the top surface of gold layer 3910. Patterned photoresist layer 3912 is formed in a conventional manner.

As shown in FIGS. 40A-40D, after patterned photoresist layer 3912 has been formed, the exposed regions of gold layer 3910 are etched in a conventional manner to form metal trace 210. Following this, patterned photoresist layer 3912 is removed with conventional solvents and processes.

As shown in FIGS. 41A-41D, following the formation of metal trace 210, a non-conductive layer 3914 is formed to touch the top surfaces of non-conductive layer 150, metal plug 180, metal trace 182, sacrificial structure 190, and metal trace 210. For example, non-conductive layer 3914 can be formed by depositing a layer of photoimageable epoxy or polymer, such as SU-8, which is substantially self planarizing, on the top surfaces non-conductive layer 150, metal plug 180, metal trace 182, sacrificial structure 190, and metal trace 210.

Once the photoimageable epoxy or polymer has been deposited, a number of magnetic openings 3916 and a number of access openings 3918 are formed by projecting a light through a mask to form a patterned image on the layer of photoimageable epoxy or polymer. The light hardens the regions of the layer of photoimageable epoxy or polymer that are exposed to light.

Following this, the softened regions (the regions protected from light) of the layer of photoimageable epoxy or polymer are removed to form non-conductive layer 3914 with the magnetic openings 3916 and the access openings 3918. Each of the magnetic openings 3916 expose a portion of metal trace 210, while each of the access openings 3918 expose non-conductive layer 150 and sacrificial structure 190.

As shown in FIGS. 42A-42D, once non-conductive layer 3914 with the magnetic openings 3916 and the access openings 3918 has been formed, a hard magnetic material, such as a compound of CoNiMnP, is deposited in the magnetic opening 3916 by electroplating in an external magnetic field to form the permanent magnets 3814 with vertically oriented poles. For example, as further shown in FIG. 42B, the north pole N can lie directly vertically above the south pole S (or vice versa).

A hard magnetic material is not formed in the access openings 3918 because the hard magnetic material does not electroplate onto the exposed non-conductive layer 150 and sacrificial structure 190. The metal trace 210 exposed by the magnetic openings 3916, however, also functions as a seed layer. After this, sacrificial structure 190 is etched away by way of the access openings 3918 to form MEMS relay 3800 shown in FIGS. 38A-38D.

MEMS relay 3800 operates the same as MEMS relay 230, except that the magnetic field generated when a current flows through coil 140 attracts the permanent magnets 3814 towards magnetic core via 154B and lower magnetic core section 122 which, in turn, causes second contact region 236 to move towards and touch first contact region 234.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. MEMS relay comprising:
a semiconductor structure having a top surface;
a metal interconnect structure touching the semiconductor structure top surface, the metal interconnect structure includes a top passivation layer, having top and bottom surfaces, having a first set of openings to expose a plurality of conductive pads in the metal interconnect structure, wherein the plurality of conductive pads provide points for external electrical connections, and points for electrical connections to overlying devices, wherein a first pad of the plurality of conductive pads is coupled to a first switch contact and a magnetic cantilever, a second pad of the plurality of conductive pads is coupled to a second switch contact, a third pad of the plurality of conductive pads is coupled lower magnetic core section and a first pair of pads are coupled to a magnetic coil;
a first non-conductive layer, having top and bottom surfaces, that touches the top surface of the passivation layer having a second set of openings for switch metal plugs, magnetic coil metal plugs and a lower magnetic core section;
the lower magnetic core section, having top and bottom surfaces, that extends through the first non-conductive layer, touching the top surface of the top passivation layer and communicating with the third pad of the plurality of conductive pads, wherein the top surface of the lower magnetic core section and the top surface of the first non-conductive layer lie substantially in the same plane;
a first plurality of metal plugs, having top and bottom surfaces, formed in the remaining second set of openings of the first non-conductive layer for coupling with the switch contacts and the magnetic coil, wherein the top surfaces of the first plurality of metal plugs and the top surface of the first non-conductive layer lie substantially in the same plane;
a second non-conductive layer, having top and bottom surfaces, that touches the top surface of the first non-conductive layer and the top surface of the lower magnetic core section with a third set of openings for contact to the top surfaces of the switch metal plugs and the magnetic coil metal plugs and via openings that expose regions on the top surface of the lower magnetic core section;
a metal coil of a continuous series of loops, having top and bottom surfaces, touching the top surface of the second non-conductive layer and the top surfaces of the magnetic coil metal plugs of the first plurality of metal plugs;
a second plurality of metal plugs, having top and bottom surfaces, formed and in contact with the second set of openings of the second non-conductive layer for coupling with the switch contacts;
a third non-conductive layer, having top and bottom surfaces, that touches the top surface of the second non-conductive layer, the top surface of the lower magnetic core section and covering the coil having a fourth set of openings to expose the tops of the set of switch metal plugs of the second plurality of metal plugs and a pair of core openings to expose regions on the top surface of the lower magnetic core section;
first and second magnetic core vias, spaced apart to touch opposite ends of the lower magnetic core section, having top and bottom surfaces, formed in the pair of core openings, the bottom surfaces of the first and second magnetic core vias touching the top surface of the lower magnetic core section, wherein the tops surfaces of the first and second of magnetic core vias and the top surface of the third non-conductive layer lie substantially in the same plane;
a fourth non-conductive member, having a top and bottom surfaces, touches the top surface of the first magnetic core via;
a first metal trace, having top and bottom surfaces, touching the top surface of third non-conductive layer and the top of the first metal switch plug of the second plurality of metal plugs;
a second metal trace, having top and bottom surfaces, touching the top surface of third non-conductive layer and the top of the second metal switch plug of the second plurality of metal plugs;
a third metal trace, having top and bottom surfaces, touching the top surface of the fourth non-conductive member and the first metal trace;
the second and third metal traces having first and second metal contact regions respectively, disposed at the ends and top surface of the second metal trace, the bottom surface of the third metal trace, forming the switch contacts;
the magnetic cantilever core section that touches the top surface of the third metal trace,
wherein the second contact region is spaced apart from the first contact region when the second contact region is in the first position, the second contact region touching the first contact region when the second contact region is in the second position; and
wherein the lower magnetic core section and the third conductive trace are electrically coupled to a holding voltage source to electrostaticaly maintain a closed position after the coil is deenergized.

2. The MEMS relay of claim 1 wherein the lower magnetic core section, the magnetic core vias and the magnetic cantilever core section are comprised of an alloy of nickel and iron.

3. The MEMS relay of claim 1 wherein the coil of a continuous series of loops is wrapped around the second magnetic core via.

4. The MEMS relay of claim 1 wherein the first, second and third metal traces are comprised of gold.

5. The MEMS relay of claim 1 wherein the metal coil is comprised of copper.

* * * * *